(12) United States Patent
Park et al.

(10) Patent No.: US 8,338,254 B2
(45) Date of Patent: Dec. 25, 2012

(54) METHODS OF MANUFACTURING SELF ALIGNED BURIED CONTACT ELECTRODES FOR VERTICAL CHANNEL TRANSISTORS

(75) Inventors: Jongchul Park, Hwaseong-Si (KR); Jinyoung Kim, Hwaseong-si (KR); Sangsup Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/270,835

(22) Filed: Oct. 11, 2011

(65) Prior Publication Data

US 2012/0149184 A1 Jun. 14, 2012

(30) Foreign Application Priority Data

Dec. 10, 2010 (KR) .................. 10-2010-0126454

(51) Int. Cl.
*H01L 21/336* (2006.01)

(52) U.S. Cl. .................. 438/268; 438/637; 257/E21.577

(58) Field of Classification Search .................. 438/206; 257/E21.051, E21.177, E21.4, E21.457

See application file for complete search history.

(56) References Cited

U.S. PATENT DOCUMENTS 8,178,924 B2 * 5/2012 Oh et al. .................. 257/351
2007/0152255 A1 7/2007 Seo et al.

FOREIGN PATENT DOCUMENTS

| KR | 10-00486253 B1 | 5/2005 |
| KR | 10-0833182 B1 | 5/2008 |
| KR | 10-2009-0099400 A | 9/2009 |

* cited by examiner

*Primary Examiner* — Cheung Lee

(74) *Attorney, Agent, or Firm* — Myers Bigel Sibley & Sajovec, P.A.

(57) ABSTRACT

A semiconductor device including vertical field effect transistors may comprise a buried insulating film stacked on a semiconductor substrate and spaced apart first and second active regions vertically penetrating the buried insulating film. The active regions and the buried insulating film are covered with an interlayer insulating film. An upper interconnection is disposed in the interlayer insulating film. A gate electrode extends from a part of the upper interconnection into the buried insulating film between the first and second active regions. A protective film pattern is disposed to cover a top surface of the upper interconnection. First and second buried contact electrodes penetrating the interlayer insulating film to be in contact with top surfaces of the first and second active regions are provided. Related manufacturing methods are also described.

15 Claims, 74 Drawing Sheets

METHODS OF MANUFACTURING SELF ALIGNED BURIED CONTACT ELECTRODES FOR VERTICAL CHANNEL TRANSISTORS

CROSS-REFERENCE TO RELATED APPLICATION

This U.S. non-provisional patent application claims priority under 35 U.S.C. §119 of Korean Patent Application No. 10-2010-0126454, filed on Dec. 10, 2010, the entire contents of which are hereby incorporated by reference.

BACKGROUND

Various embodiments described herein relate to semiconductor devices and methods of manufacturing the same, and more particularly, to semiconductor devices having a vertical channel transistor and methods of manufacturing the same.

To increase an integration density of semiconductor devices, a line width of patterns of semiconductor devices has been gradually reduced. A fine pattern formation technology for a next generation semiconductor device may be achieved by adopting a new and high cost exposure technology.

The integration density of semiconductor devices may also be increased by changing, for example, a structure of a field effect transistor (FET). For example, the semiconductor device may increase an integration density by adopting vertical field effect transistors having a different structure from planar type field effect transistors. A vertical field effect transistor may include a source region, a channel body and a drain region that are vertically stacked on a semiconductor substrate. Those vertical field effect transistors may be applied to various semiconductor devices, for example, memory devices.

In the case of adopting vertical field effect transistors to semiconductor devices, a drain region or source region of the vertical field effect transistor may be electrically connected to a conductive pattern. In this case, if the conductive pattern is misaligned with the source region or the drain region, the semiconductor device may incorrectly operate.

SUMMARY

Various embodiments described herein can provide methods of manufacturing a semiconductor device including vertical field effect transistors. These methods may include forming a buried insulating film on a semiconductor substrate and spaced apart first and second active regions vertically extending into the buried insulating film. An interlayer insulating film is formed on the first and second active regions and on the buried insulating film. An upper interconnection is formed in the interlayer insulating film. A gate electrode is formed extending from the upper interconnection into a region between the first and second active regions and a protective film pattern is formed on a top surface of the upper interconnection. The protective film pattern is formed to be self aligned with the upper interconnection and to have a width greater than that of the upper interconnection. First and second buried contact holes are formed, exposing top surfaces of the first and second active regions, by anisotropically etching the interlayer insulating film using the protective film pattern as an etch-stop film.

Various embodiments described herein can also provide a semiconductor device including vertical field effect transistors. The semiconductor device may include a buried insulating film on a semiconductor substrate and spaced apart first and second active regions vertically extending into the buried insulating film. An interlayer insulating film is on the active regions and on the buried insulating film. An upper interconnection is in the interlayer insulating film and parallel to a top surface of the semiconductor substrate. A gate electrode extends from a part of the upper interconnection into the buried insulating film between the spaced apart first and second active regions. A protective film pattern is on a top surface of the upper interconnection and has a width greater than that of the upper interconnection. First and second buried contact electrodes penetrate the interlayer insulating film to be in contact with top surfaces of the first and second active regions. The first and second buried contact electrodes are self aligned with the protective film pattern.

Semiconductor devices may be manufactured according to various other methods described herein by providing a semiconductor substrate including first and second spaced apart vertically extending active regions and a vertically extending insulating region therebetween, an interlayer insulating film on the active regions and on the insulating region, a gate electrode hole in the interlayer insulating film that extends vertically into the insulating region adjacent the active regions, an upper interconnection in the gate electrode hole in the interlayer insulating film and a gate electrode that extends vertically from the upper interconnection into the gate electrode hole adjacent the active regions. A protective film pattern is formed in the upper interconnection that is wider than the upper interconnection, using the gate electrode hole as a template for forming the protective film pattern. First and second buried contact electrodes are formed in the interlayer insulating film that contact the respective first and second active regions, using the protective film pattern as a template for forming the first and second buried contact electrodes.

In some embodiments, the protective film pattern is formed by widening the gate electrode hole in the interlayer insulating film and forming the protective film pattern in the gate electrode hole that was widened. The first and second buried contact electrodes may then be formed by etching the interlayer insulating film using the protective film pattern as an etch mask to define first and second buried contact holes that expose the respective first and second active regions, and forming the first and second buried electrodes in the respective first and second buried electrode contact holes to contact the respective first and second active regions. Widening the gate electrode hole may be performed by isotropically etching the interlayer insulating film. Moreover, the interlayer insulating film may be etched using the protective film pattern as an etch mask, such that the interlayer insulating film remains on a sidewall of the upper interconnection between the protective film and the insulating region.

In other embodiments, the protective film pattern is formed by forming a first protective film pattern on a sidewall of the gate electrode hole in the interlayer insulating film and forming a second protective film pattern on the upper interconnection. The first and second buried contact electrodes may then be formed by etching the interlayer insulating film using the first and second protective film patterns as an etch mask to define first and second buried electrode contact holes that expose the respective first and second active regions, and forming the first and second buried contact electrodes in the respective first and second buried electrode contact holes to contact the respective first and second active regions.

BRIEF DESCRIPTION OF THE FIGURES

The foregoing and other features and potential advantages of the invention will be apparent from the more particular description of various aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 5A through 14A are cross sectional views taken along the line I-I' of FIG. 2 to explain a method of manufacturing a semiconductor device in accordance with the first embodiments described herein.

FIGS. 5B through 14B are cross sectional views taken along the line II-II' of FIG. 2 to explain a method of manufacturing a semiconductor device in accordance with the first embodiments described herein.

FIGS. 5C through 14C are cross sectional views taken along the line III-III' of FIG. 2 to explain a method of manufacturing a semiconductor device in accordance with the first embodiments described herein.

FIGS. 5D through 14D are cross sectional views taken along the line IV-IV' of FIG. 2 to explain a method of manufacturing a semiconductor device in accordance with the first embodiments described herein.

FIGS. 15A through 20A are cross sectional views taken along the line I-I' of FIG. 2 to explain a method of manufacturing a semiconductor device in accordance with the second embodiments described herein.

FIGS. 15B through 20B are cross sectional views taken along the line II-II' of FIG. 2 to explain a method of manufacturing a semiconductor device in accordance with the second embodiments described herein.

FIGS. 15C through 20C are cross sectional views taken along the line III-III' of FIG. 2 to explain a method of manufacturing a semiconductor device in accordance with the second embodiments described herein.

FIGS. 15D through 20D are cross sectional views taken along the line IV-IV' of FIG. 2 to explain a method of manufacturing a semiconductor device in accordance with the second embodiments described herein.

DETAILED DESCRIPTION OF THE EMBODIMENTS

Figure 1:
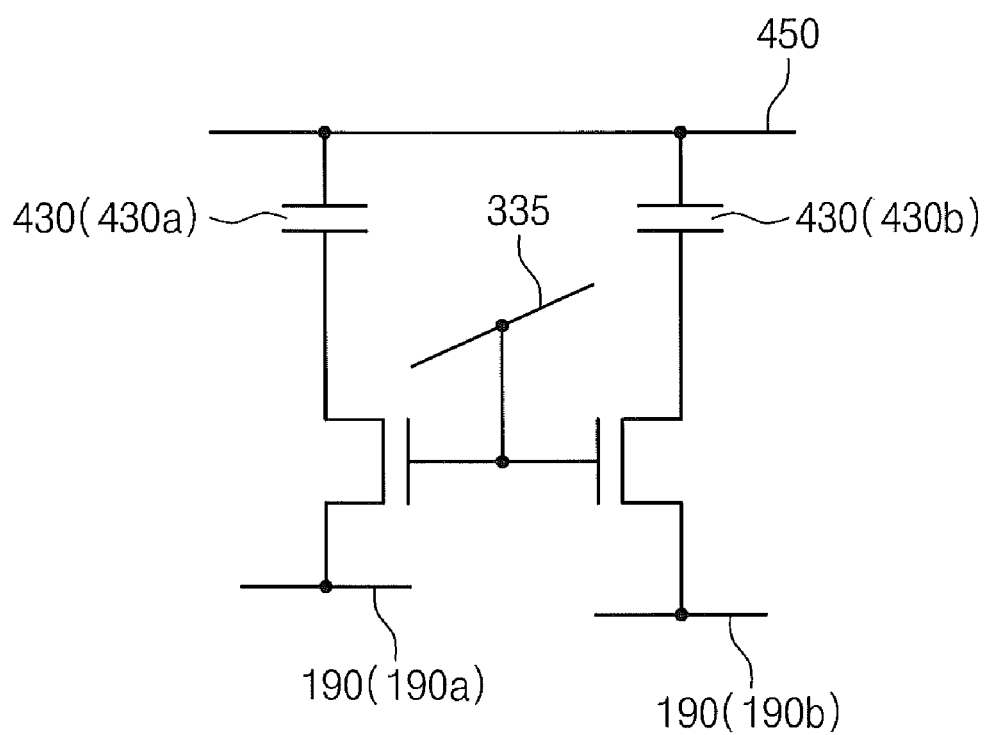
FIG. 1 is an equivalent circuit diagram illustrating a pair of DRAM devices in accordance with various embodiments described herein.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Relative terms may be used herein to describe one element's relationship to another element as illustrated in the Figures. These relative terms generally relate to an element's position relative to a substrate, when the substrate is at the bottom of a drawing. However, it will be understood that relative terms are intended to encompass different orientations of the device in addition to the orientation depicted in the Figures. For example, if the structure in the Figure is turned over, elements described as being on the "lower" surface of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below", "beneath" or "under" other elements would then be oriented "above" or "over" the other elements. The exemplary terms "below", "beneath", "under" "above" and "over" can, therefore, encompass both an orientation of above and below. Also, the terms "horizontal" and "vertical" are used herein to describe a direction that is generally parallel to an outer face of the semiconductor device and a direction that is generally orthogonal to the outer face of the semiconductor device, respectively, and do not imply a specific orientation.

Various embodiments may be described with reference to cross-sectional views and/or top plan views, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

As used herein, "self aligned" means that a first device feature is used as a mask or template for forming a second device feature, so that the second device feature is aligned to the first device feature, independent of photo lithography alignment tolerances.

FIG. 1 is an equivalent circuit diagram illustrating a pair of DRAM devices in accordance with various embodiments described herein.

Referring to FIG. 1, a semiconductor device in accordance with various embodiments described herein may include a pair of field effect transistors. Source regions of the field effect transistors may be electrically connected to a pair of lower interconnections 190a and 190b, respectively, (collectively referred to as 190) and gate electrodes of the field effect transistors may be electrically connected to an upper interconnection 335. Also, drain regions of the field effect transistors may be electrically connected to first terminals of a pair of memory storage devices 430a and 430b, respectively, (collectively referred to as 430) and second terminals of the pair of memory storage substances may be electrically connected to a plate electrode 450.

In some embodiments, the lower interconnections 190a and 190b, the upper interconnection 335 and the memory storage substances 430a and 430b may correspond to bit lines, word lines and capacitors respectively as illustrated in FIG. 1. In this case, a semiconductor device in accordance with various embodiments described herein may be a DRAM device. However, various embodiments described herein are not limited to DRAM devices. For example, the memory storage substances 430a and 430b may include a ferroelectric capacitor or a variable resistive element and the variable resistive element may include a magnetic tunnel junction (MTJ) or a resistive capacitor. In the case that the memory storage substances 430a and 430b are ferroelectric capacitors, a semiconductor device in accordance with various embodiments described herein may correspond to a ferroelectric memory device. In the case that the memory storage substances 430a and 430b are a magnetic tunnel junction (MTJ), a semiconductor device in accordance with various embodiments described herein may correspond to a magnetic RAM device. Also, in the case that the memory storage substances 430a and 430b are resistive capacitors, a semiconductor device in accordance with various embodiments described herein may correspond to a resistive RAM device. Various other logic or memory devices also may be provided.

Figure 2:
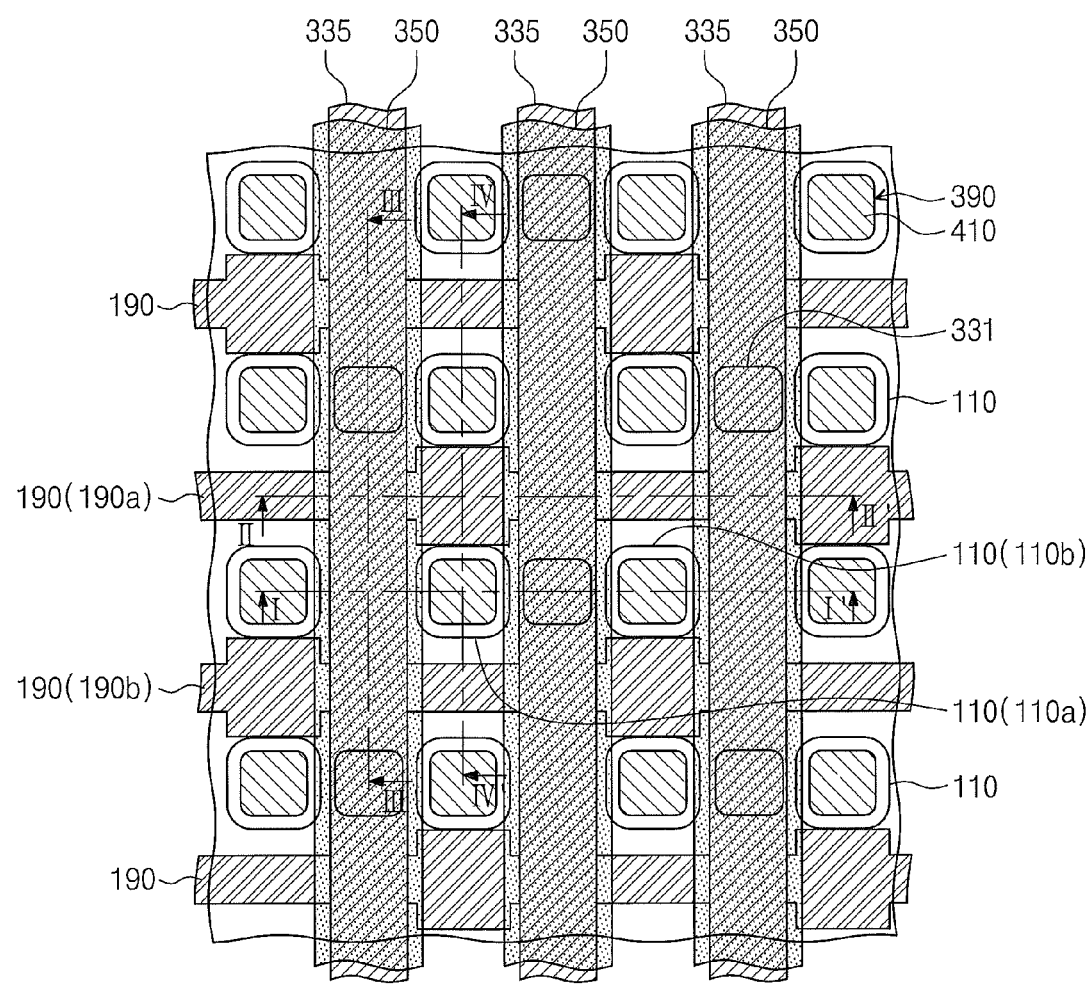
FIG. 2 is a top plan view in accordance with various embodiments described herein.

FIG. 2 is a top plan view in accordance with various embodiments described herein. FIGS. 3A through 3D are cross sectional views taken along the lines III-III' and IV-IV' of FIG. 2 to explain a semiconductor device in accordance with first embodiments described herein.

Referring to FIGS. 2, 3A, 3B, 3C and 3D, a buried insulating film 230 may be disposed on a semiconductor substrate 100. The buried insulating film 230 may be a silicon oxide film. The semiconductor substrate includes a single element and/or compound semiconductor material in bulk wafer and/or epitaxial layer form. A plurality of active regions 110 vertically penetrating the buried insulating film 230 and spaced apart from one another may be provided. For convenience of description, a pair of active regions 110 adjacent to each other shall be referred to as first and second active regions 110a and 110b respectively. Each of the active regions 110 including the first and second active regions 110a and 110b may be electrically insulated by the buried insulating film 230.

The first active region 110a may be comprised of a first lower impurity region 113a, a first channel body 117a and a first upper impurity region 115a that are sequentially stacked and the second active region 110b may also be comprised of a second lower impurity region 113b, a second channel body 117b and a second upper impurity region 115b that are sequentially stacked. The first and second lower impurity regions 113a and 113b and the first and second upper impurity regions 115a and 115b may be doped with dopants having a different polarity from the semiconductor substrate 100. The dopant may be an N-type dopant or a P-type dopant. The first and second lower impurity regions 113a and 113b and the first and second upper impurity regions 115a and 115b may be a N-type semiconductor or a P-type semiconductor. The first and second lower impurity regions 113a and 113b and the first and second upper impurity regions 115a and 115b may be used as source regions and drain regions respectively.

An interlayer insulating film 250 covering the first and second active regions 110a and 110b and the buried insulating film 230 may be formed. The interlayer insulating film 250 may be a silicon oxide film. The first and second lower impurity regions 113a and 113b may be connected to the semiconductor substrate 100.

The first and second active regions 110a and 110b may be disposed on a straight line parallel to a first direction and a plurality of lower interconnections 190 parallel to the first direction may be disposed between the active regions 110 including the first and second active regions 110a and 110b. For convenience of description, a pair of lower interconnections 190 adjacent to each other among the lower interconnections 190 shall be referred to as first and second lower interconnections 190a and 190b respectively.

The first lower interconnection 190a may be disposed on one side of the first and second active regions 110a and 110b and the second lower interconnection may be disposed on the other side of the first and second active regions 110a and 110b. The first lower interconnection 190a may be electrically connected to the first lower impurity region 113a of the first active region 110a and the second lower interconnection 190b may be electrically connected to the second lower impurity region 113b of the second active region 110b. The first and second lower interconnections 190a and 190b may be conductive material.

Upper interconnections 335 parallel to a top surface of the semiconductor substrate may be disposed in the interlayer insulating film 250. The upper interconnections 335 may extend to run along an upper region between the first and second active regions 110a and 110b and cross the lower interconnections 190. That is, as illustrated in a top plan view of FIG. 2, the upper interconnections 335 may extend along a second direction crossing the lower interconnections parallel to the first direction.

Figure 3A:
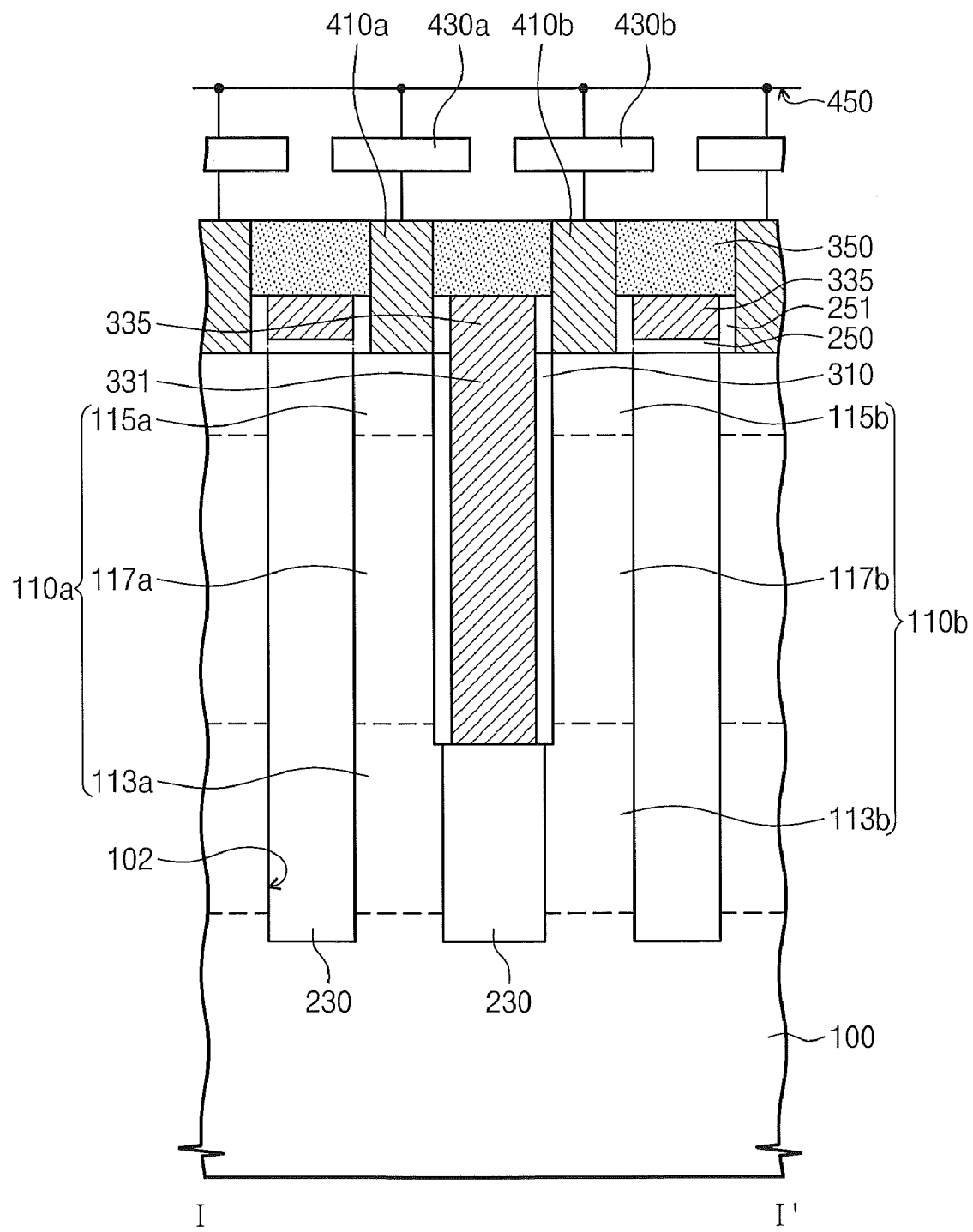
FIGS. 3A through 3D are cross sectional views taken along the lines I-I', II-II', III-III' and IV-IV' of FIG. 2 to explain a semiconductor device in accordance with first embodiments described herein.
Figure 3B:
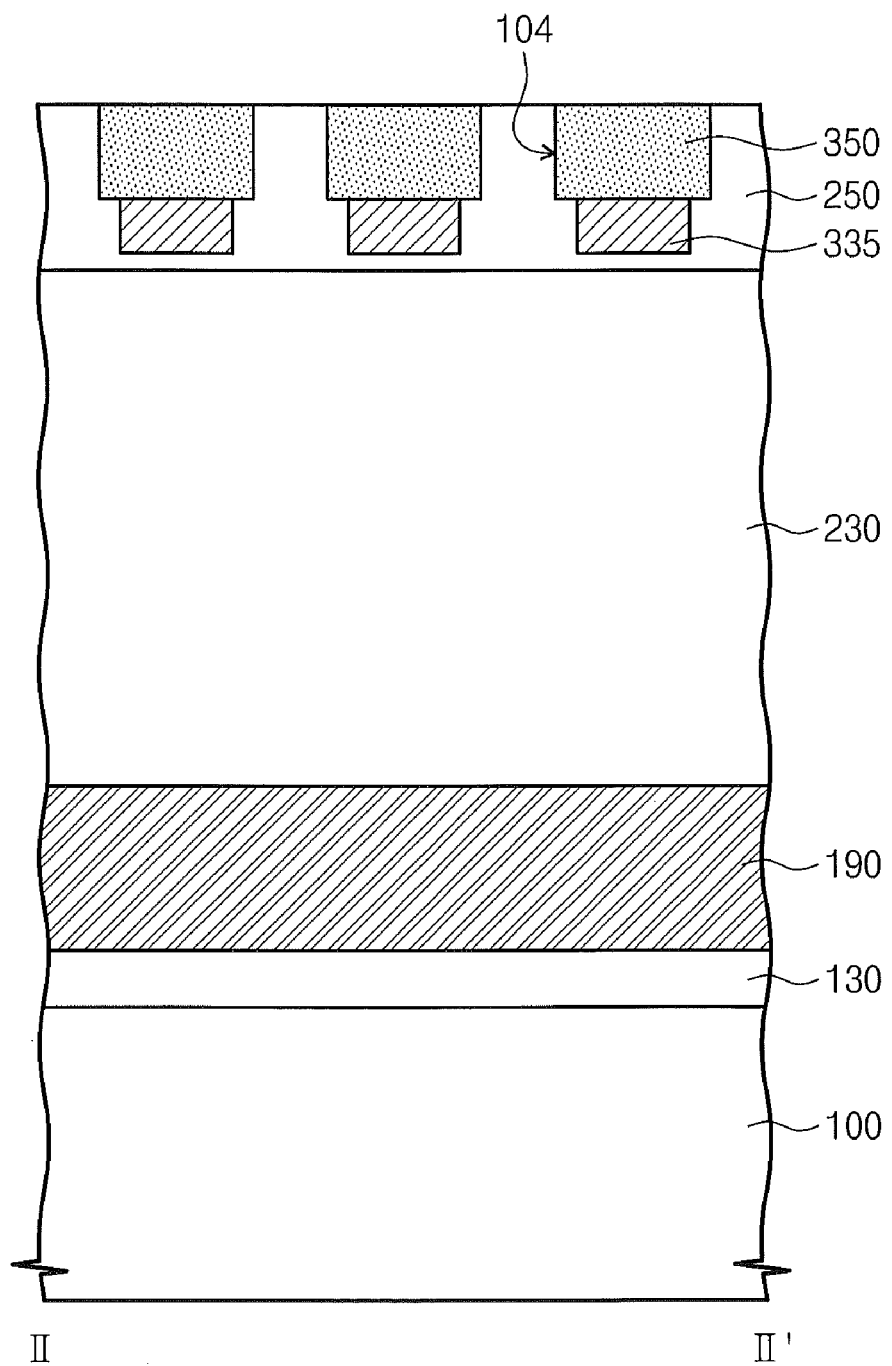
Figure 3C:
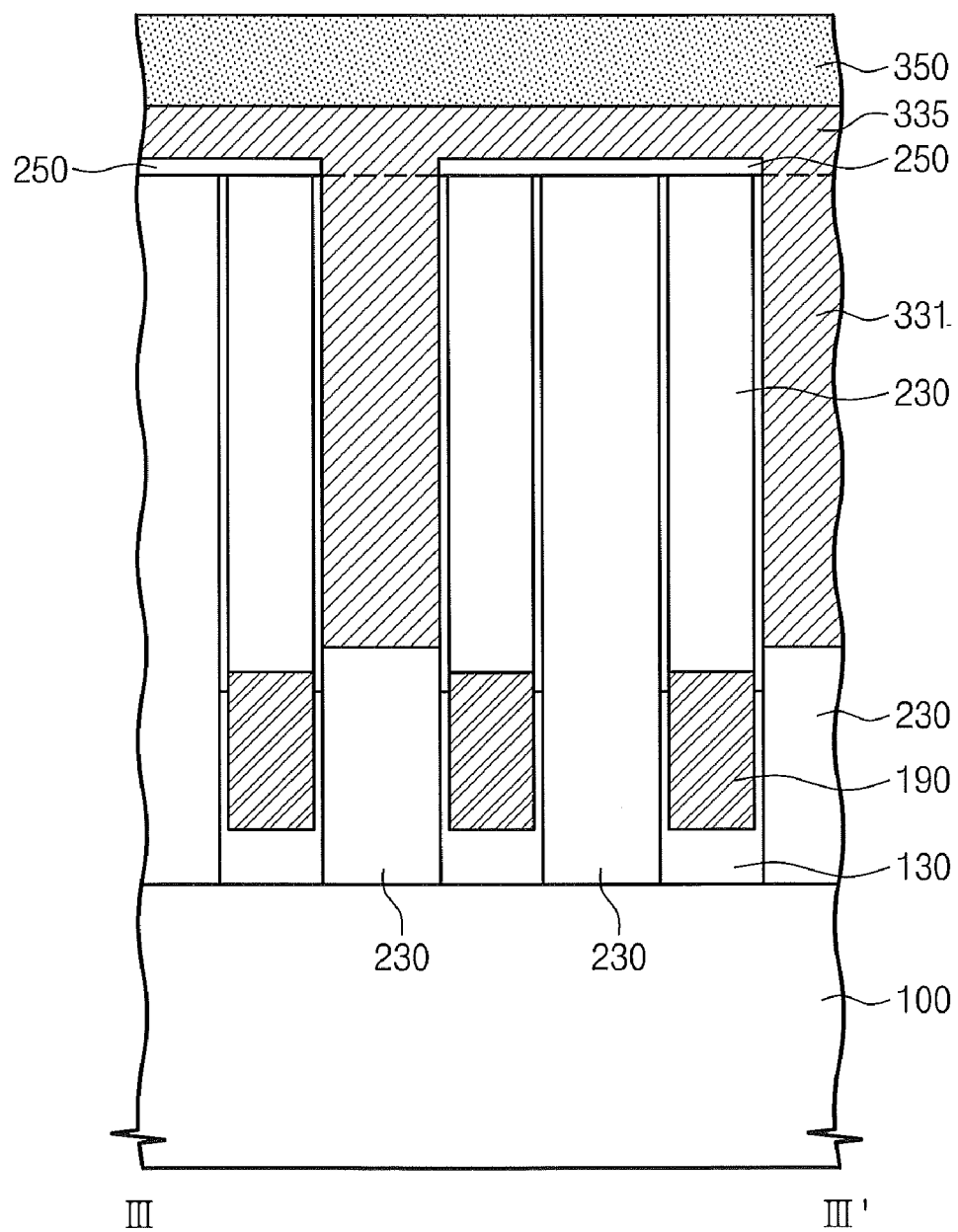
Figure 3D:
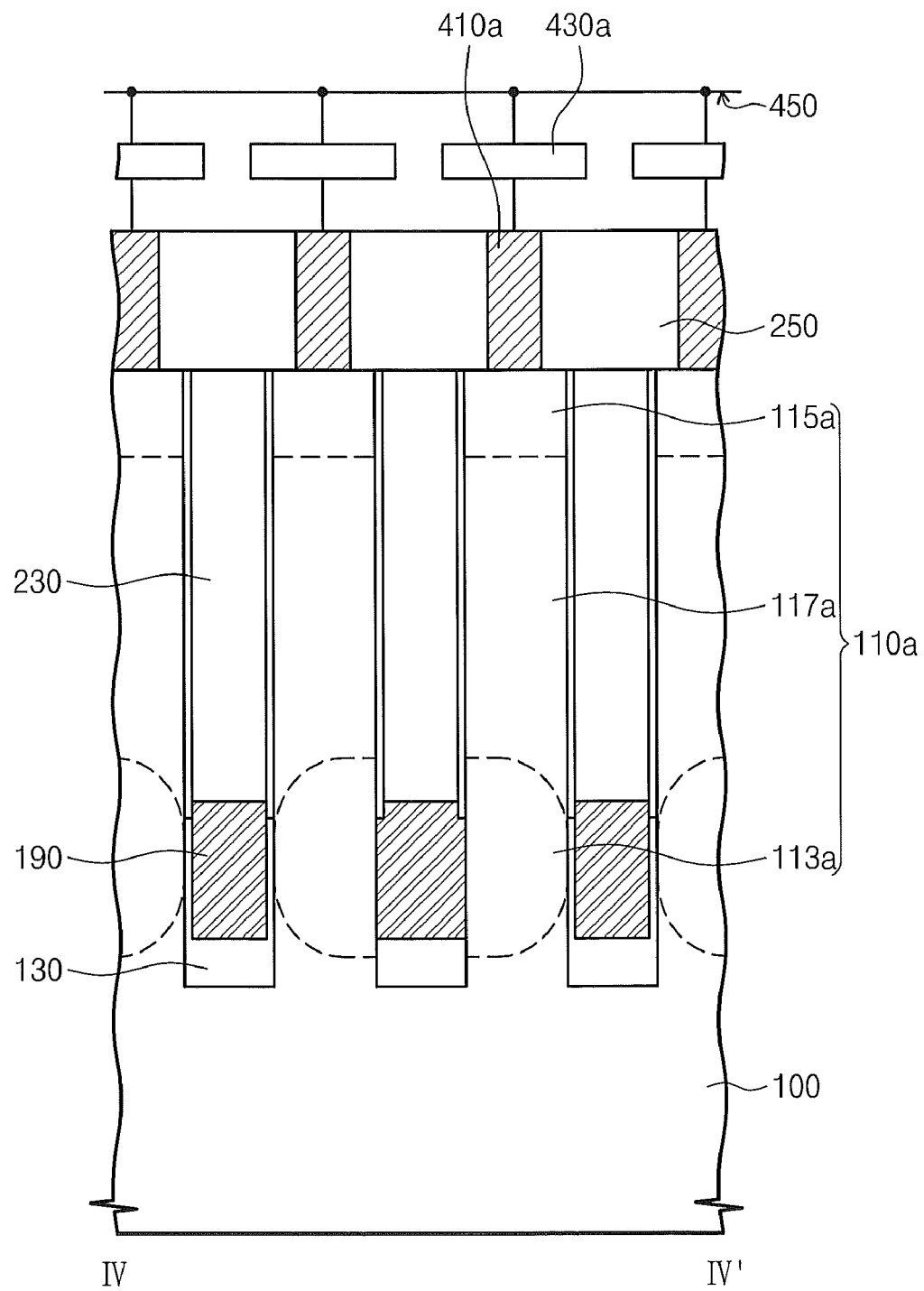

A bottom surface of the upper interconnection 335, as illustrated in FIG. 3A, may be higher than top surfaces of the first and second active regions 110a and 110b. Alternatively, a bottom surface of the upper interconnection 335 may have a level equal to or lower than top surfaces of the first and second active regions 110a and 110b. A gate electrode 331 extending from a part of the upper interconnection 335 into the buried insulating film 230 between the first and second active regions 110a and 110b may be provided. A bottom surface of the gate electrode 331 may be higher than top surfaces of the first and second lower interconnections 190a and 190b and may be located to be equal to or lower than top surfaces of the first and second lower impurity regions 113a and 113b of the first and second active regions 110a and 110b. The upper interconnection 335 and the gate electrode 331 may be conductive material. A gate insulating film 310 may be disposed between the gate electrode 331 and the first active region 110a and between the gate electrode 331 and the second active region 110b. The gate insulating film 310 may be a thermal oxide film. The gate electrode 331, the first lower impurity region 113a, the first channel body 117a and the first upper impurity region 115a may constitute a first vertical field effect transistor and the gate electrode 331, the second lower impurity region 113b, the second channel body 117b and the second upper impurity region 115b may constitute a second vertical field effect transistor.

A protective film pattern 350 covering a top surface of the upper interconnection 335 and having a width greater than a width of the upper interconnection 335 may be provided. The protective film pattern 350 may be a material having an etching selectivity with respect to the interlayer insulating film 250. For example, in the case that the interlayer insulating film 250 is an oxide film, the protective film pattern 350 may be a nitride film. First and second buried contact electrodes 410a and 410b penetrating the interlayer insulating film 250 and electrically connected to top surfaces of the first and second upper impurity regions 115a and 115b may be provided. Similarly, top surfaces of upper impurity regions of the active region 110 may also be electrically connected to a plurality of buried contact electrodes 410 respectively. The first and second buried contact electrodes 410a and 410b may be a conductive material. The first and second buried contact electrodes 410a and 410b may be self aligned to the protective film pattern 350.

The first and second buried contact electrodes 410a and 410b may be electrically connected to first terminals of first and second memory storage substances 430a and 430b respectively and second terminals of the first and second memory storage substances 430a and 430b may be electrically connected to a plate electrode 450.

FIGS. 4A through 4D are cross sectional views taken along the lines I-I', II-II', III-III', and IV-IV' of FIG. 2 to explain a semiconductor device in accordance with second embodiments described herein. A shape of a protective film pattern of the present embodiments is different from that of the embodiments illustrated in FIGS. 3A through 3D. Thus, in the present embodiments, the description of constituent elements except the protective film pattern is omitted.

Referring to FIGS. 2, 4A, 4B, 4C and 4D, a protective film pattern 350 may include an upper protective film pattern 353 and a sidewall protective film pattern 351. The upper protective film pattern 353 covers a top surface of the upper interconnection 335 and the sidewall protective film pattern 351 covers a sidewall of the upper interconnection 335. The sidewall protective film pattern 351 may extend in interfaces between the upper protective film pattern 353 and the active regions 110a and 110b. More specifically, the sidewall protective film pattern 351 may extend in interfaces between the upper interconnection 335 and the gate insulating films 310.

Figure 4A:
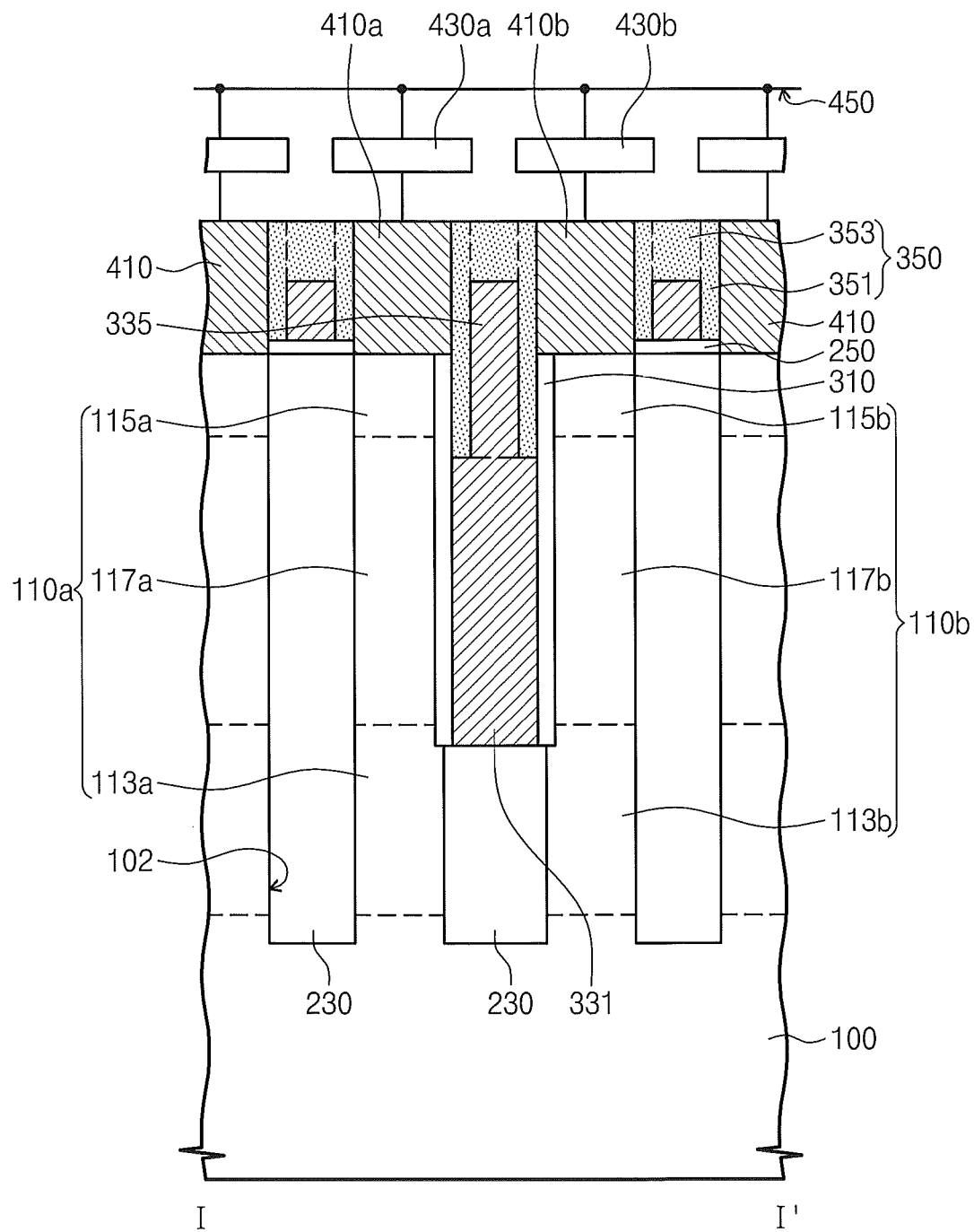
FIGS. 4A through 4D are cross sectional views taken along the lines I-I', II-II', III-III' and IV-IV' of FIG. 2 to explain a semiconductor device in accordance with second embodiments described herein.
Figure 4B:
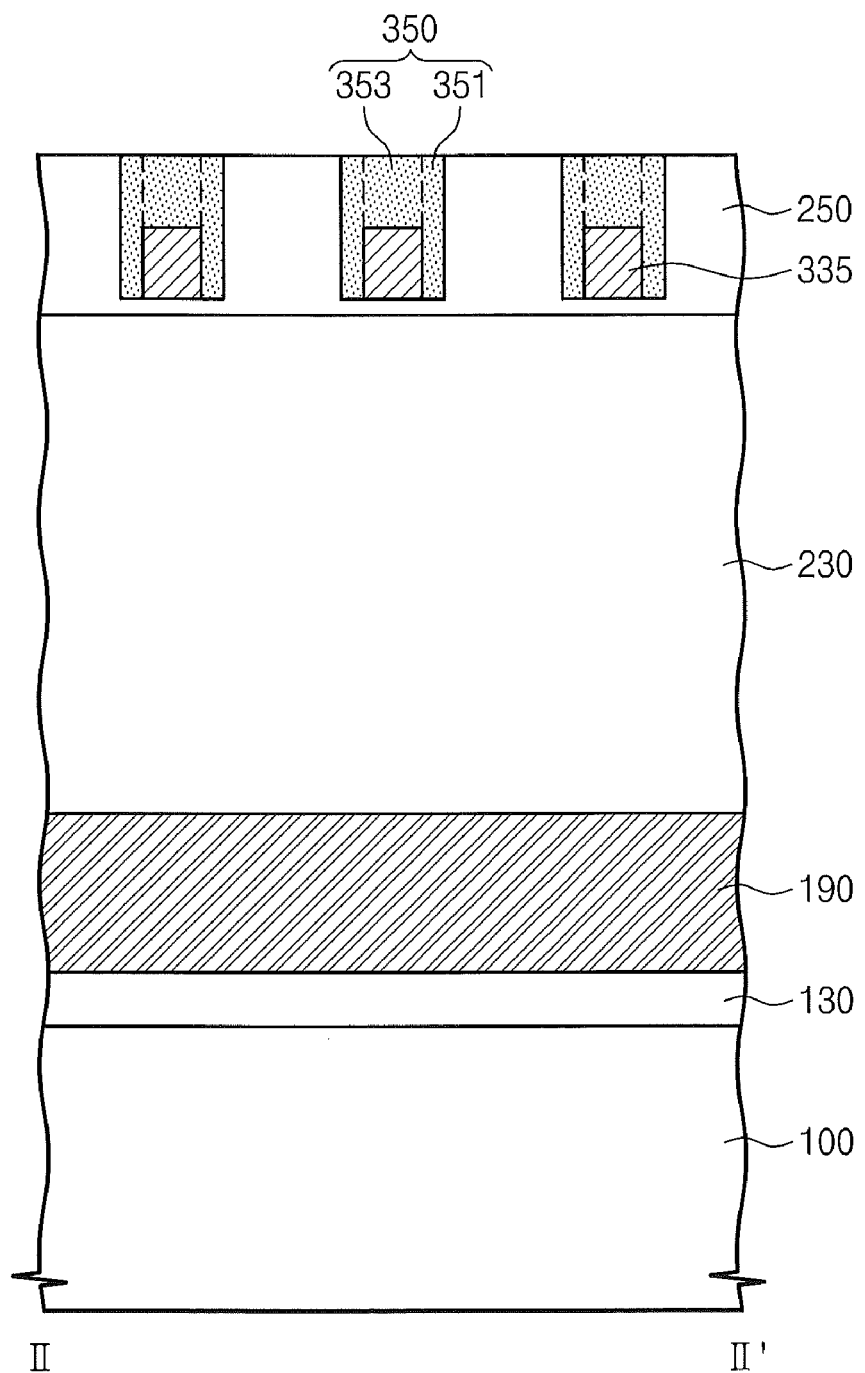
Figure 4C:
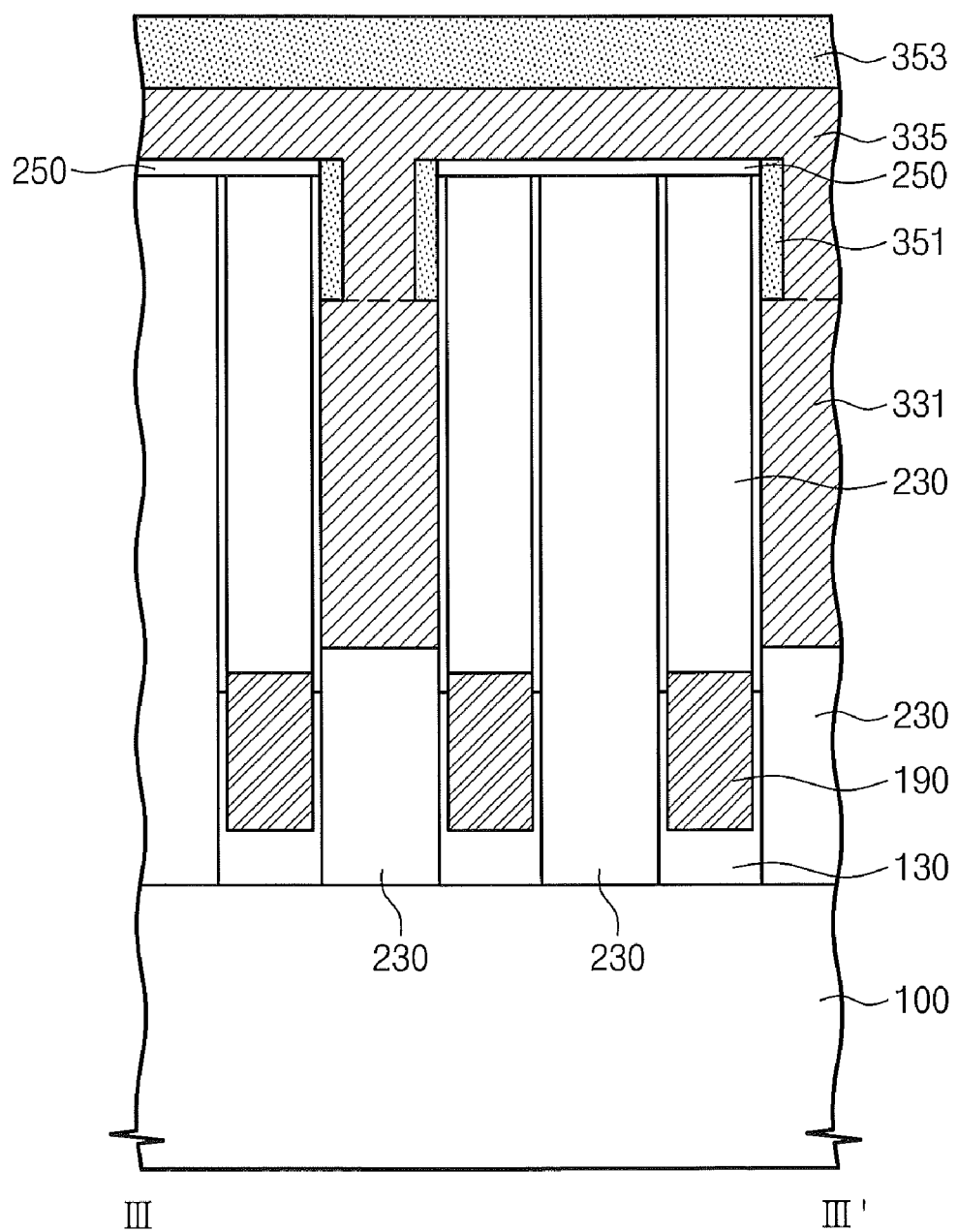
Figure 4D:
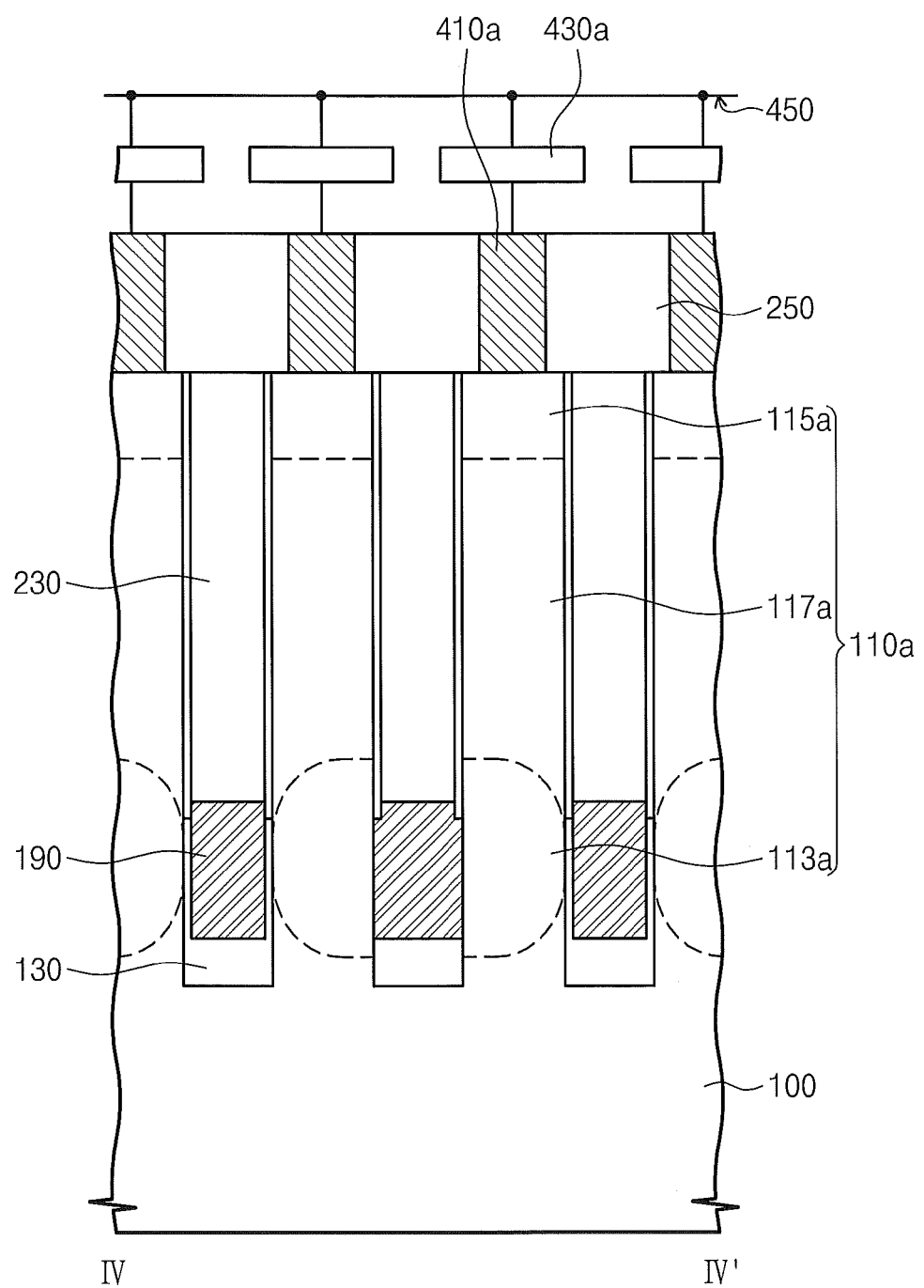
Figure 5A:
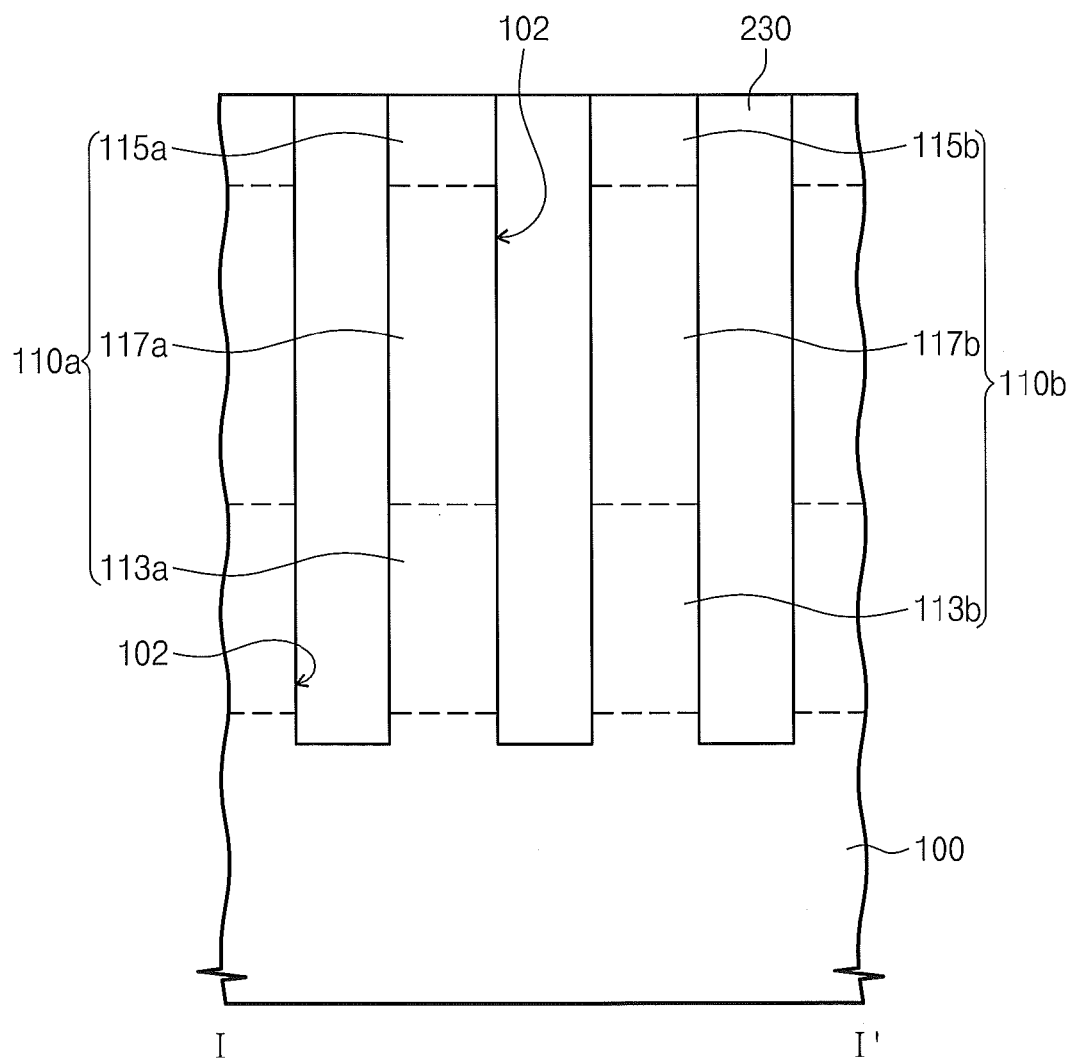
Figure 5B:
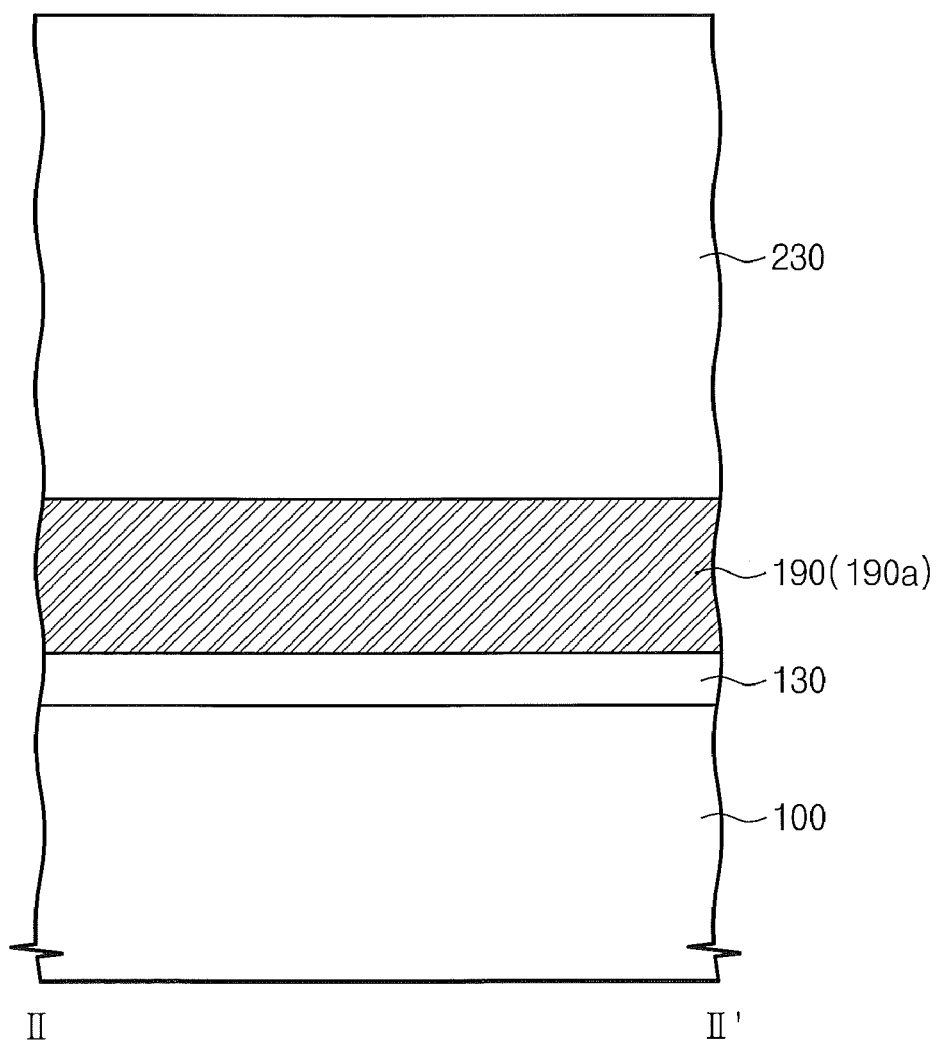
Figure 5C:
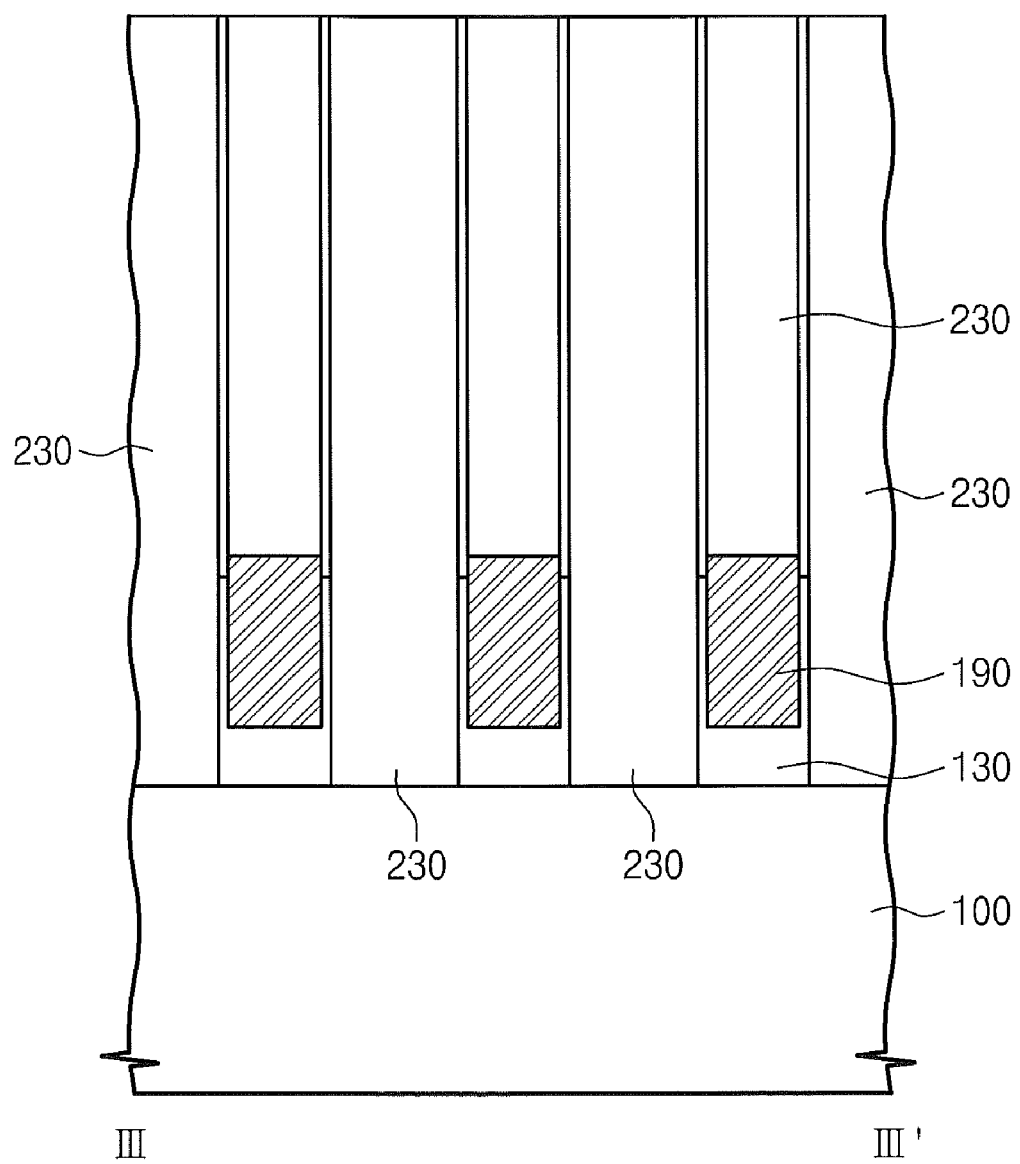
Figure 5D:
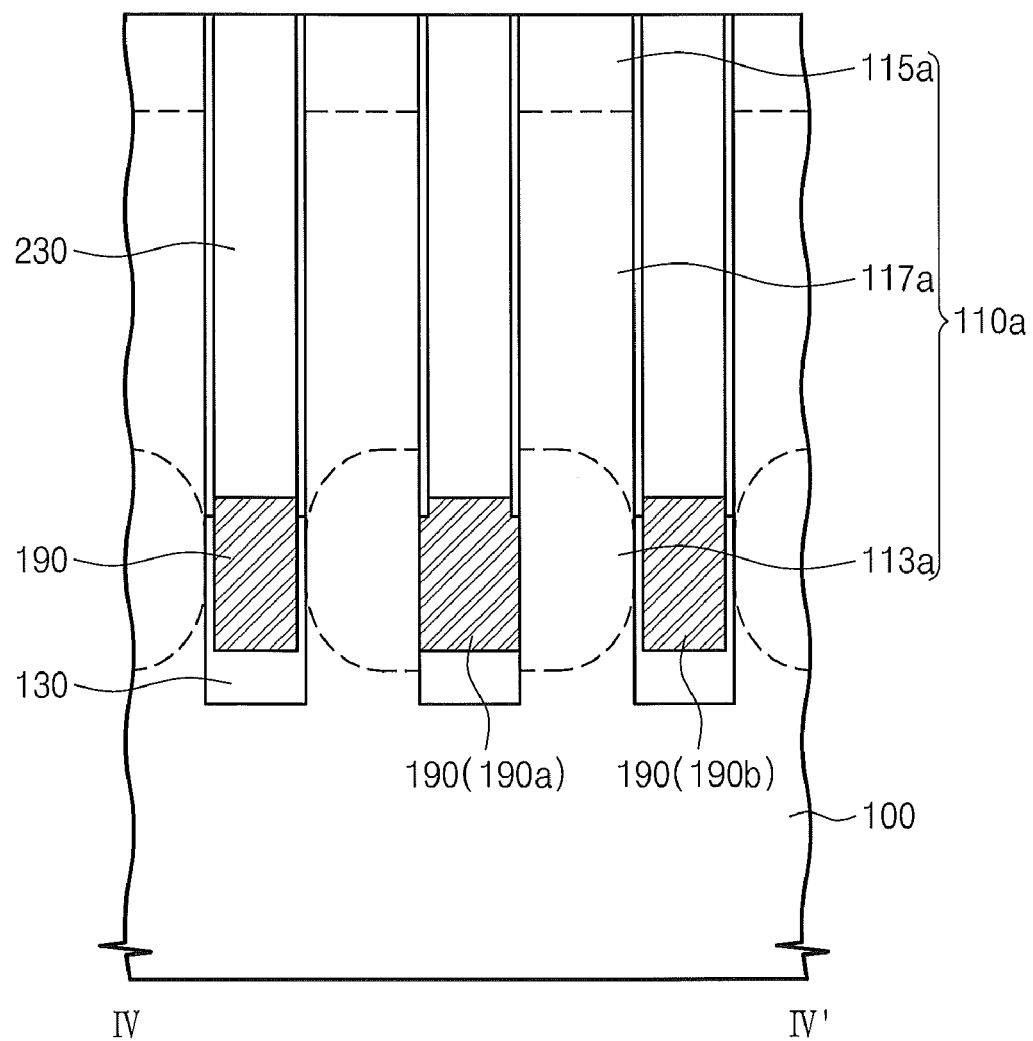
Figure 6A:
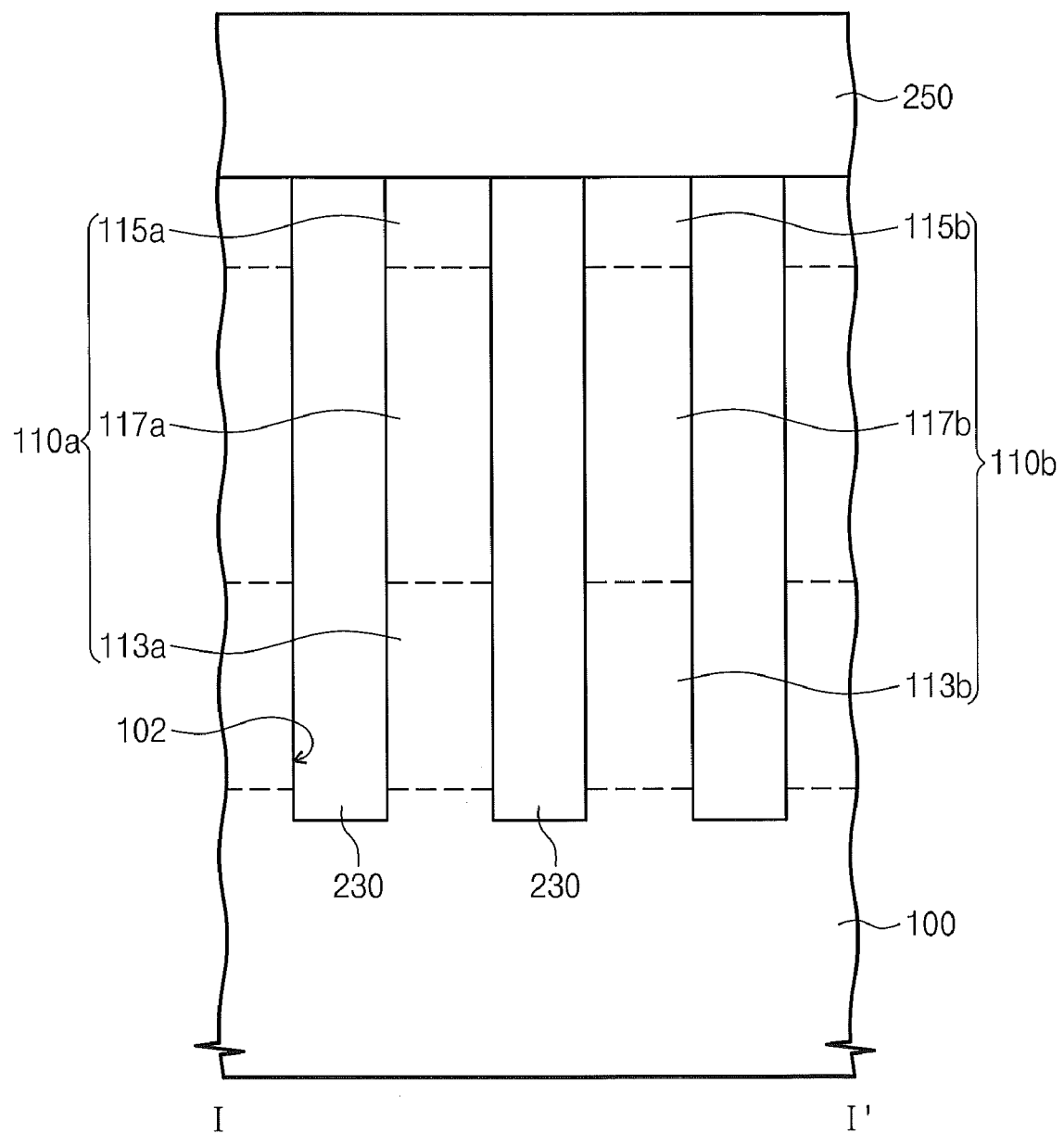
Figure 6B:
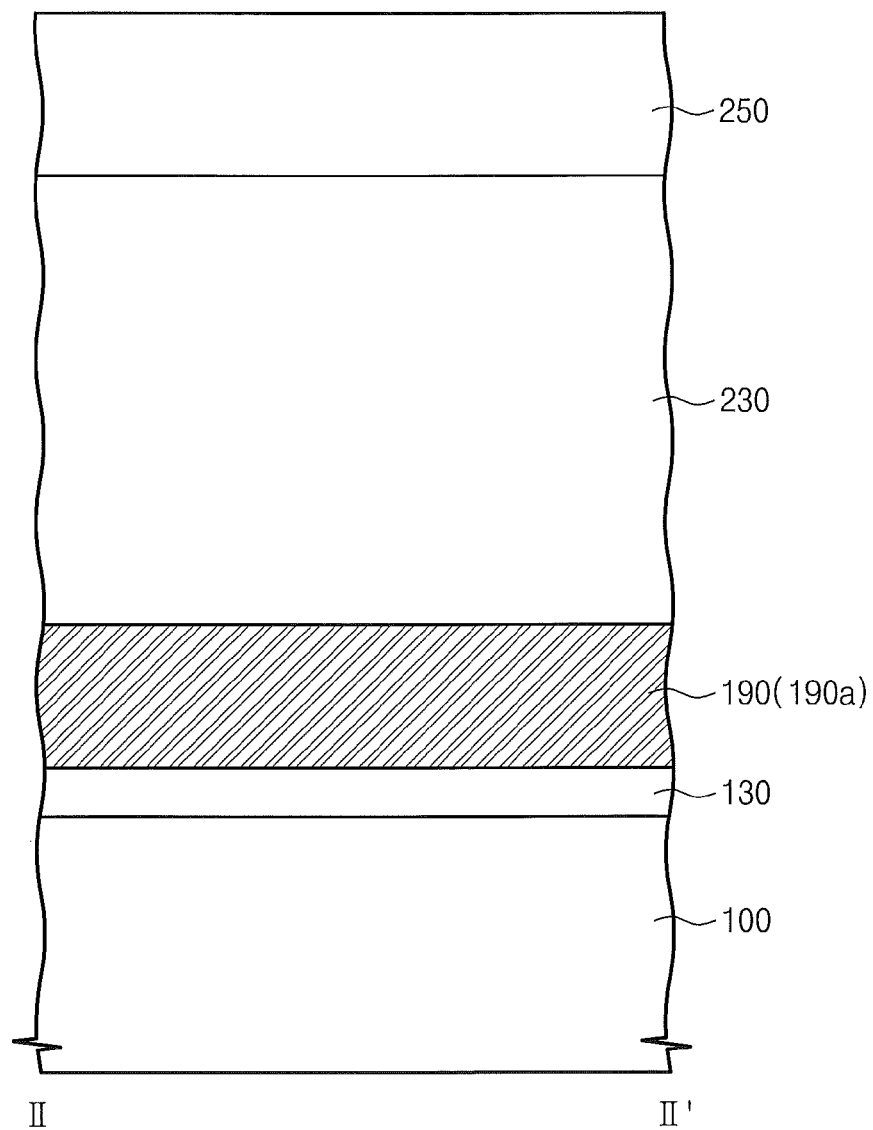
Figure 6C:
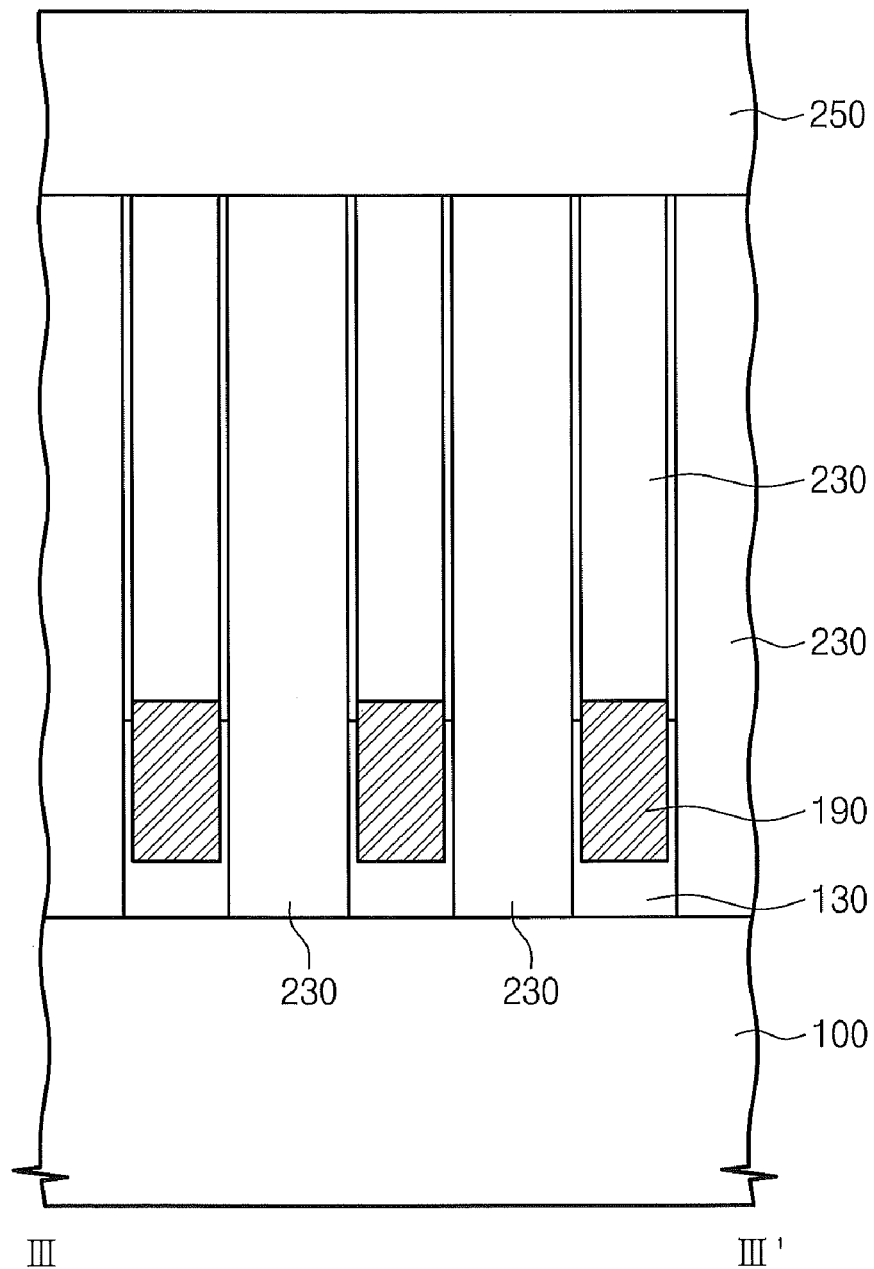
Figure 6D:
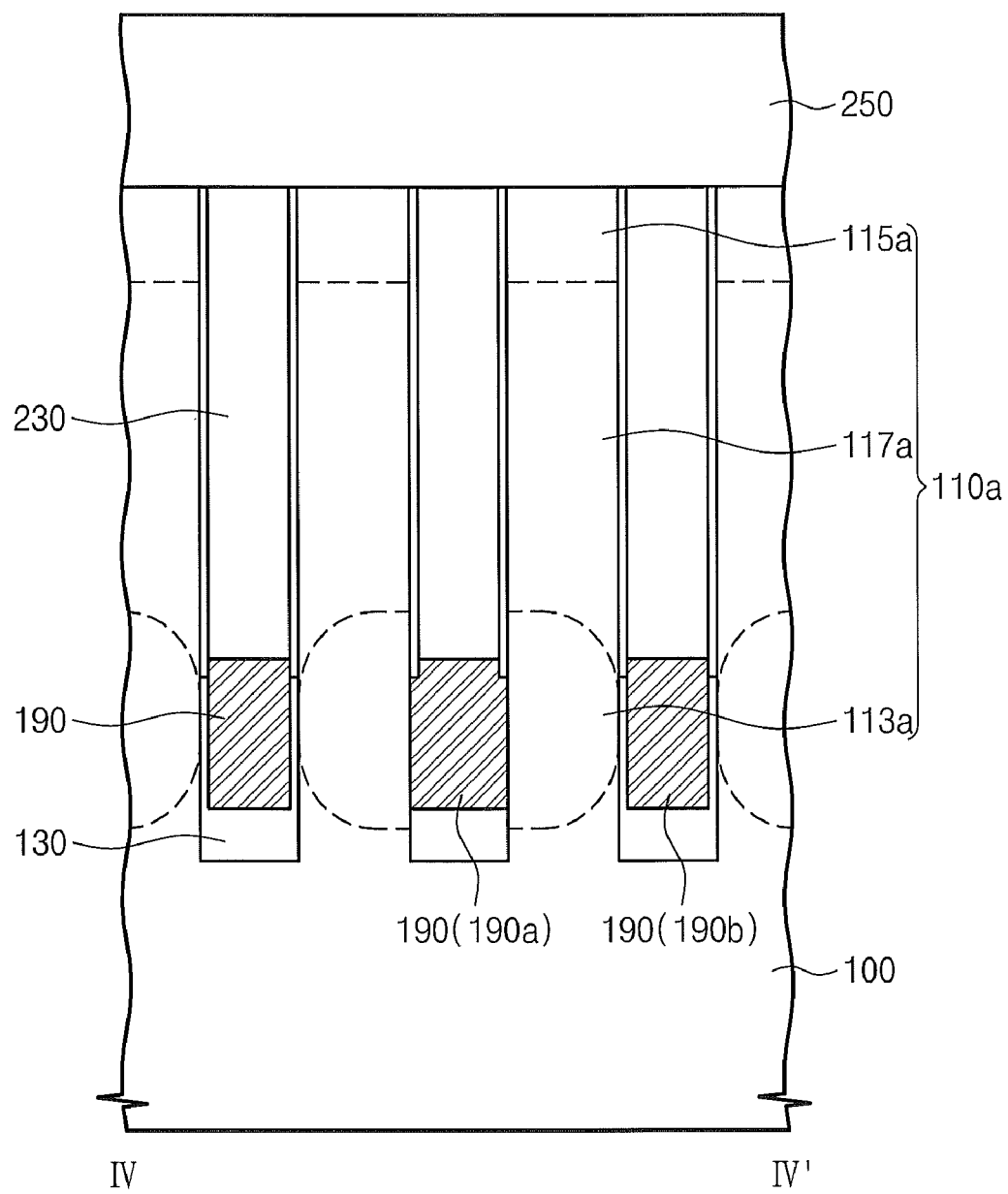

In the present embodiments, the sidewall protective film pattern 351, as illustrated in FIG. 4A, may extend to partly overlap the channel bodies 117a and 117b adjacent to the upper impurity regions 115a and 115b. As a result, a gate induced drain leakage (GIDL) phenomenon of the vertical field effect transistors may be greatly suppressed.

Accordingly, FIGS. 2-4D also illustrate various embodiments described herein wherein a semiconductor substrate 100 includes first and second spaced apart vertically extending active regions 110a, 110b, and a vertically extending insulating region 230 therebetween. An interlayer insulating film 250 is provided on the active regions 110a, 110b and on the insulating region 230. A gate electrode hole (illustrated below) is provided in the interlayer insulating film 250 that extends vertically into the insulating region 230 adjacent the active regions 110a, 110b. An upper interconnection 335 is provided in the gate electrode hole in the interlayer insulating film 250. A gate electrode 331 extends vertically from the upper interconnection 335 into the gate hole that itself extends vertically into the insulating region 230 adjacent the active regions 110a, 110b. A protective film pattern 350 is provided on the upper interconnection 335 that is wider than the upper interconnection 335. As will be described below, the protective film pattern 350 is formed using the gate electrode hole as a template for forming the protective film pattern 350. First and second buried contact electrodes 410a, 410b are provided in the interlayer insulating film 250 that contact the respective first and second active regions 110a, 110b. As will be described below, the protective film pattern 350 is used as a template for forming the first and second buried contact electrodes 410a, 410b.

Hereinafter, methods of manufacturing semiconductor devices in accordance with various embodiments described herein will be described.

FIGS. 5A through 14A, FIGS. 5B through 14B, FIGS. 5C through 14C and FIGS. 5D through 14D are cross sectional views taken along the lines I-I', II-II', III-III' and IV-IV' of FIG. 2 to explain methods of manufacturing semiconductor devices in accordance with first embodiments described herein.

Referring to FIGS. 2, 5A, 5B, 5C and 5D, a semiconductor substrate 100 is etched to form trenches 102 defining a plurality of active regions 110 spaced apart from one another. The trench 102 may be formed to have a mesh shape. That is, the trench 102 may be formed to include a plurality of first trenches parallel to a first direction and a plurality of second trenches parallel to a second direction crossing the first direction. As a result, the active regions 110 may be arranged along the first direction and the second direction.

For convenience of description, a pair of active regions adjacent to each other among the active regions 110 will be referred to as a first active region 110a and a second active region 110b. Each of the active regions 110 may be formed to include a lower impurity region, a channel body and an upper impurity region that are sequentially stacked. For example, the first active region 110a may be formed to include a first lower impurity region 113a, a first channel body 117a and a first upper impurity region 115a that are sequentially stacked. The second active region 110b may be formed to include a second lower impurity region 113b, a second channel body 117b and a second upper impurity region 115b that are sequentially stacked.

A buried insulating film 230 is formed in the trenches 102. The buried insulating film 230 may be a silicon oxide film. Before forming the buried insulating film 230, a plurality of lower interconnections 190 may be formed in lower regions of the first trenches. The lower interconnections 190 may be a conductive material. The lower interconnections 190 may include first and second lower interconnections 190a and 190b adjacent to each other. Before forming the lower interconnections 190, a lower insulating film 130 may be formed on bottom surfaces of the first trenches. Thus, the lower interconnections 190 may be electrically insulated from the semiconductor substrate 100 by the lower insulating film 130.

Referring to FIGS. 2, 6A, 6B, 6C and 6D, an interlayer insulating film 250 covering the active regions 110 and the buried insulating film 230 may be formed. The interlayer insulating film 250 may be formed from a silicon oxide film.

Referring to FIGS. 2, 7A, 7B, 7C and 7D, a first photo mask 270 is formed on the interlayer insulating film 250. The first photo mask 270 may be formed to have openings parallel to a direction crossing the lower interconnections 190. The openings of the first photo mask 270 may be formed to cross upper portions of regions between the active regions 110.

The interlayer insulating film 250 is etched using the first photo mask as an etching mask to form a plurality of grooves 103 having a line shape crossing the lower interconnections 190. The grooves 103 may be formed to cross upper portions of regions between the active regions 110. For example, one of the grooves 103 may be disposed on an upper portion of a region between the first and second active regions 110a and 110b to cross the lower interconnections 190.

Figure 7A:
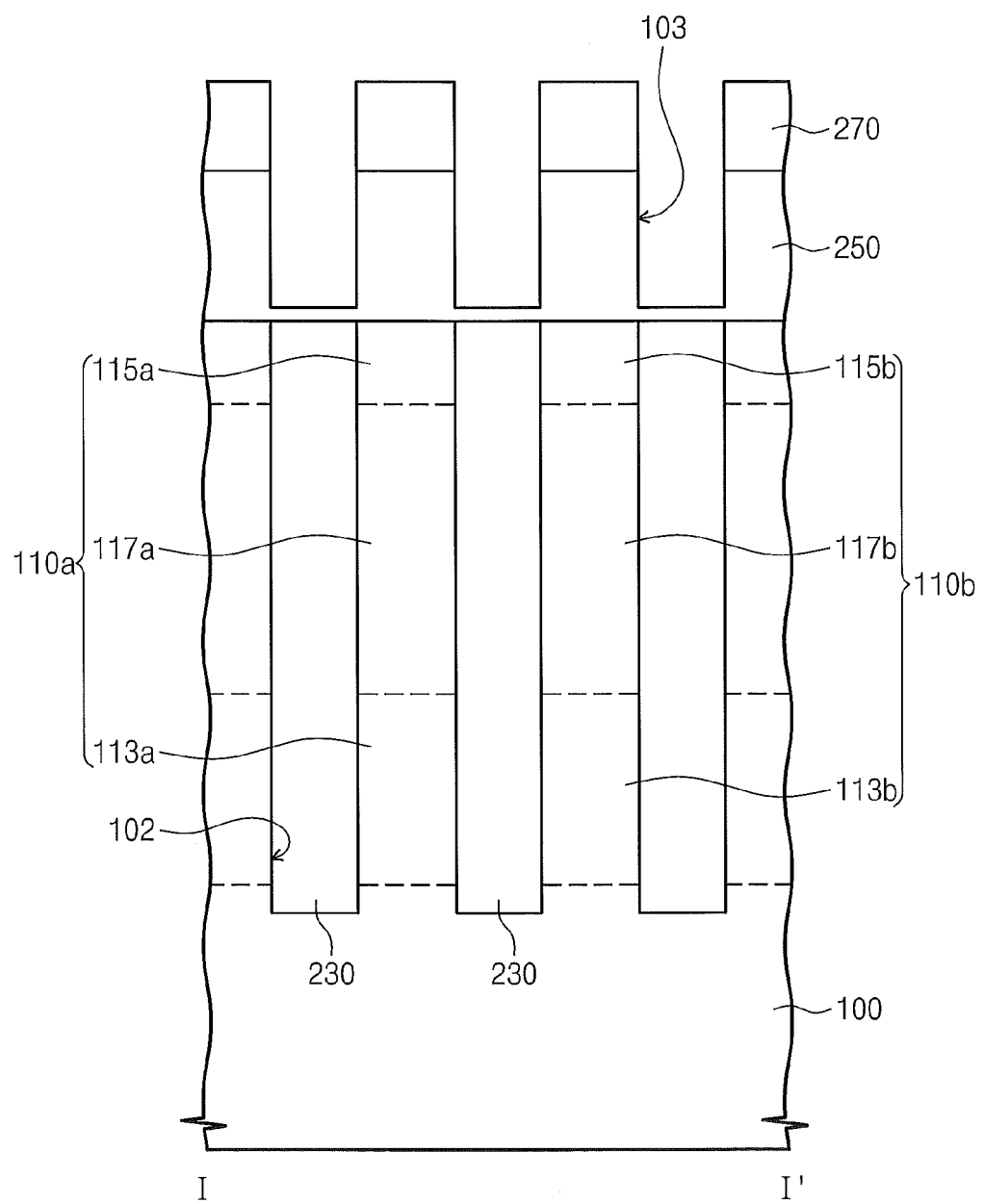
Figure 7B:
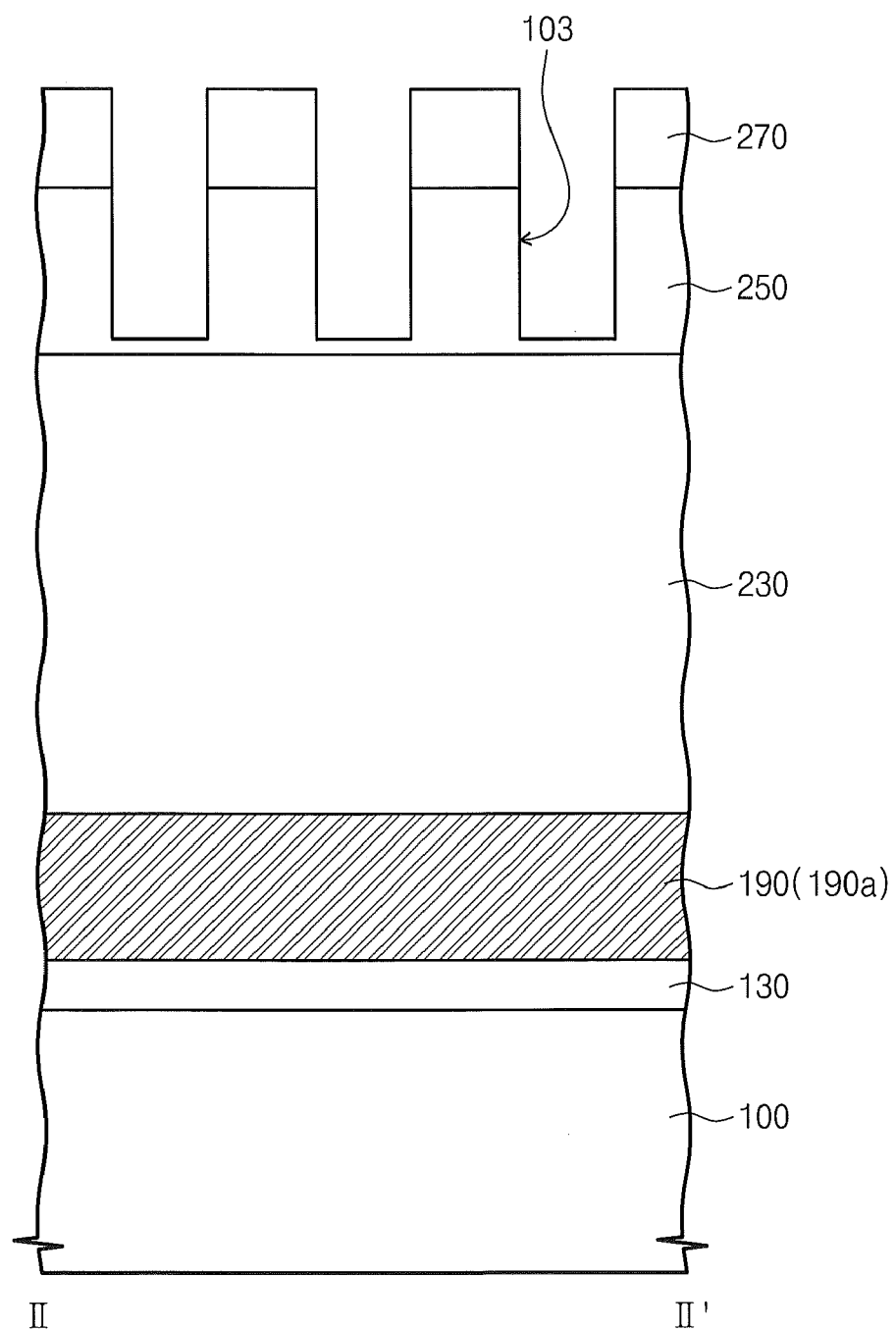
Figure 7C:
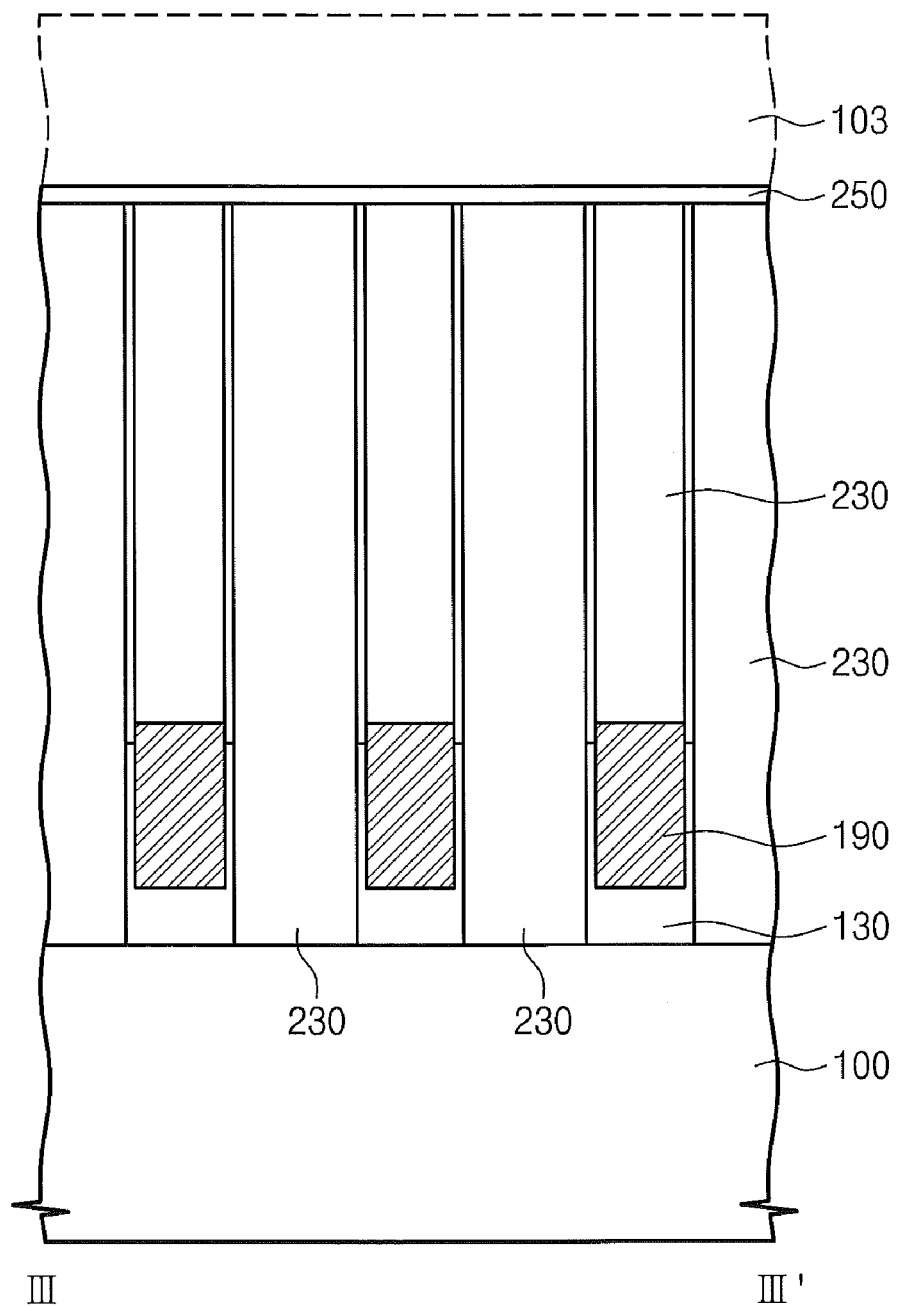
Figure 7D:
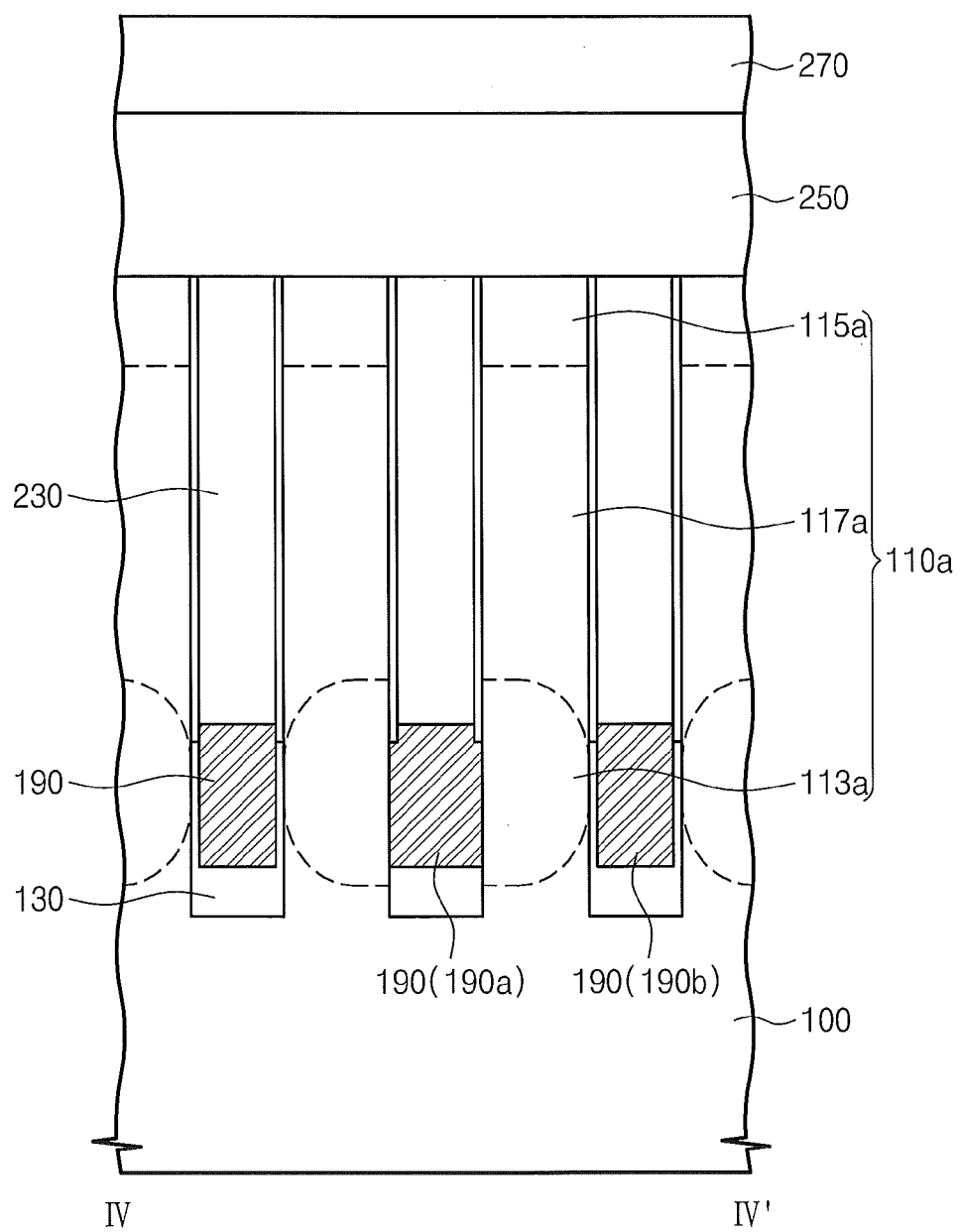
Figure 8A:
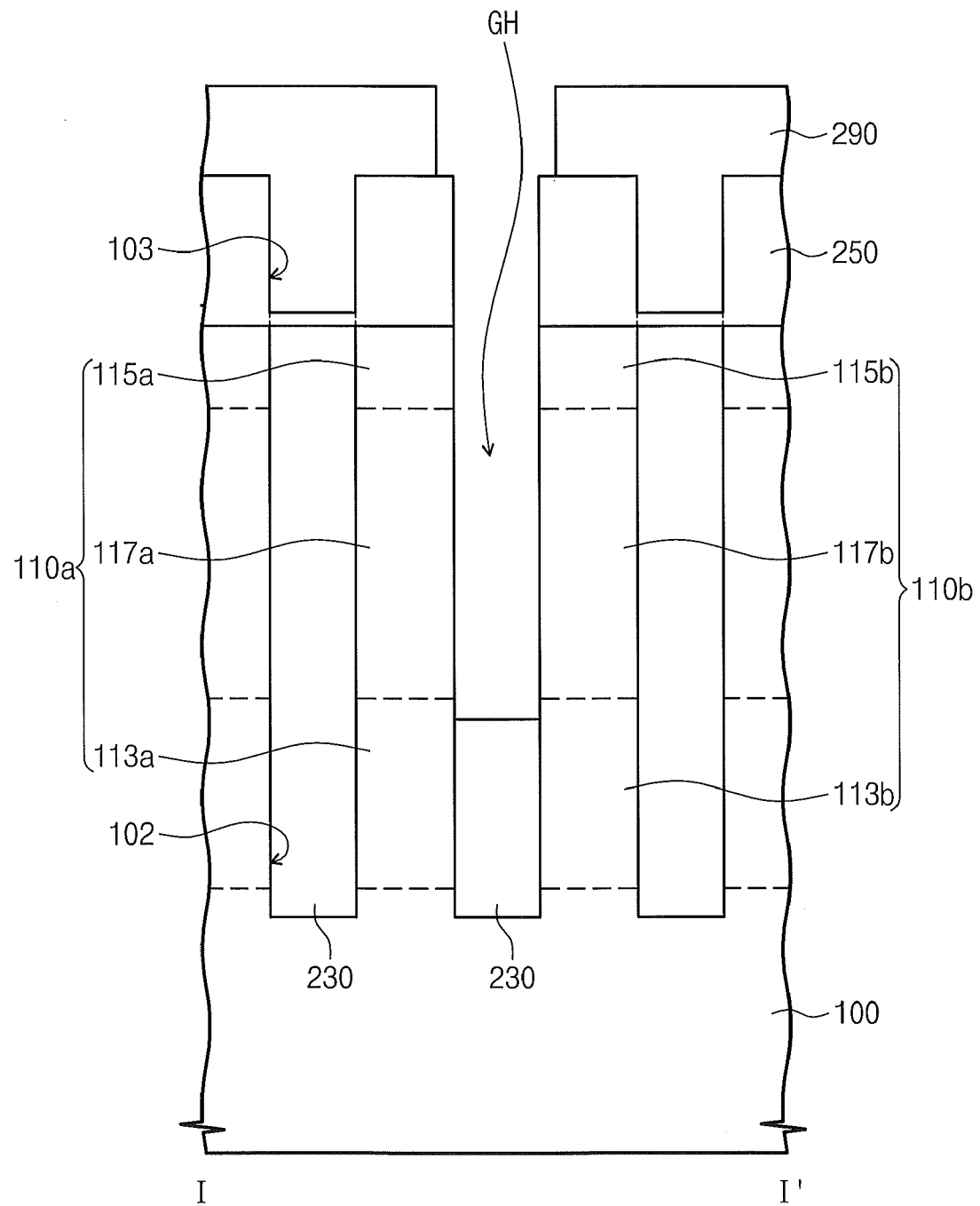
Figure 8B:
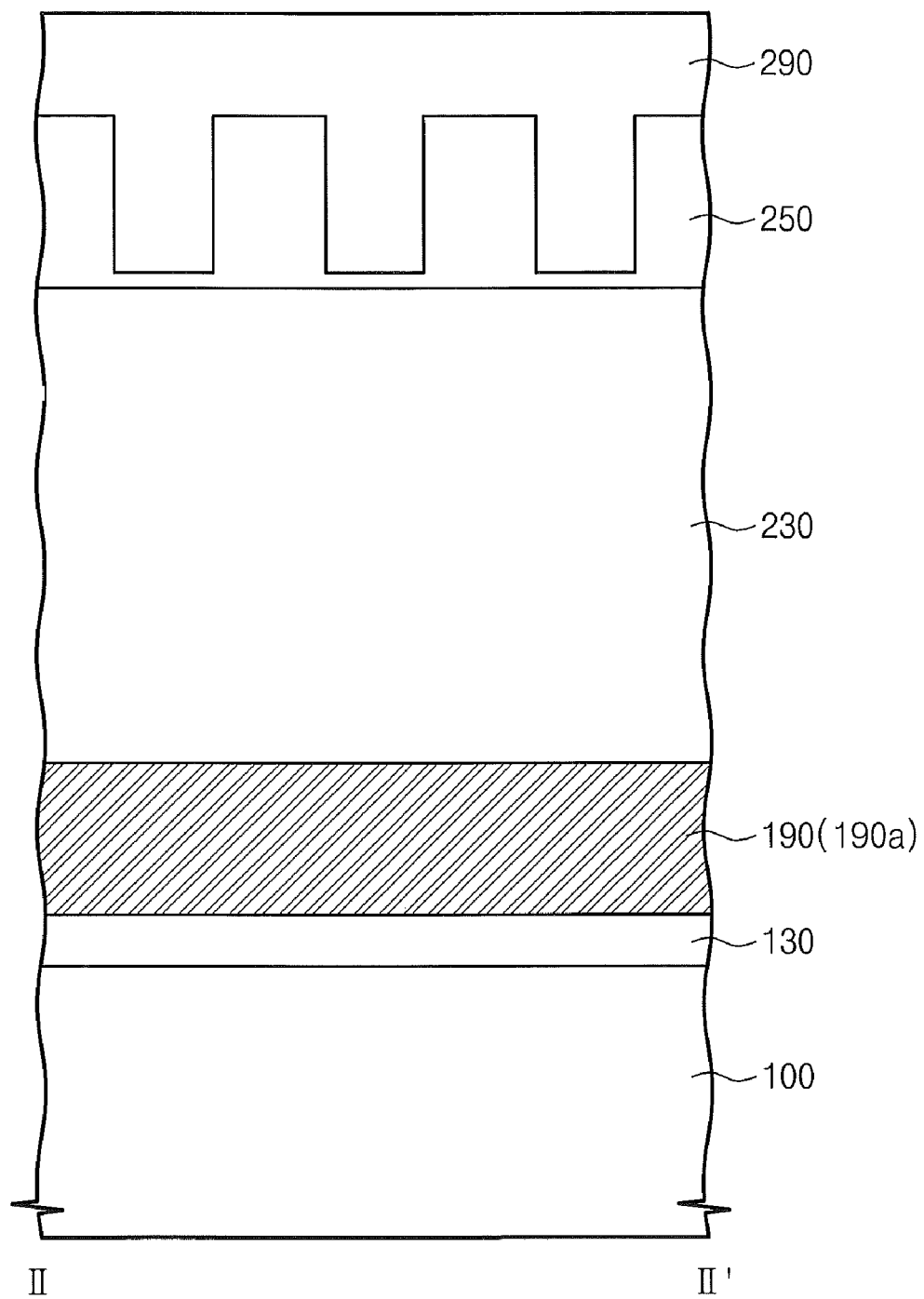
Figure 8C:
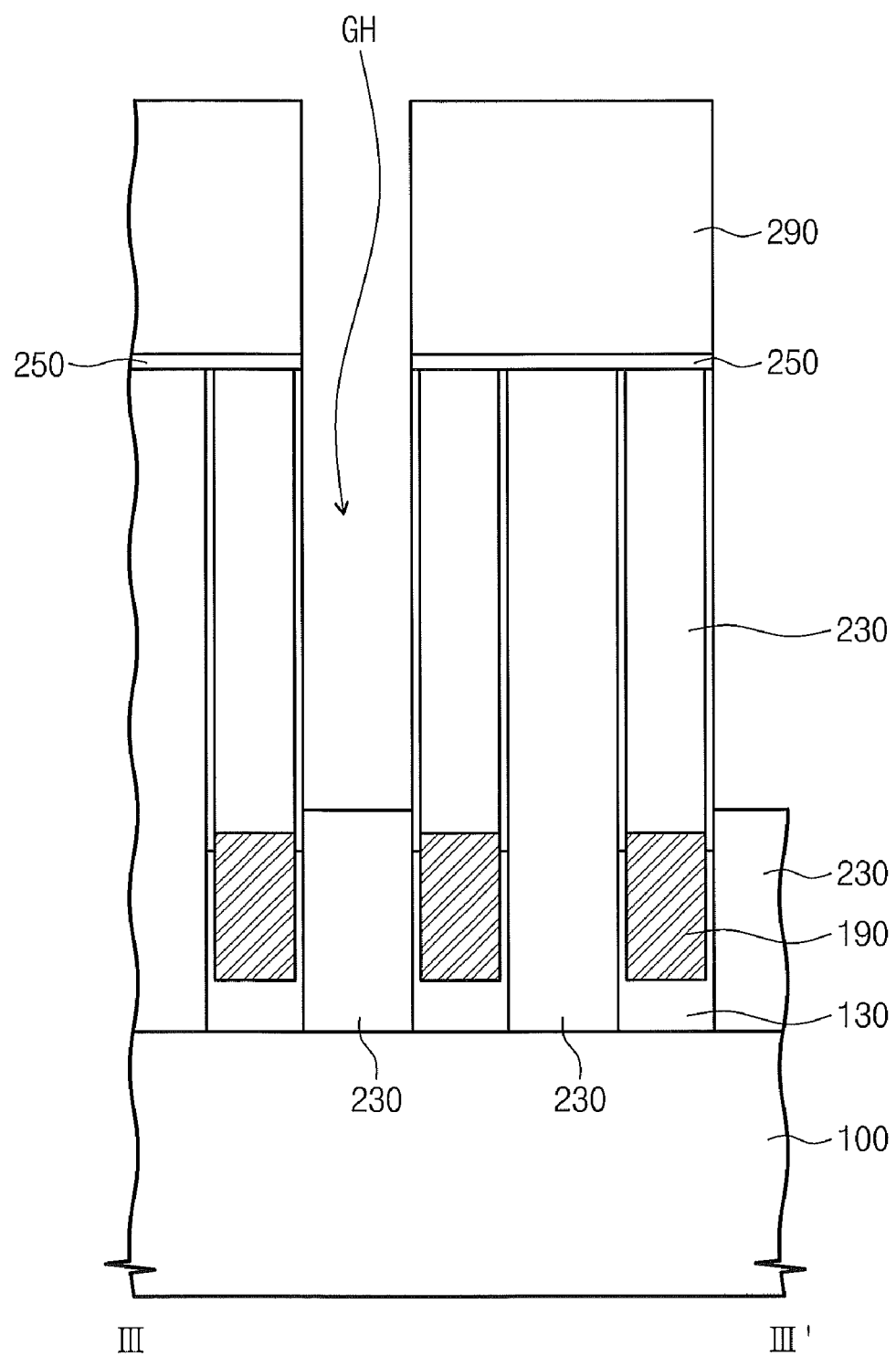
Figure 8D:
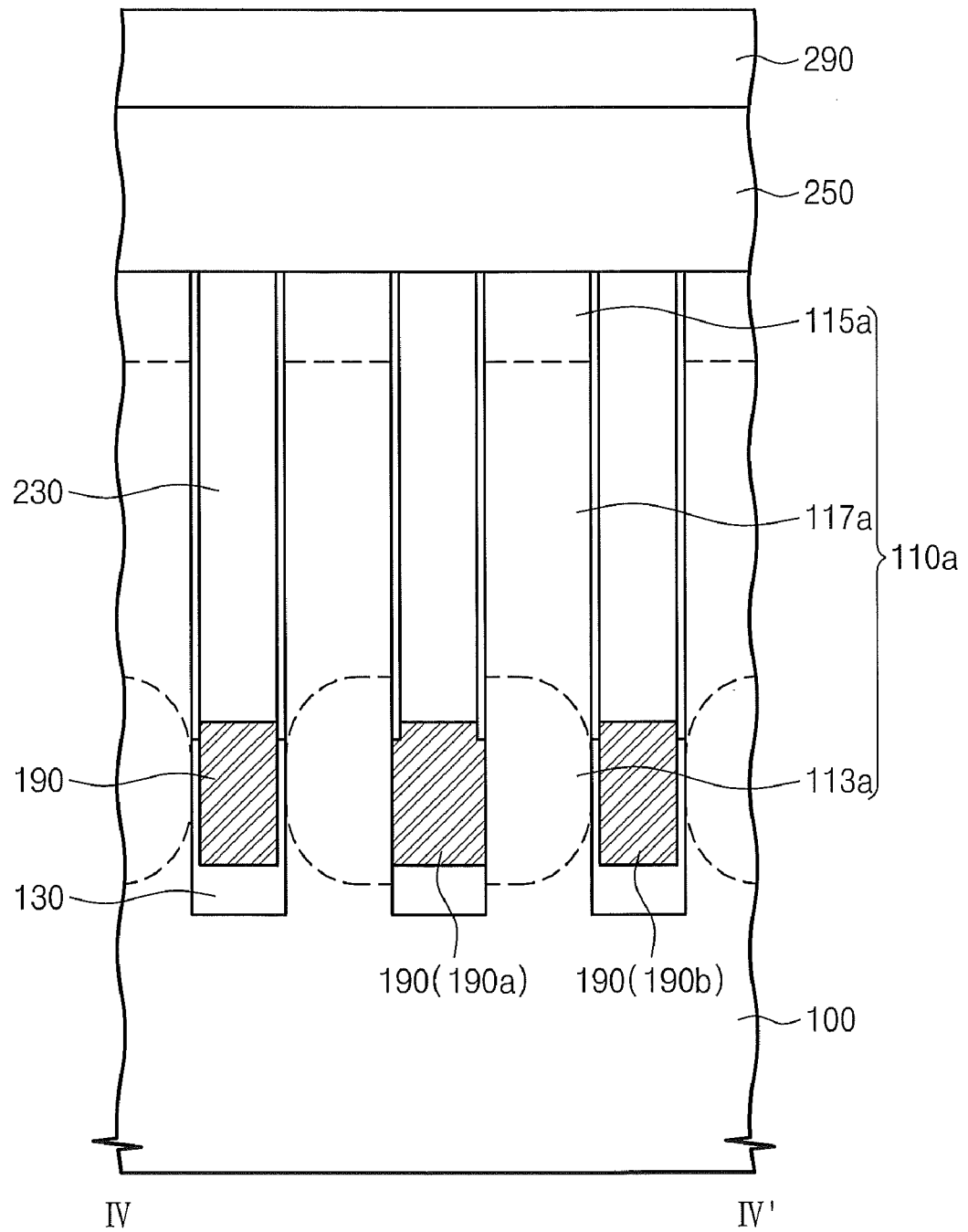
Figure 9A:
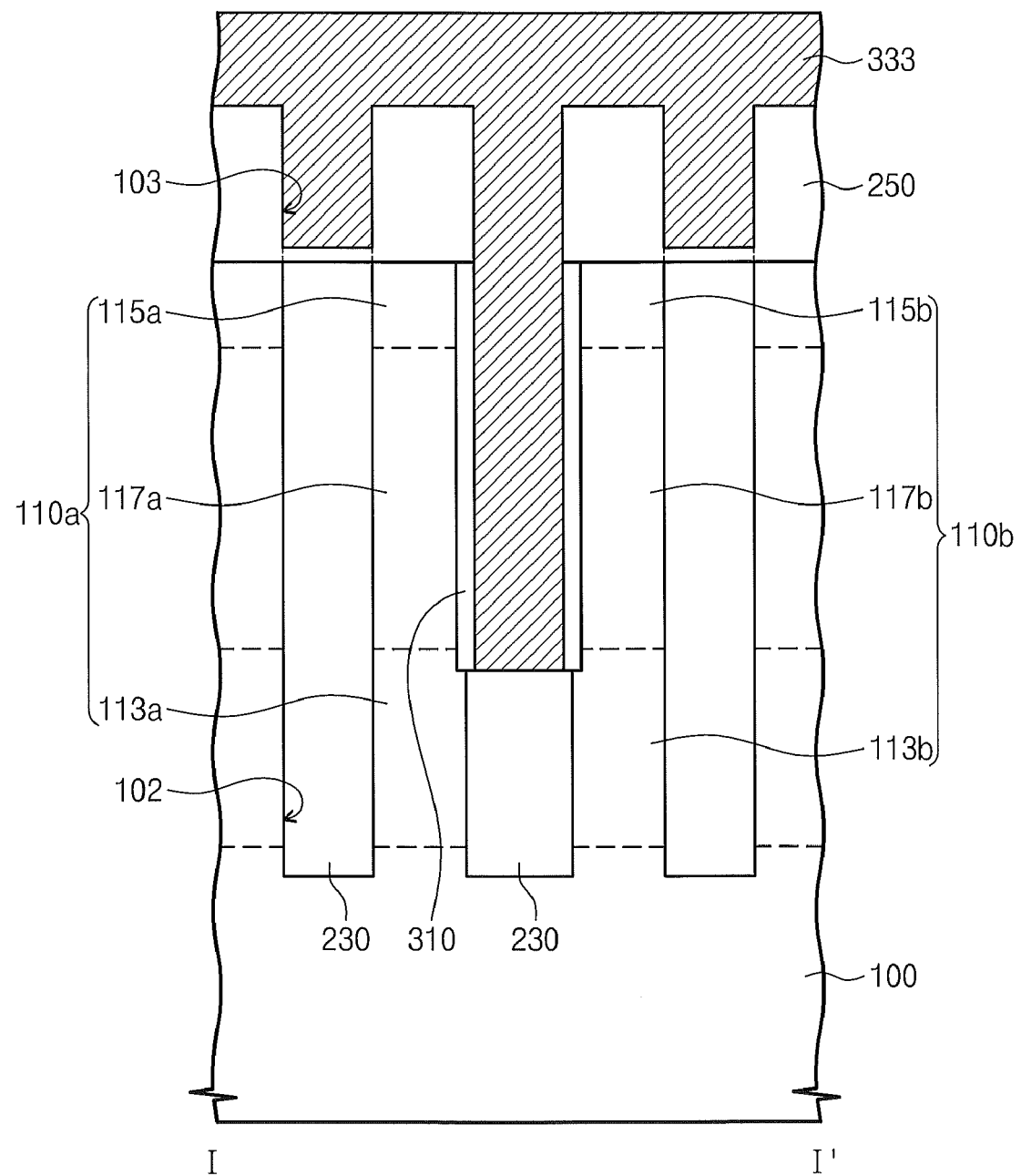
Figure 9B:
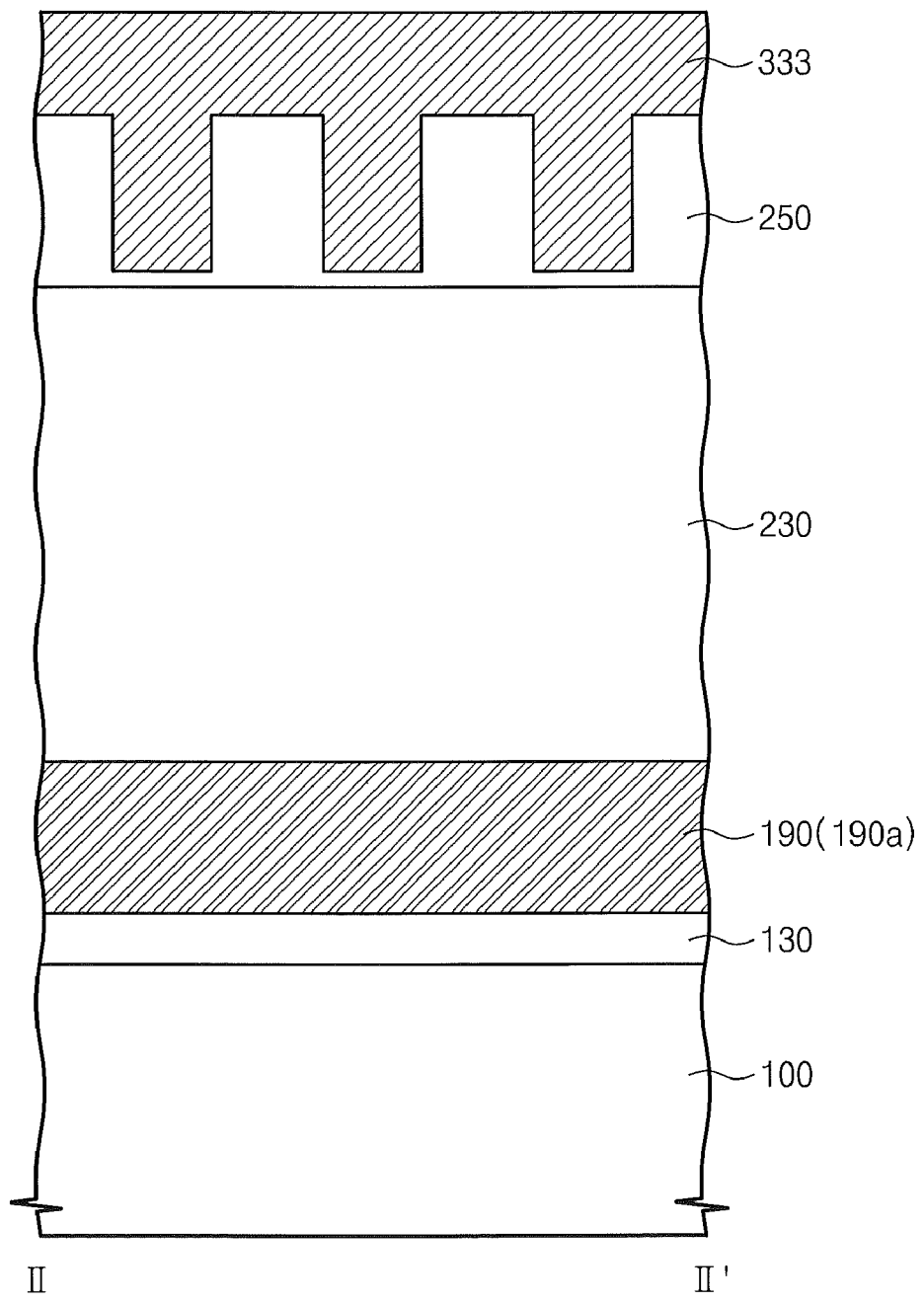
Figure 9C:
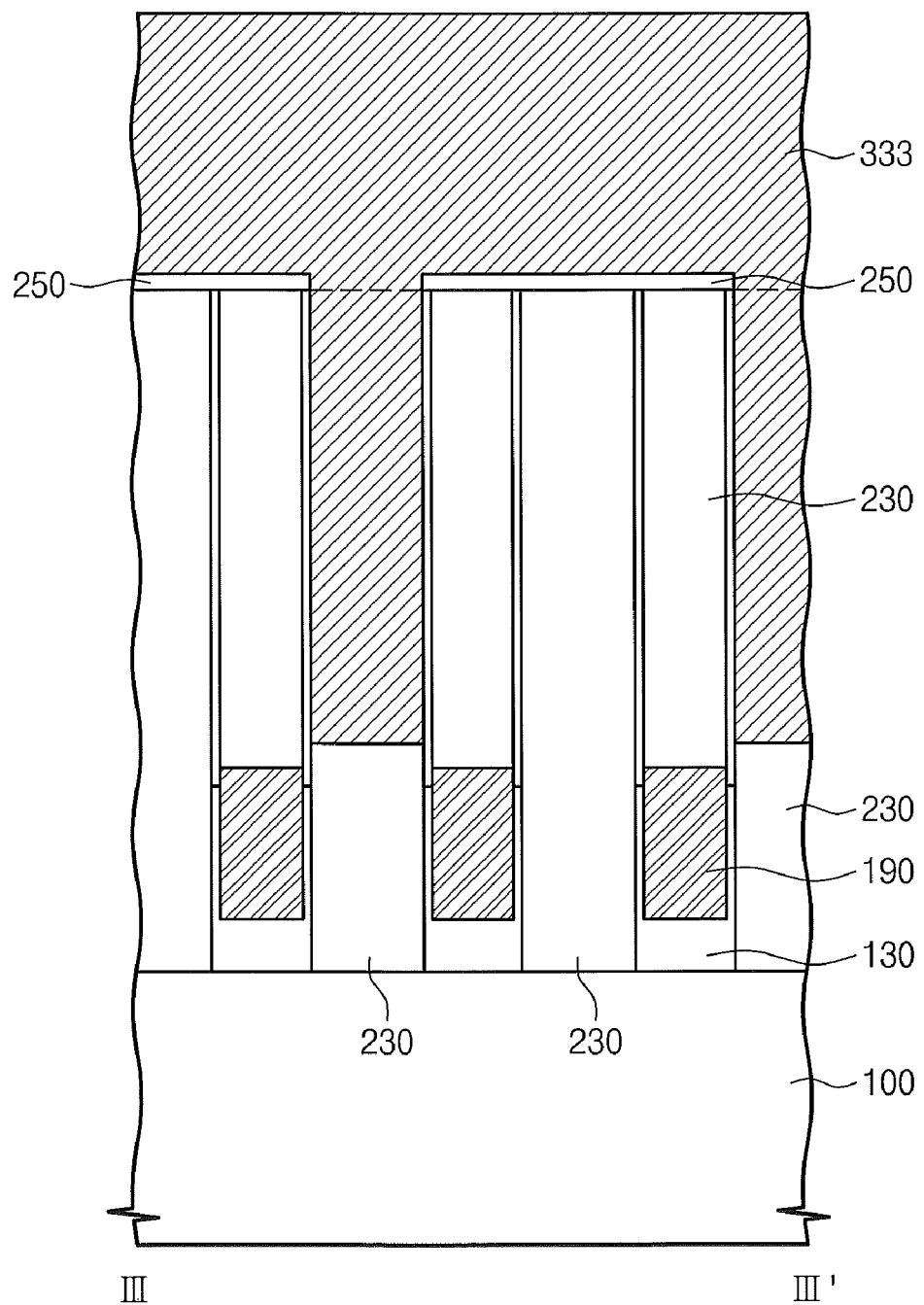
Figure 9D:
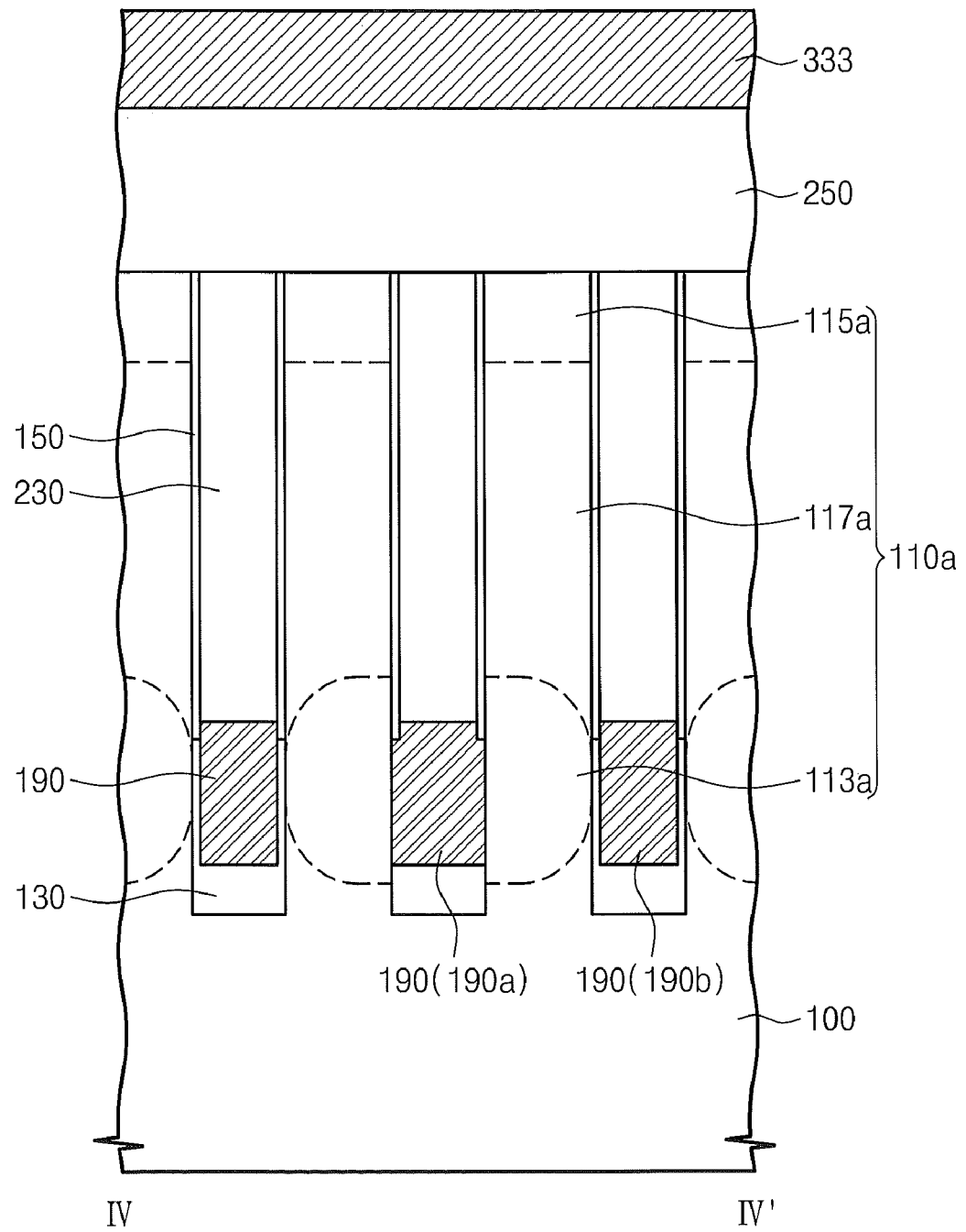
Figure 10A:
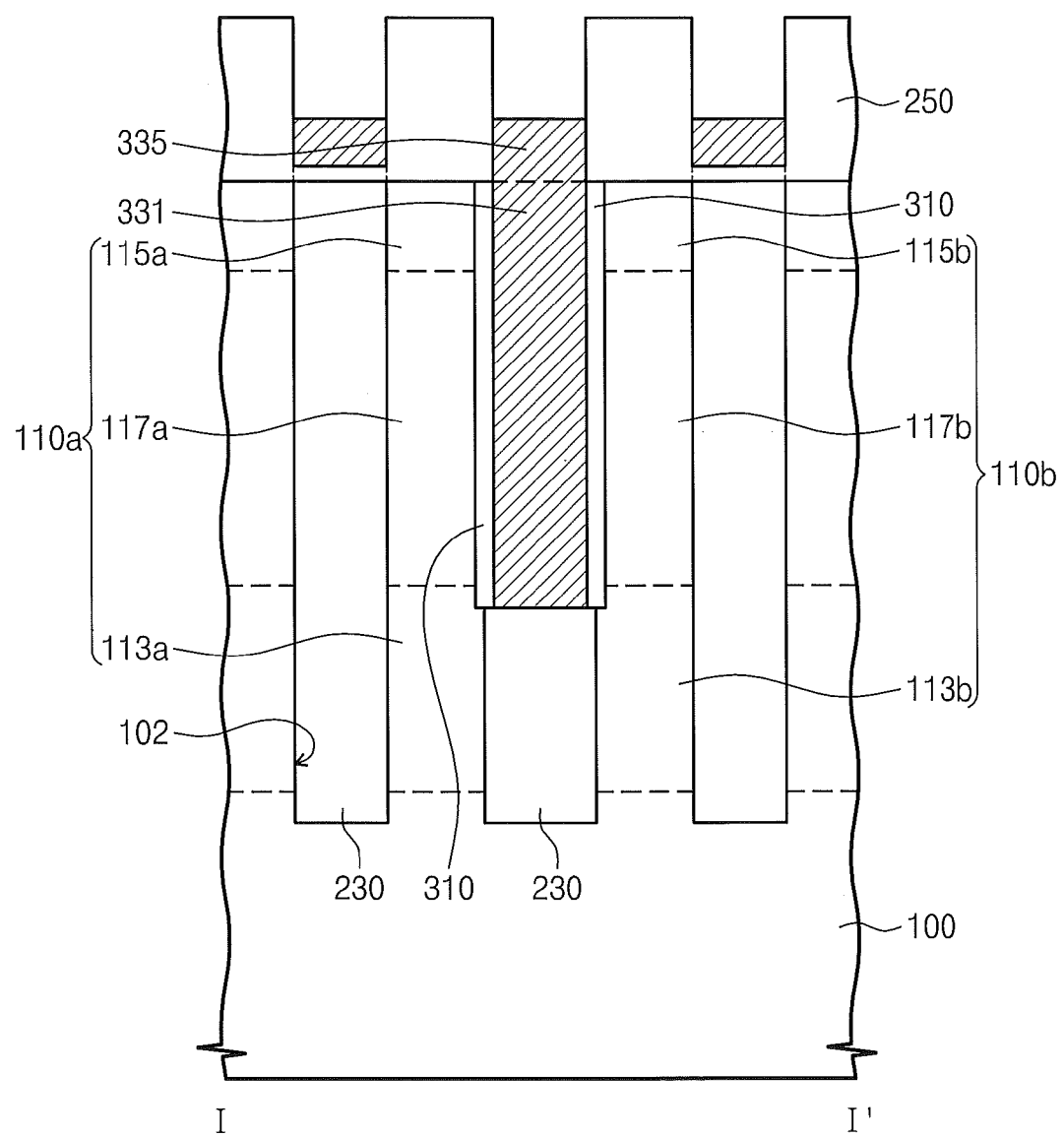
Figure 10B:
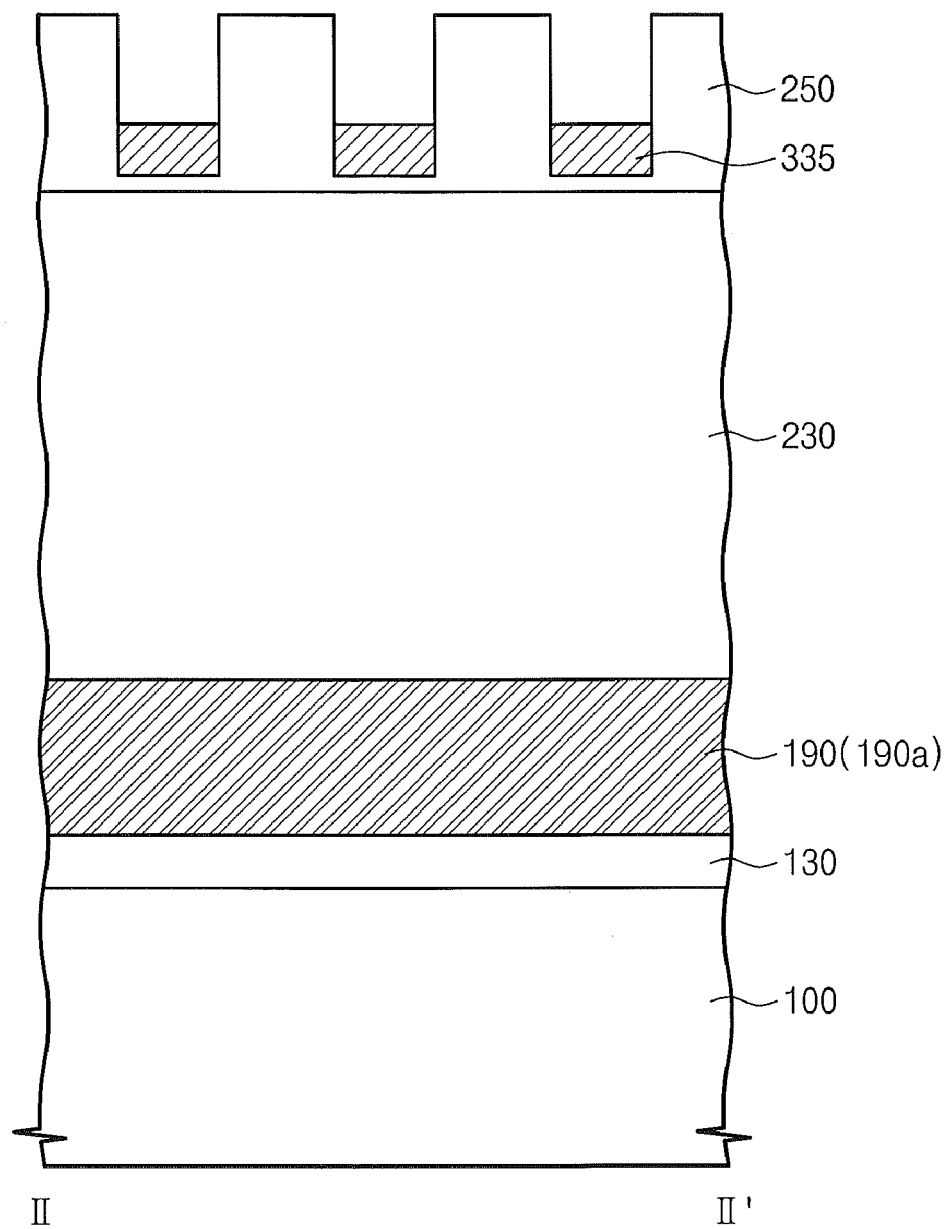
Figure 10C:
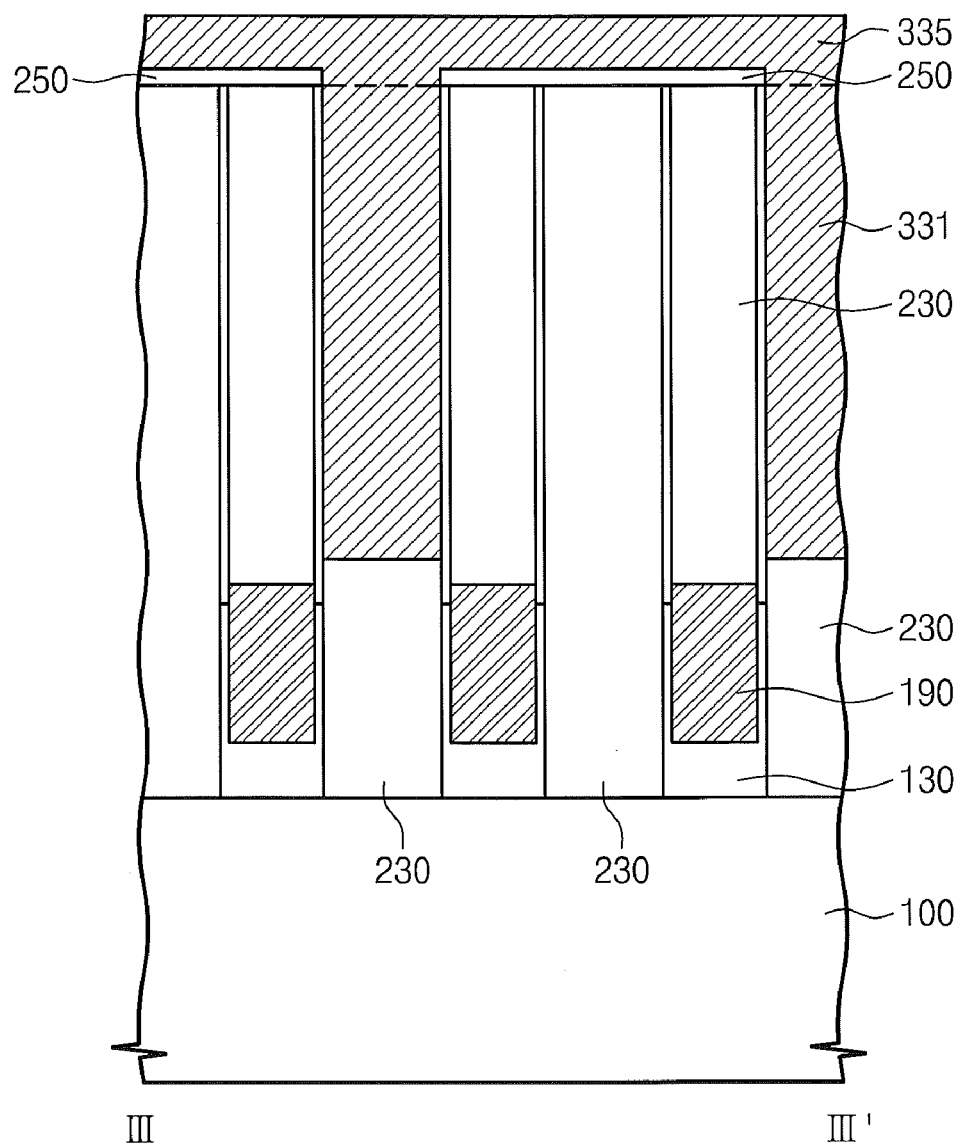
Figure 10D:
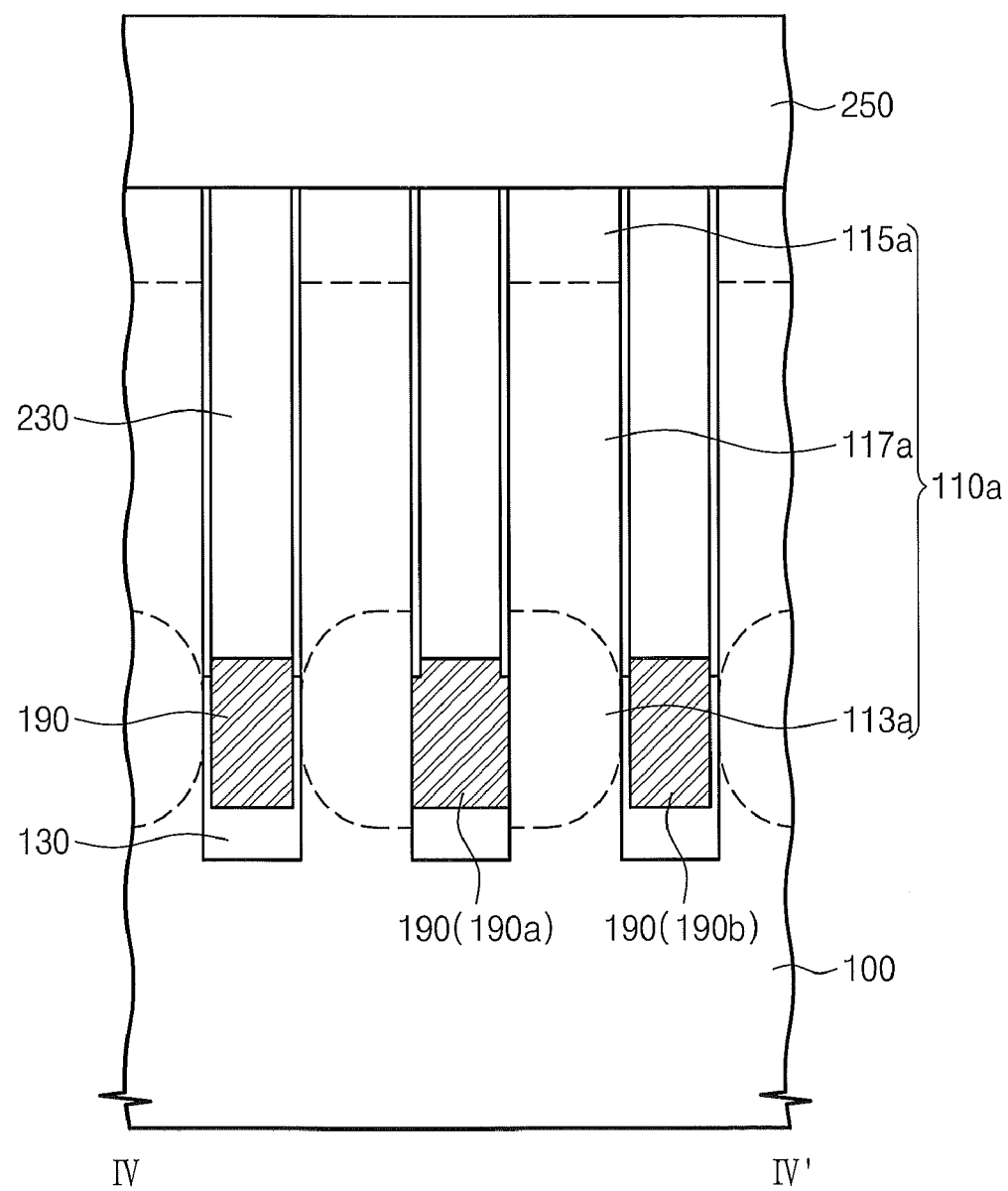
Figure 11A:
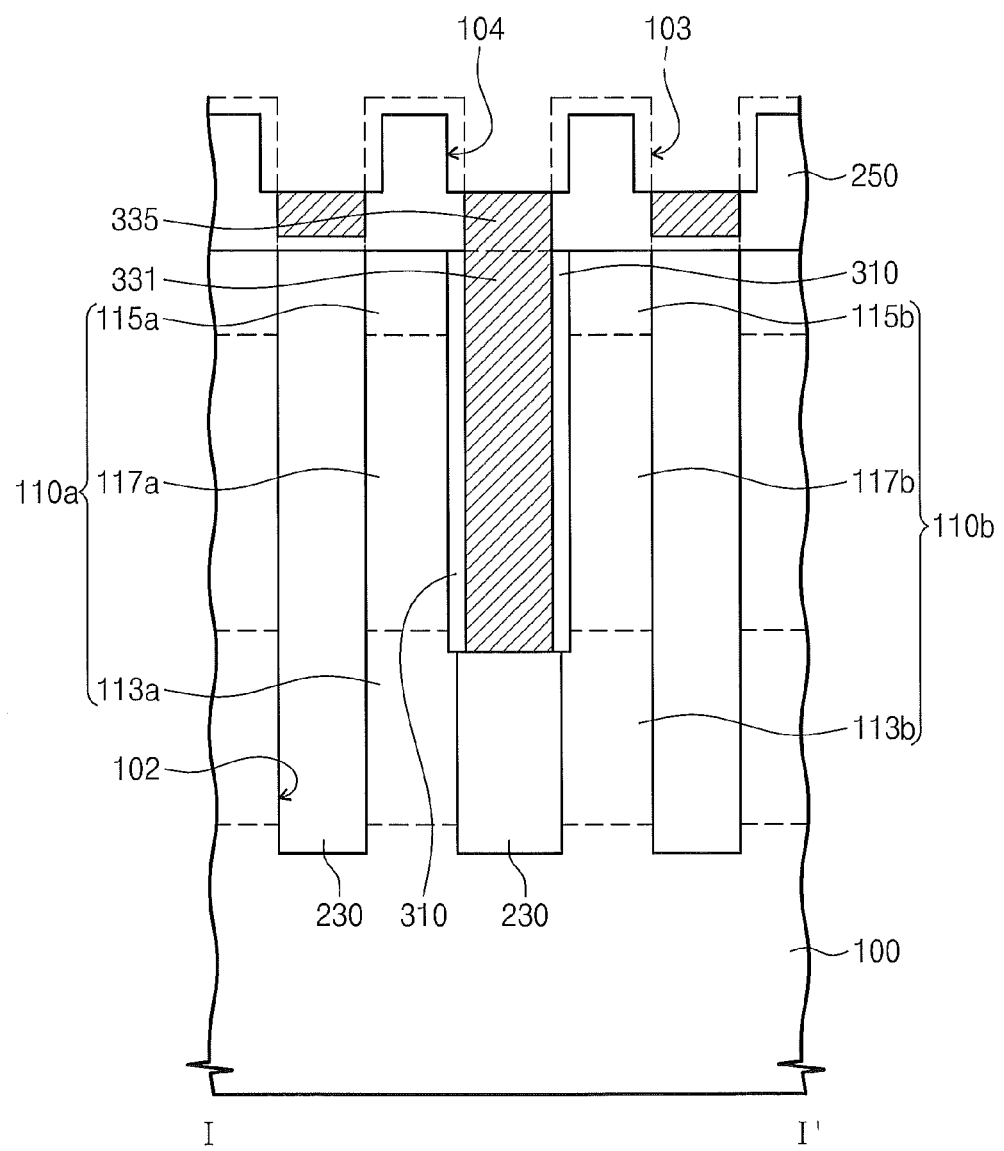
Figure 11B:
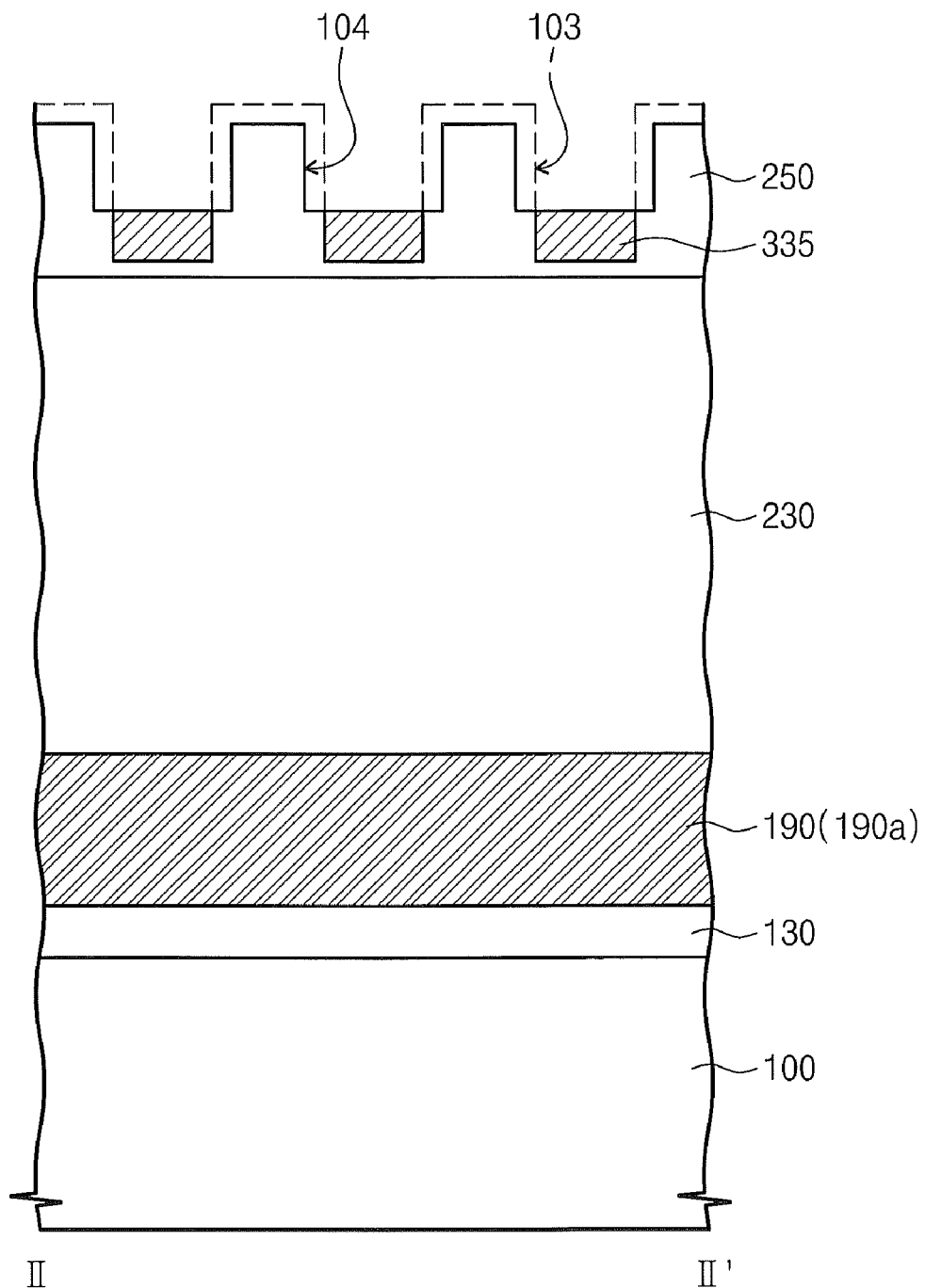
Figure 11C:
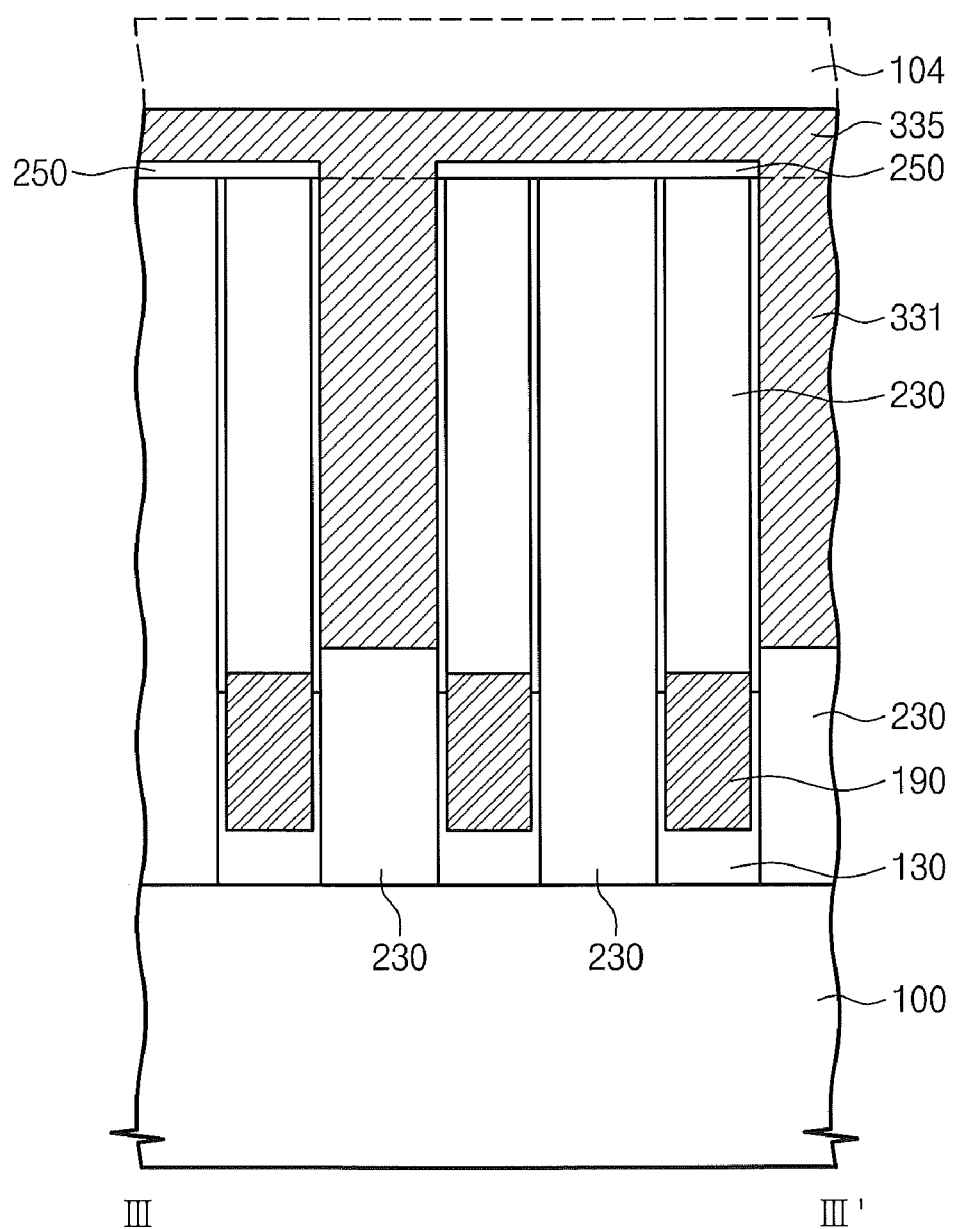
Figure 11D:
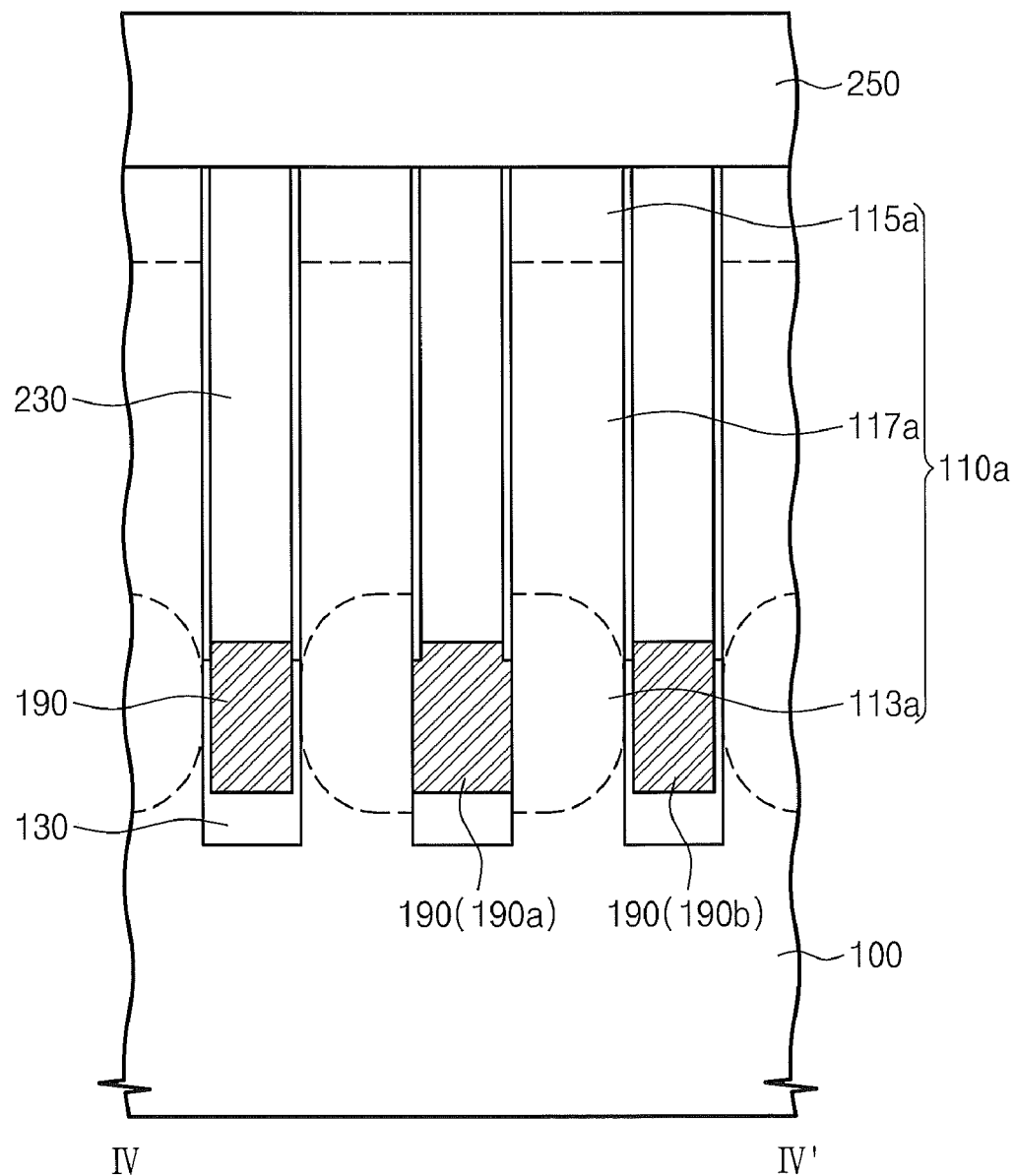
Figure 12A:
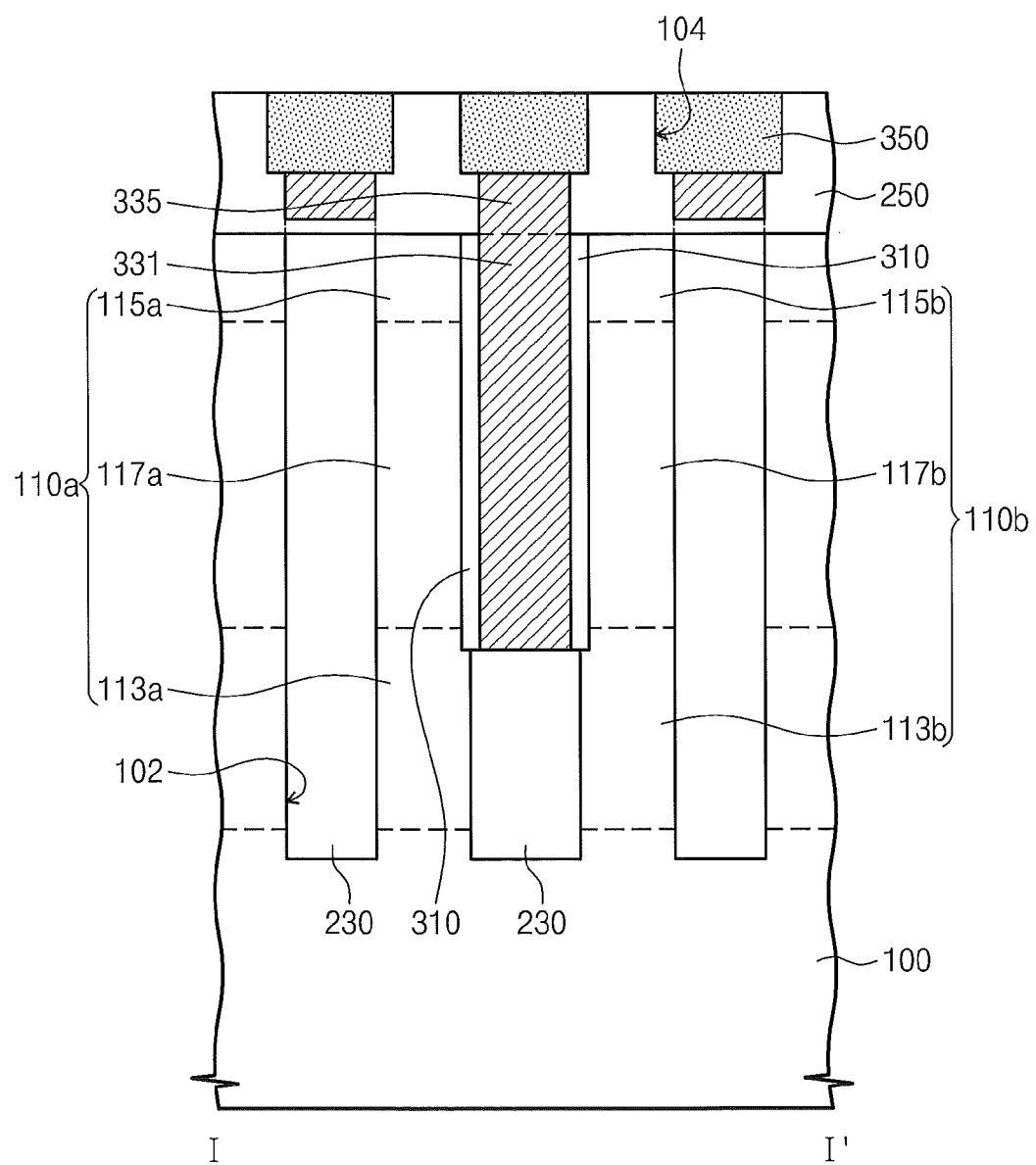
Figure 12B:
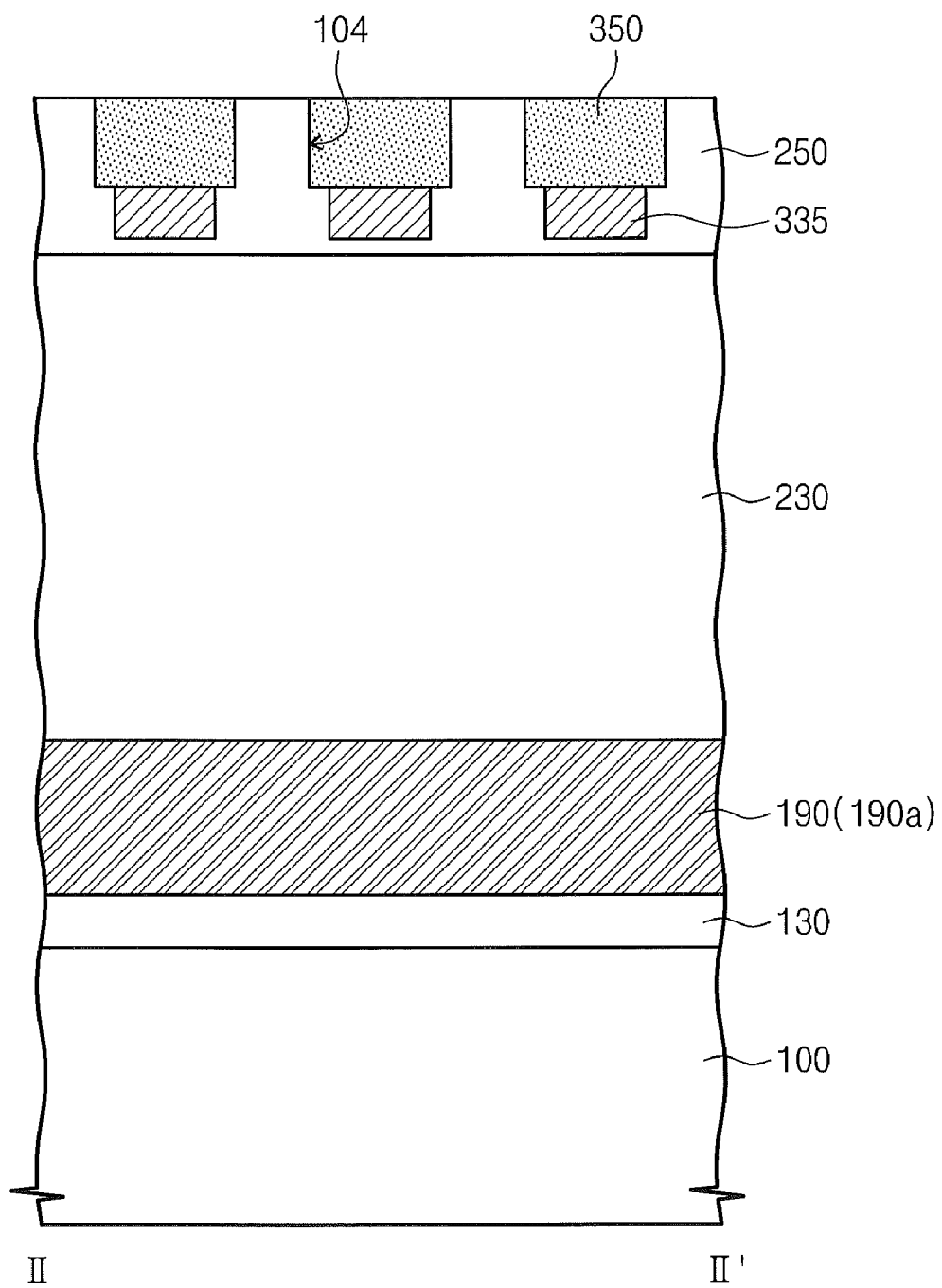
Figure 12C:
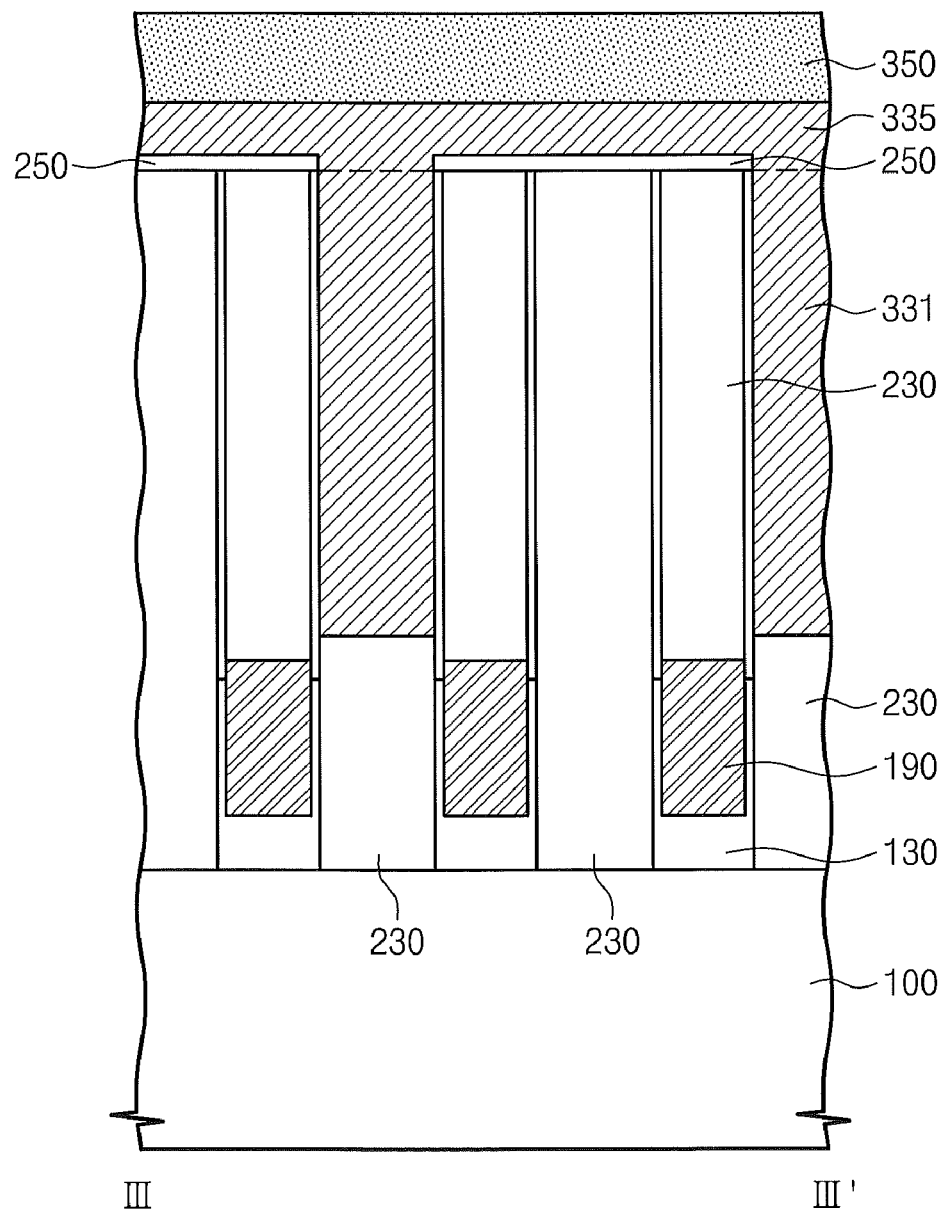
Figure 12D:
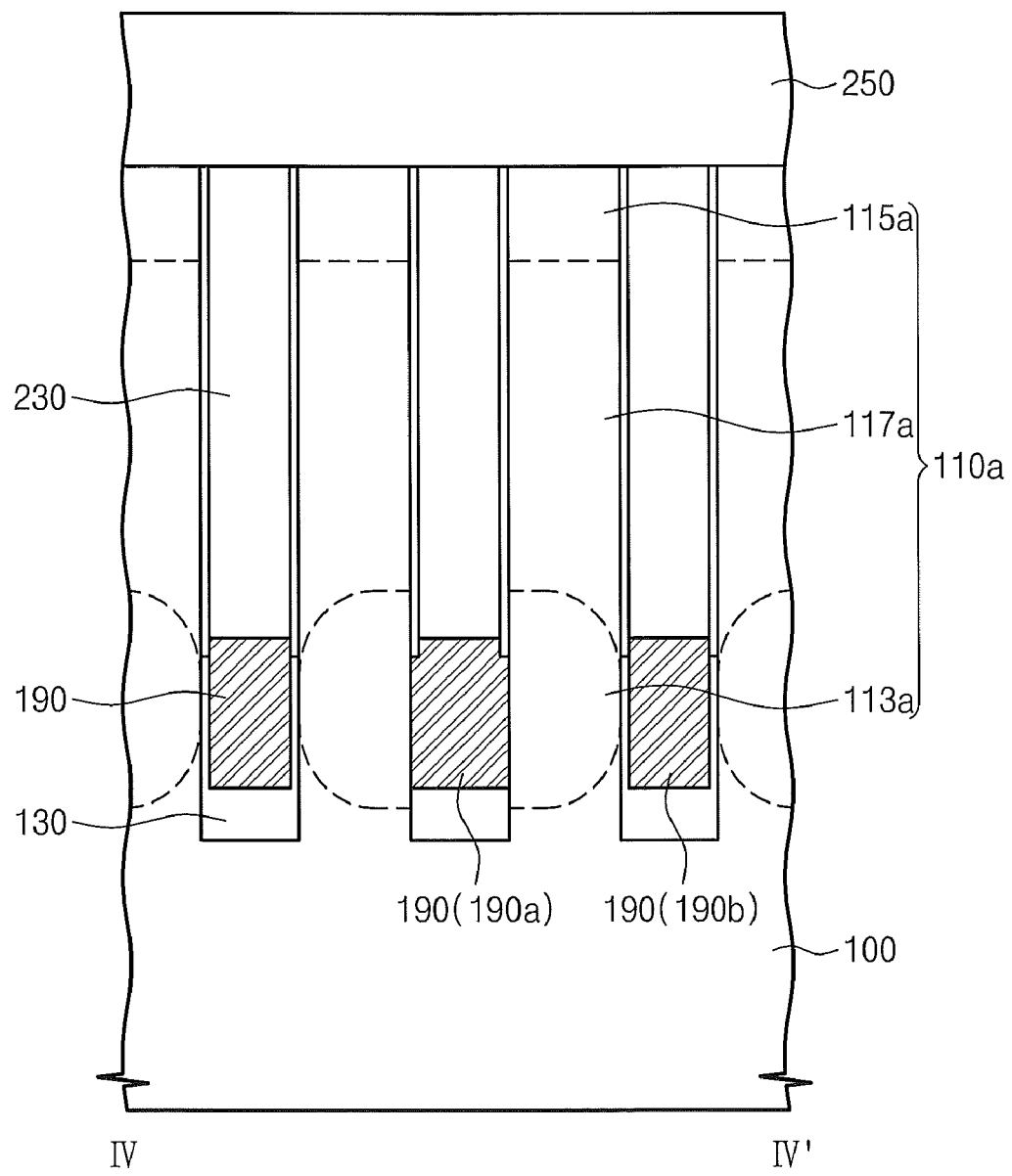
Figure 13A:
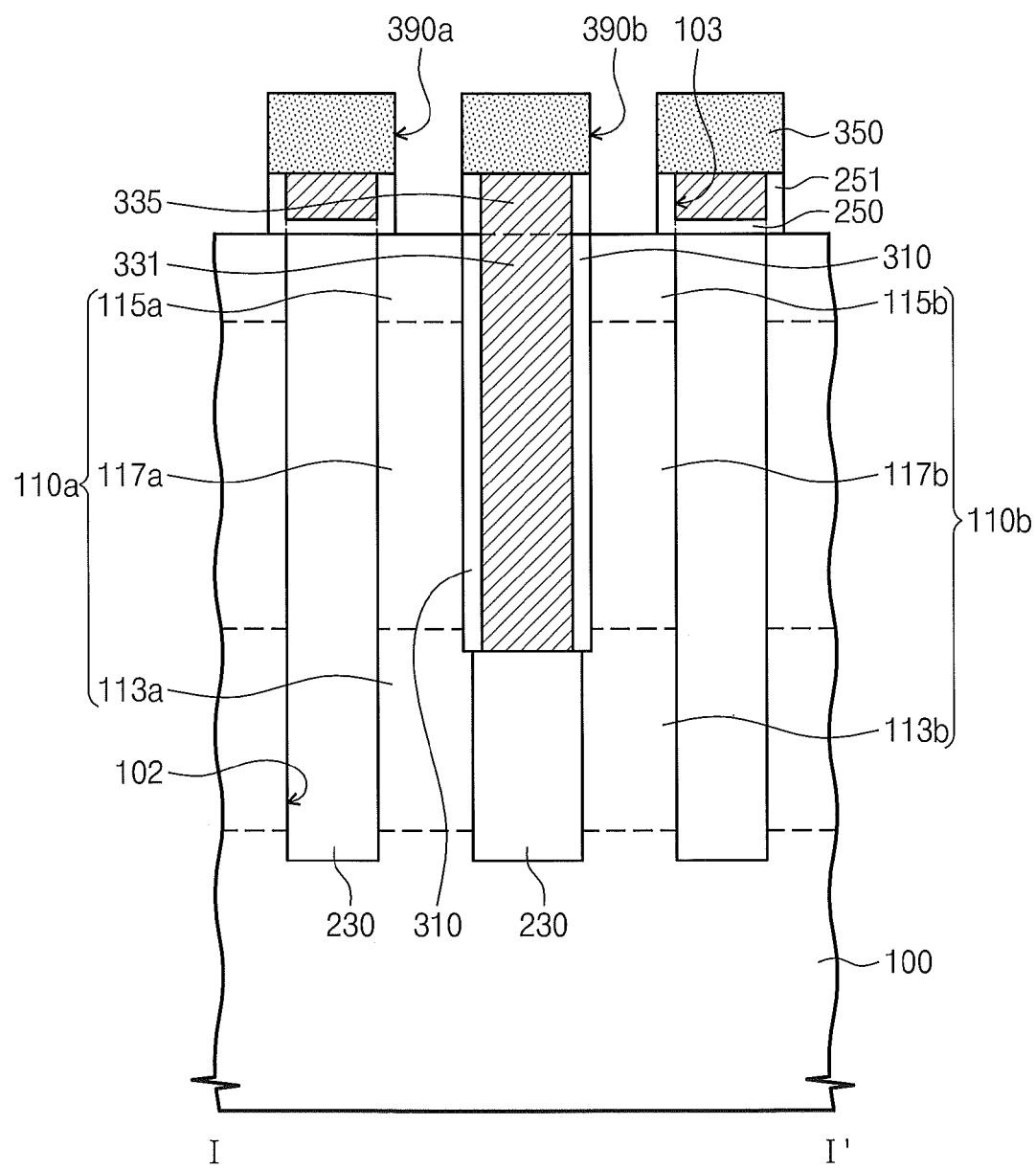
Figure 13B:
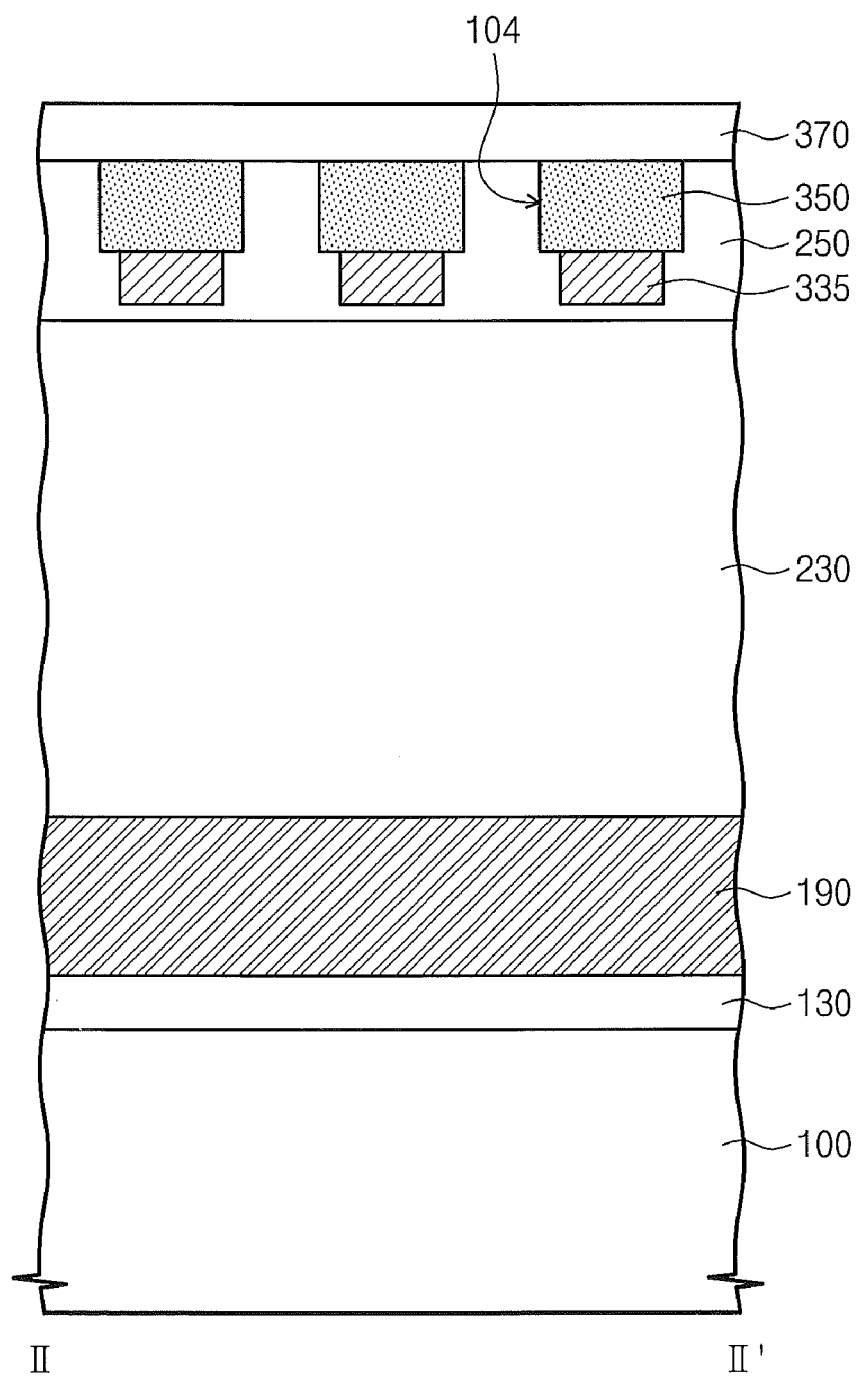
Figure 13C:
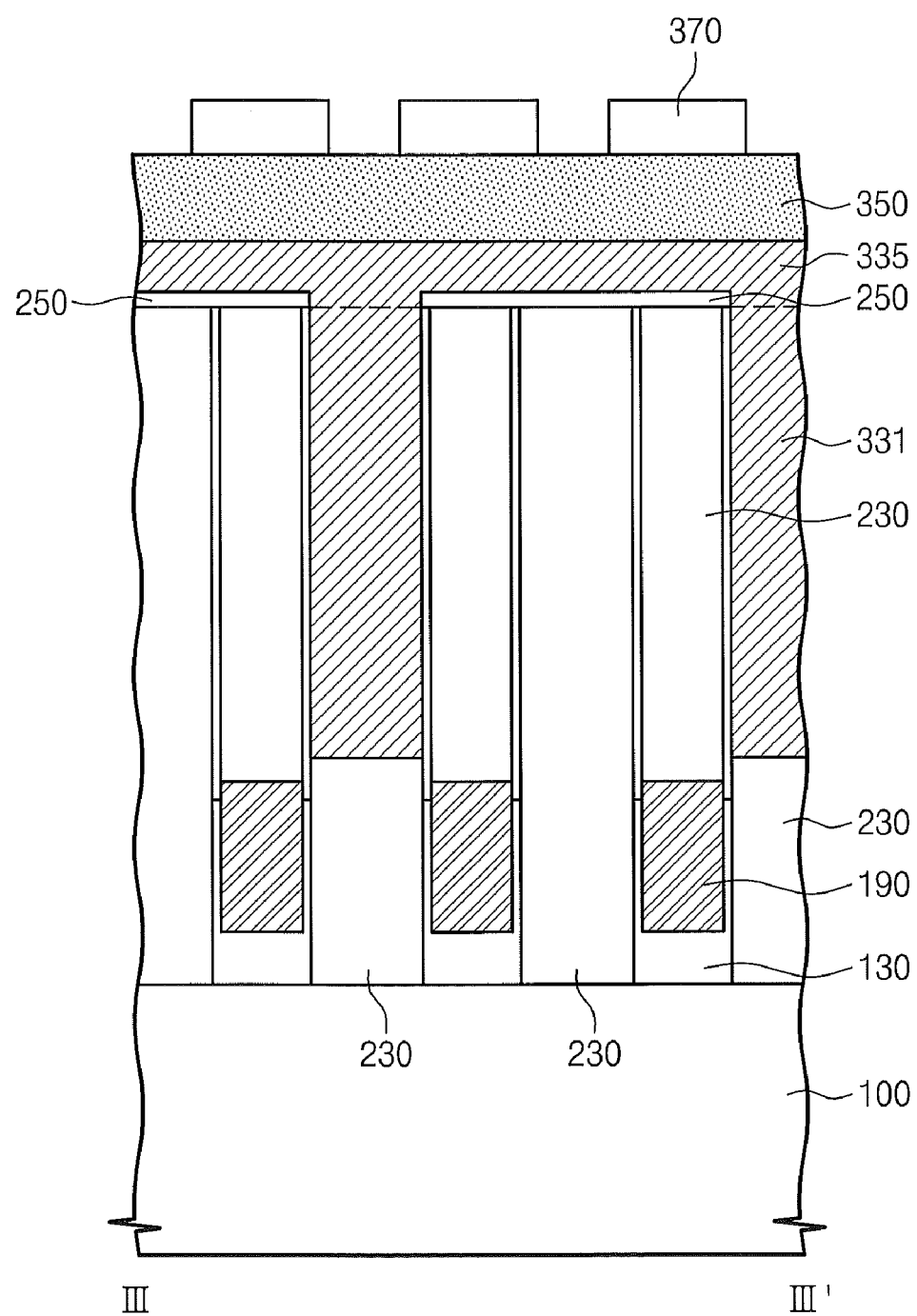
Figure 13D:
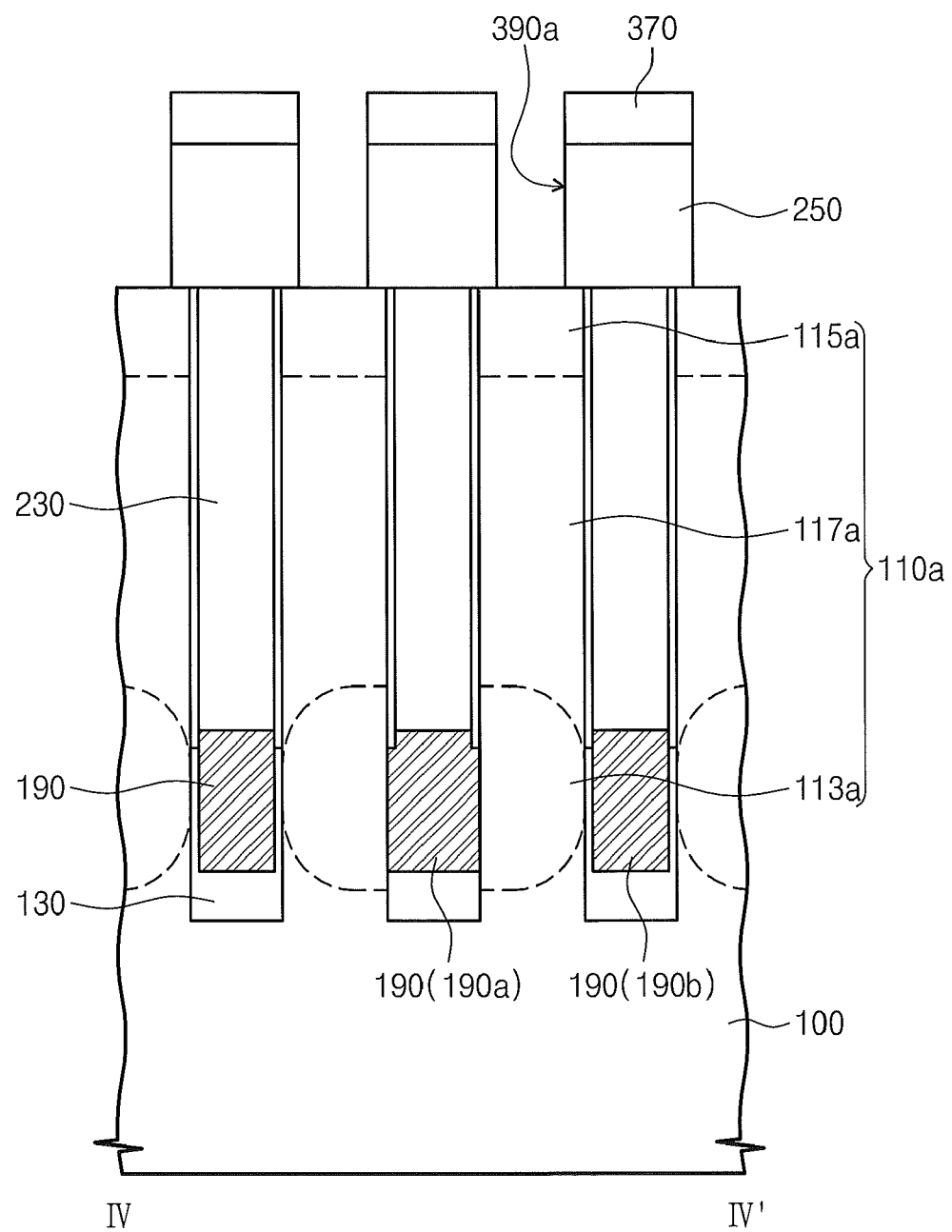
Figure 14A:
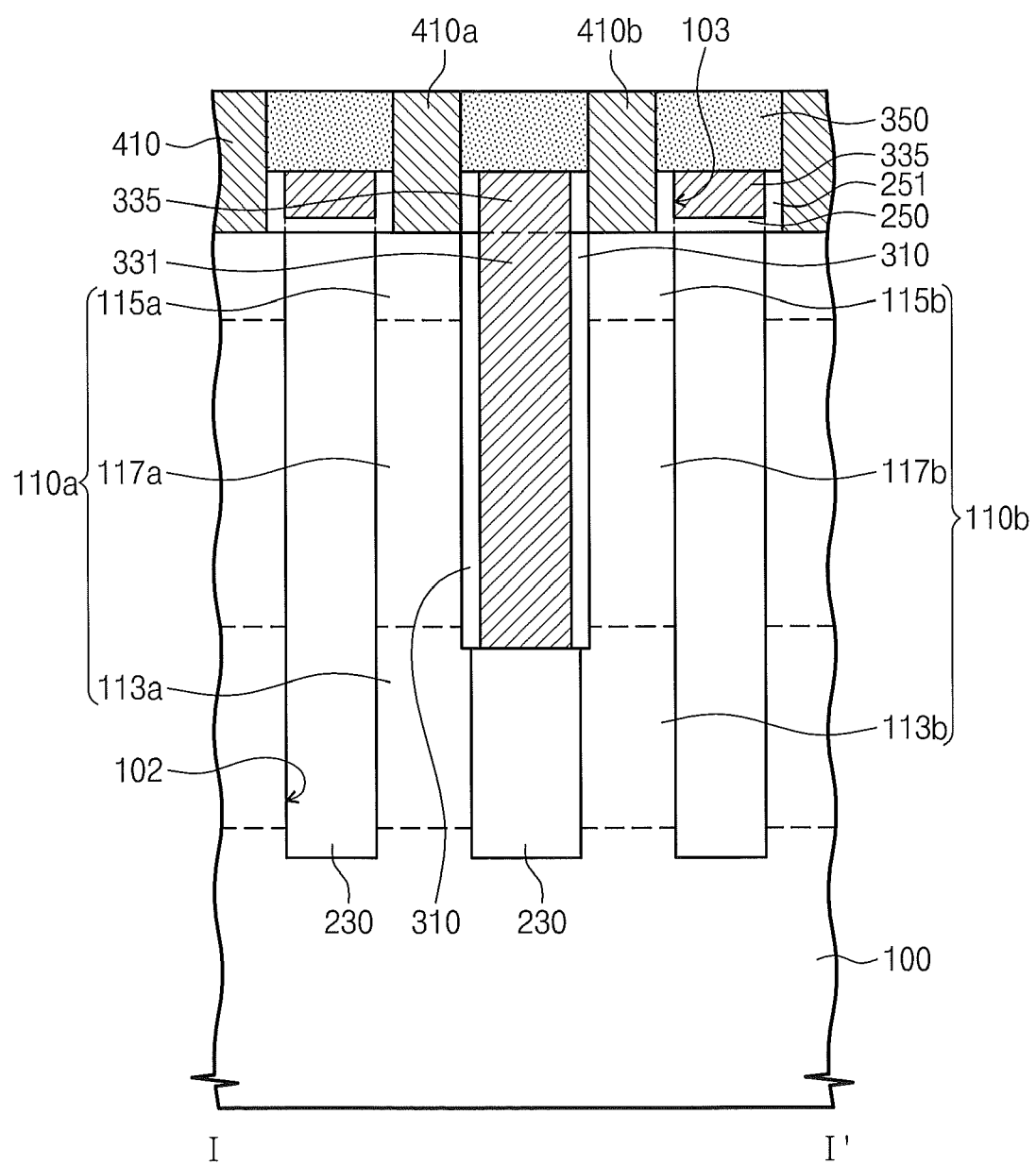
Figure 14B:
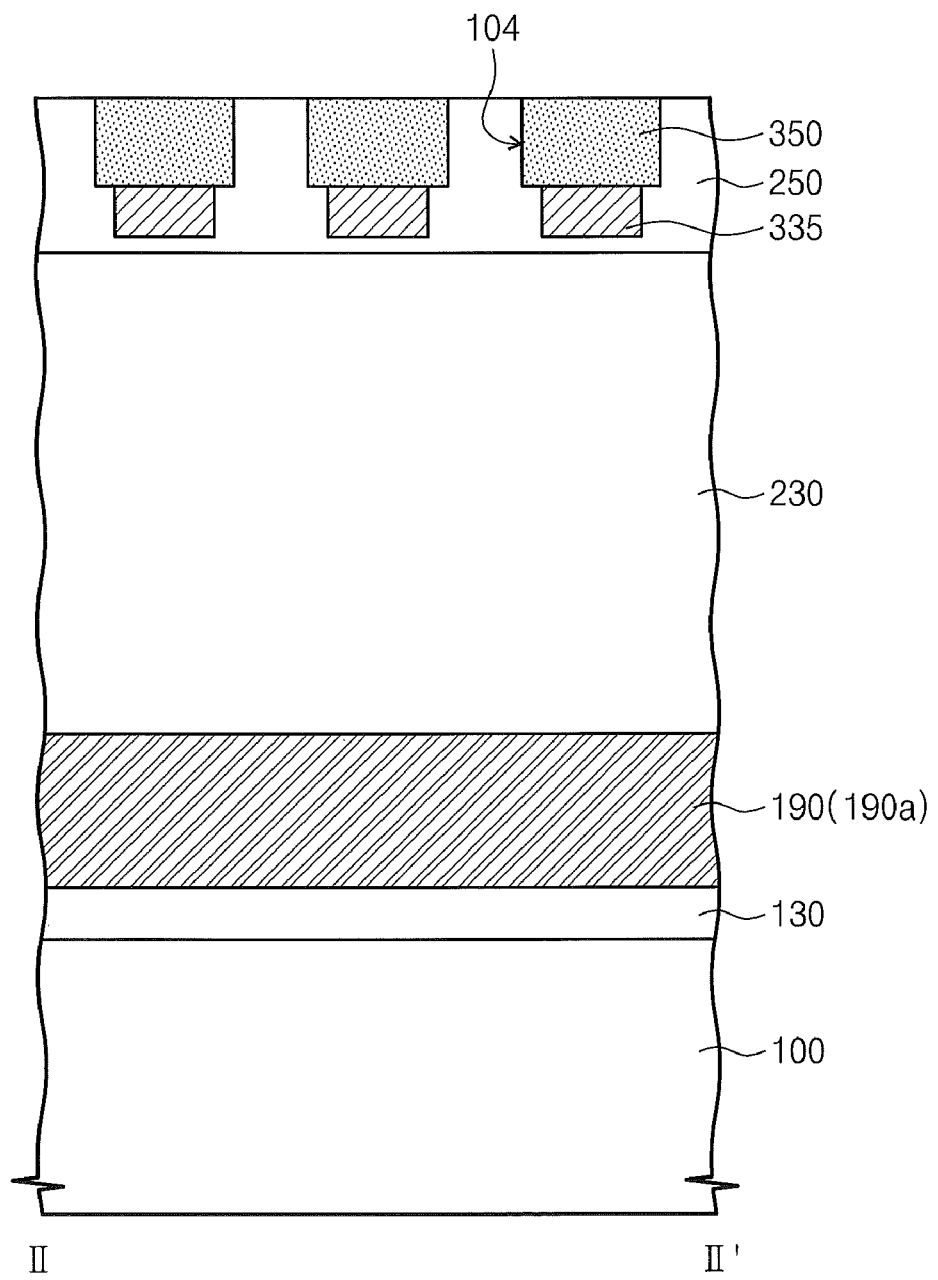
Figure 14C:
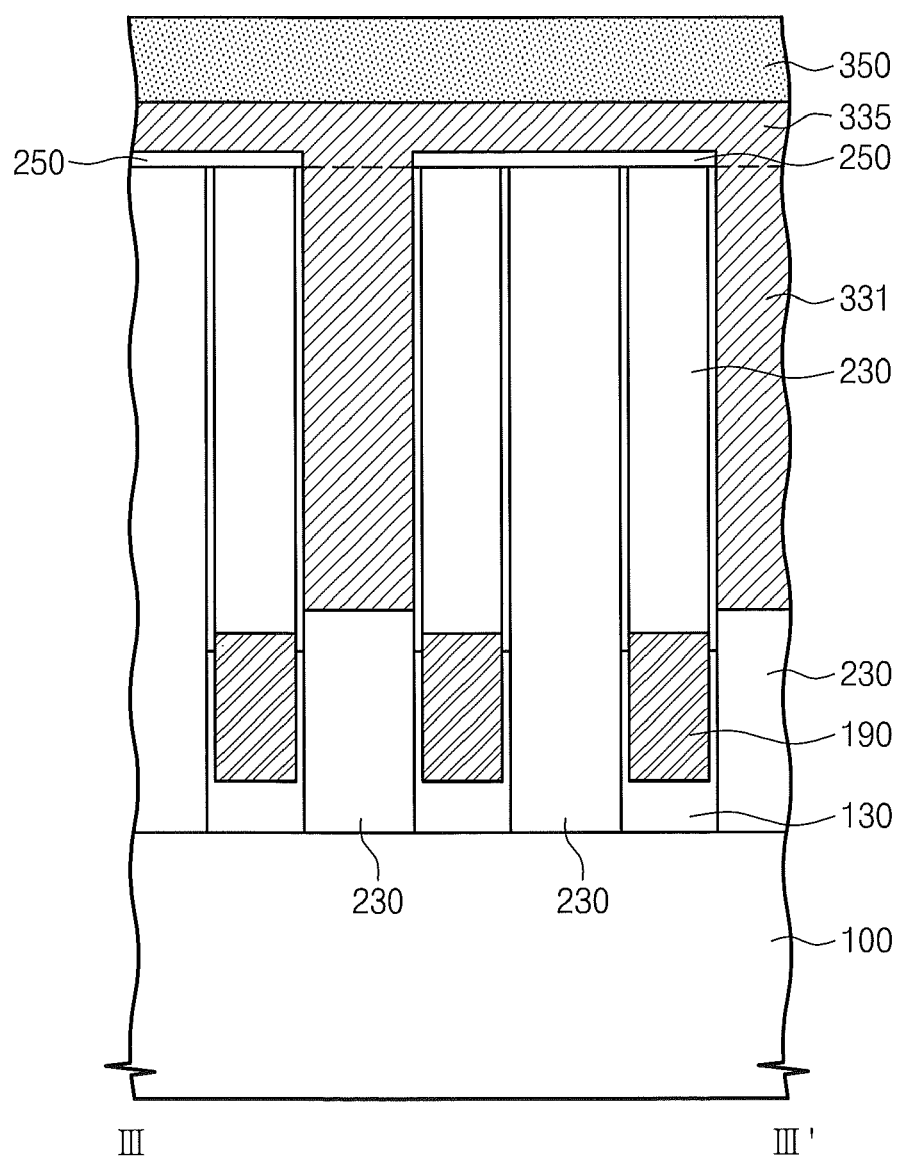
Figure 14D:
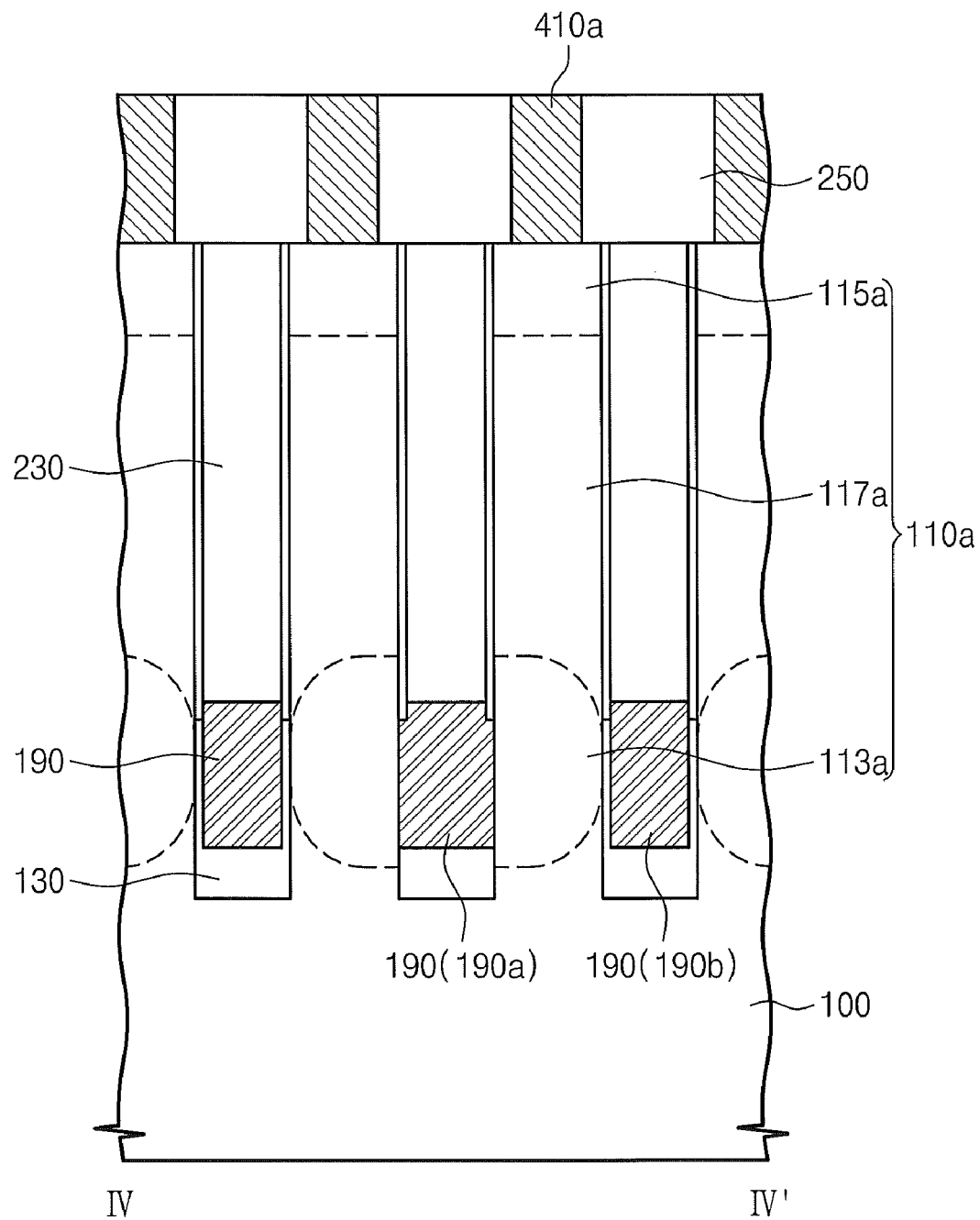
Figure 15A:
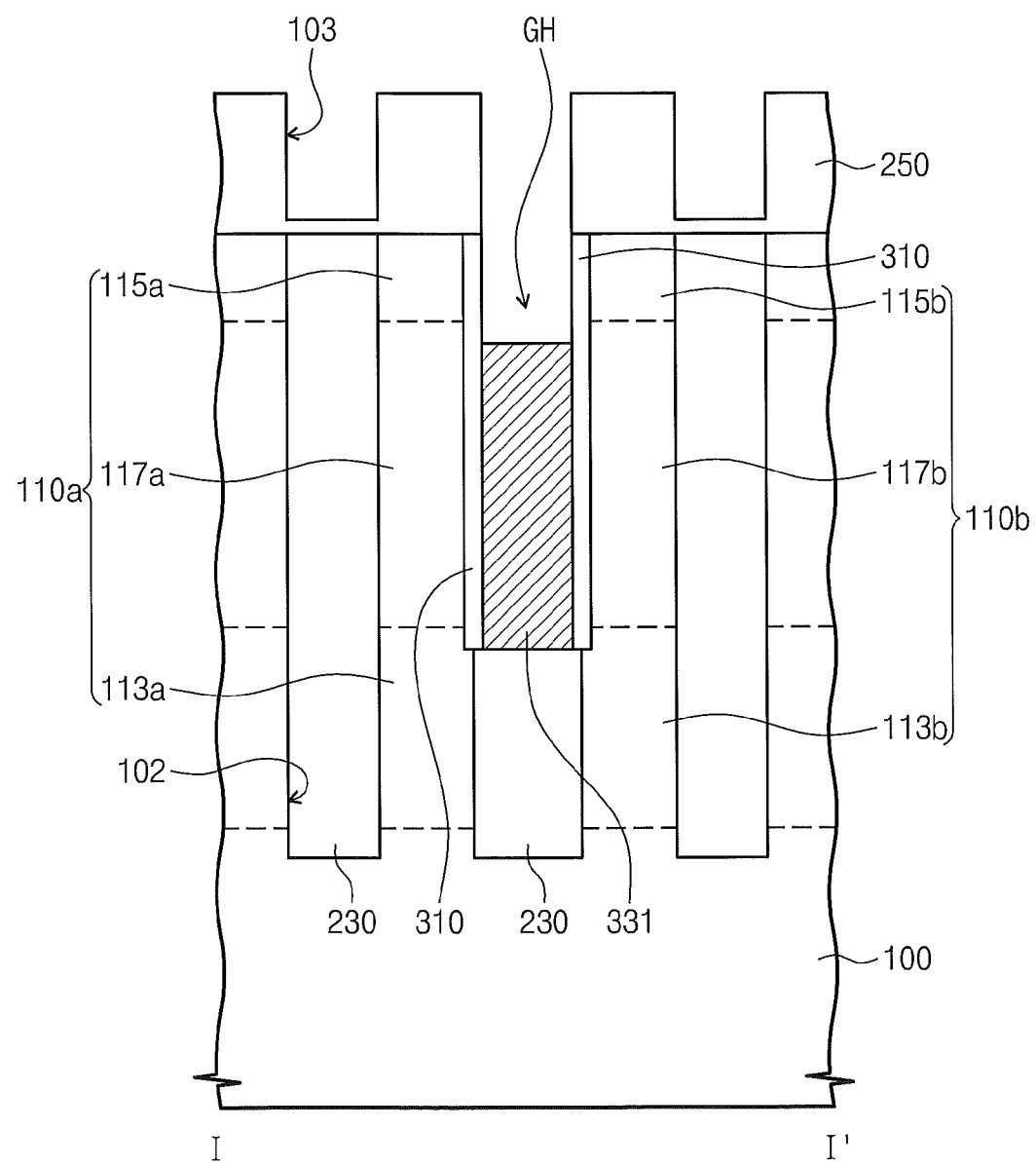
Figure 15B:
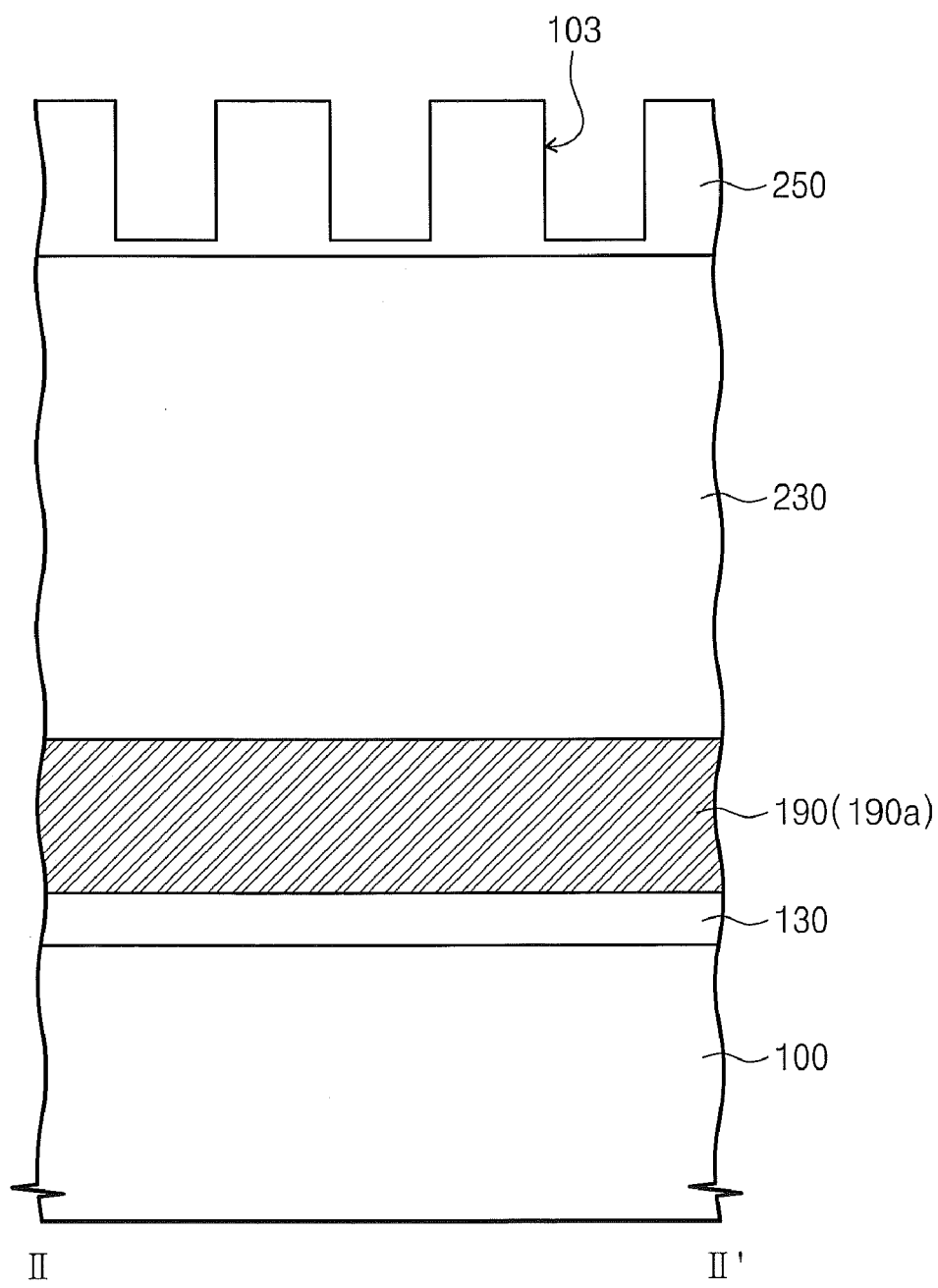
Figure 15C:
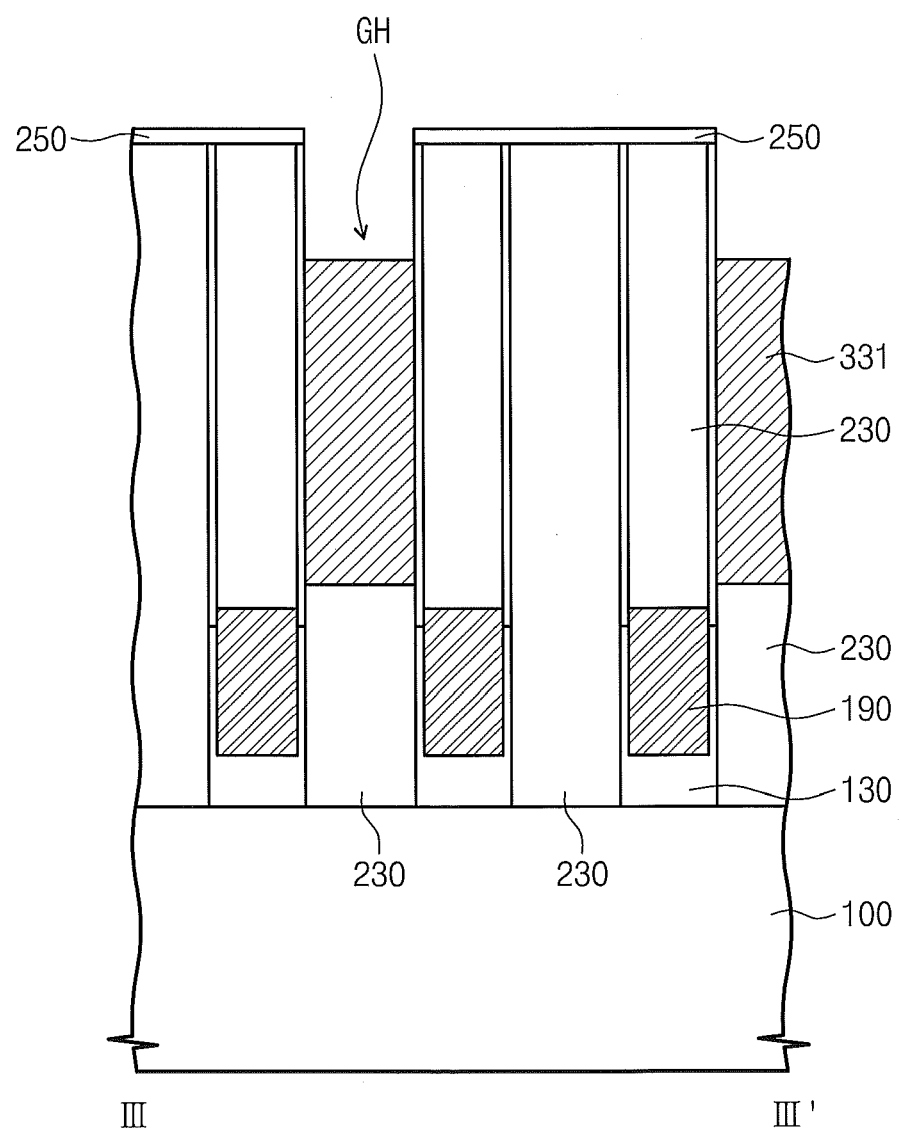
Figure 15D:
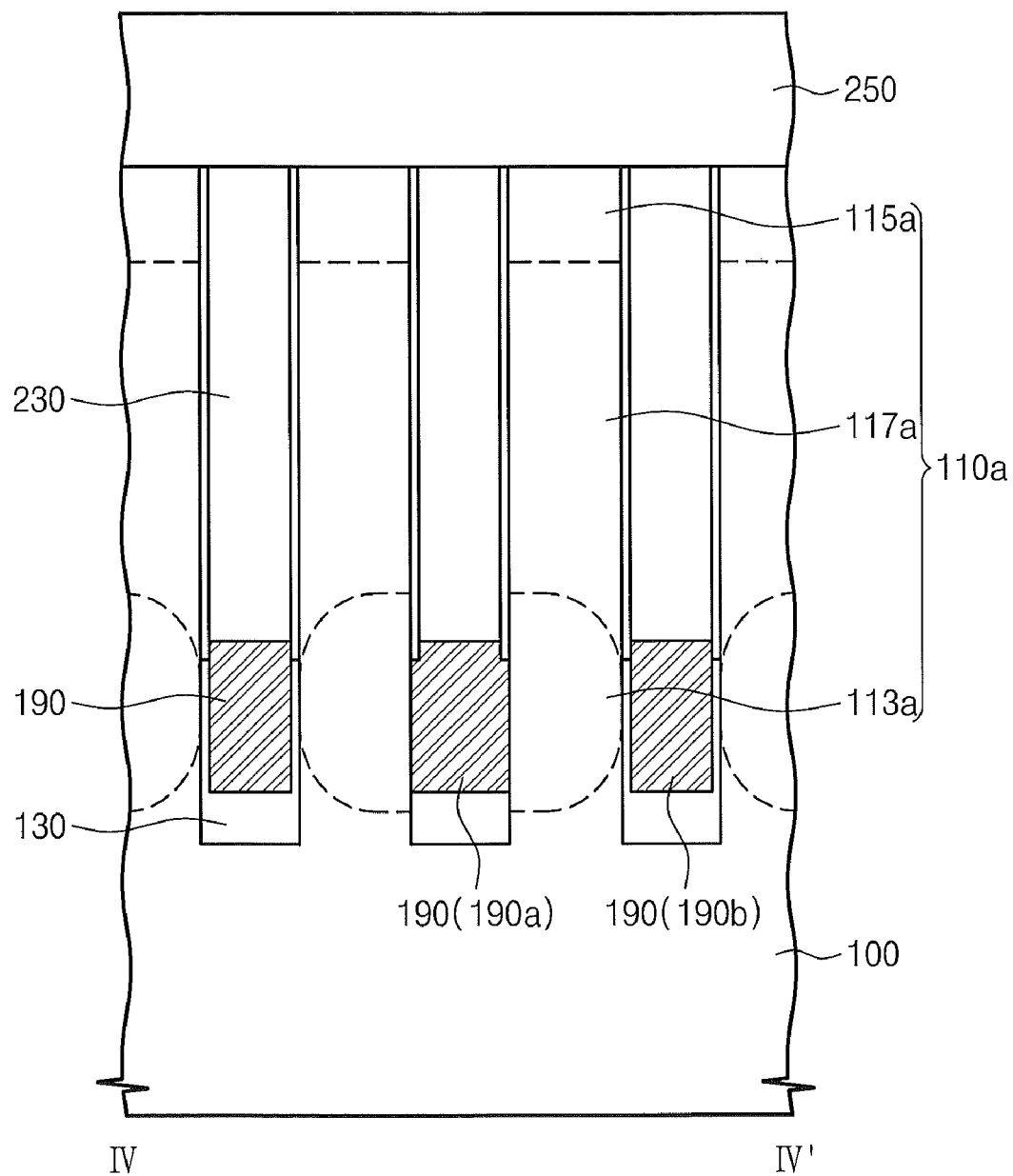
Figure 16A:
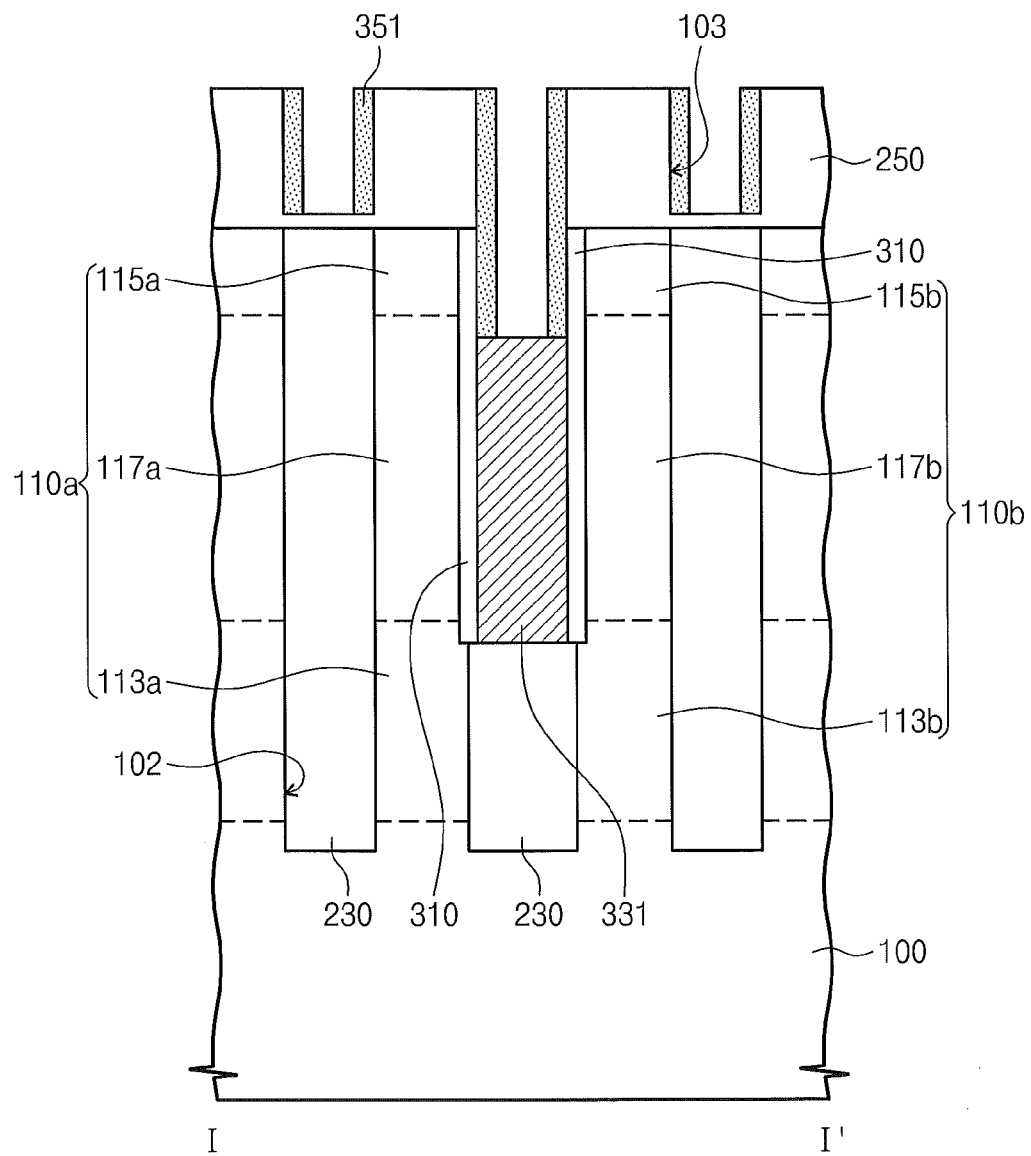
Figure 16B:
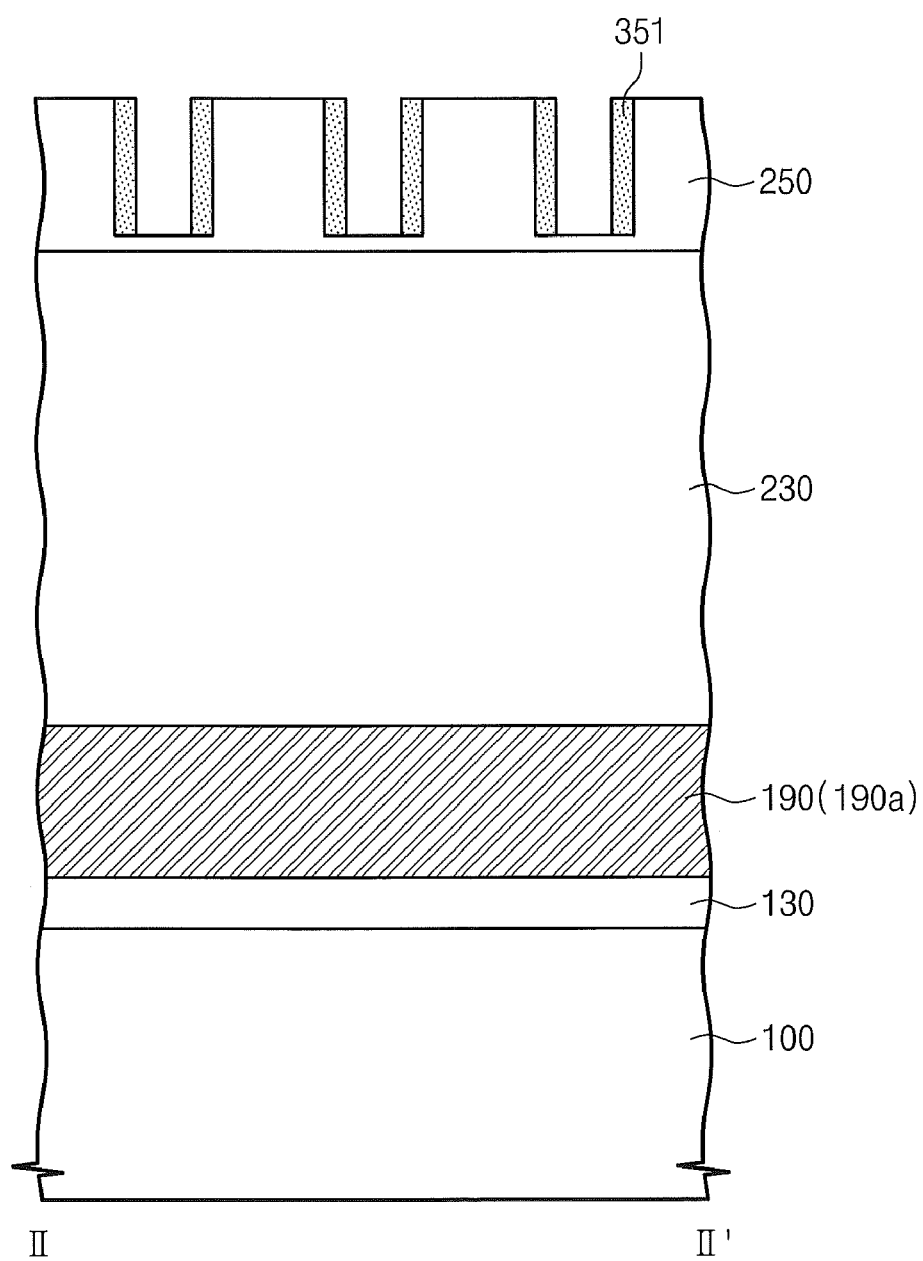
Figure 16C:
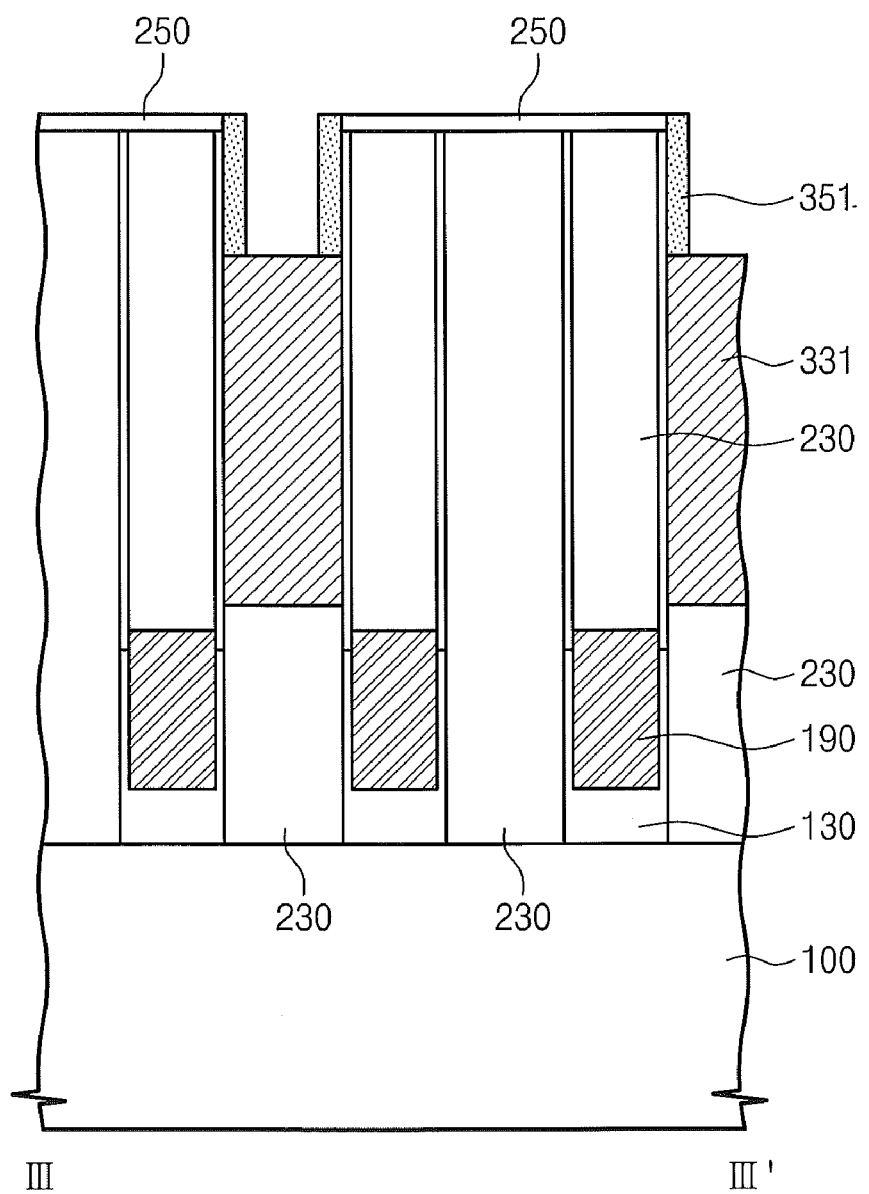
Figure 16D:
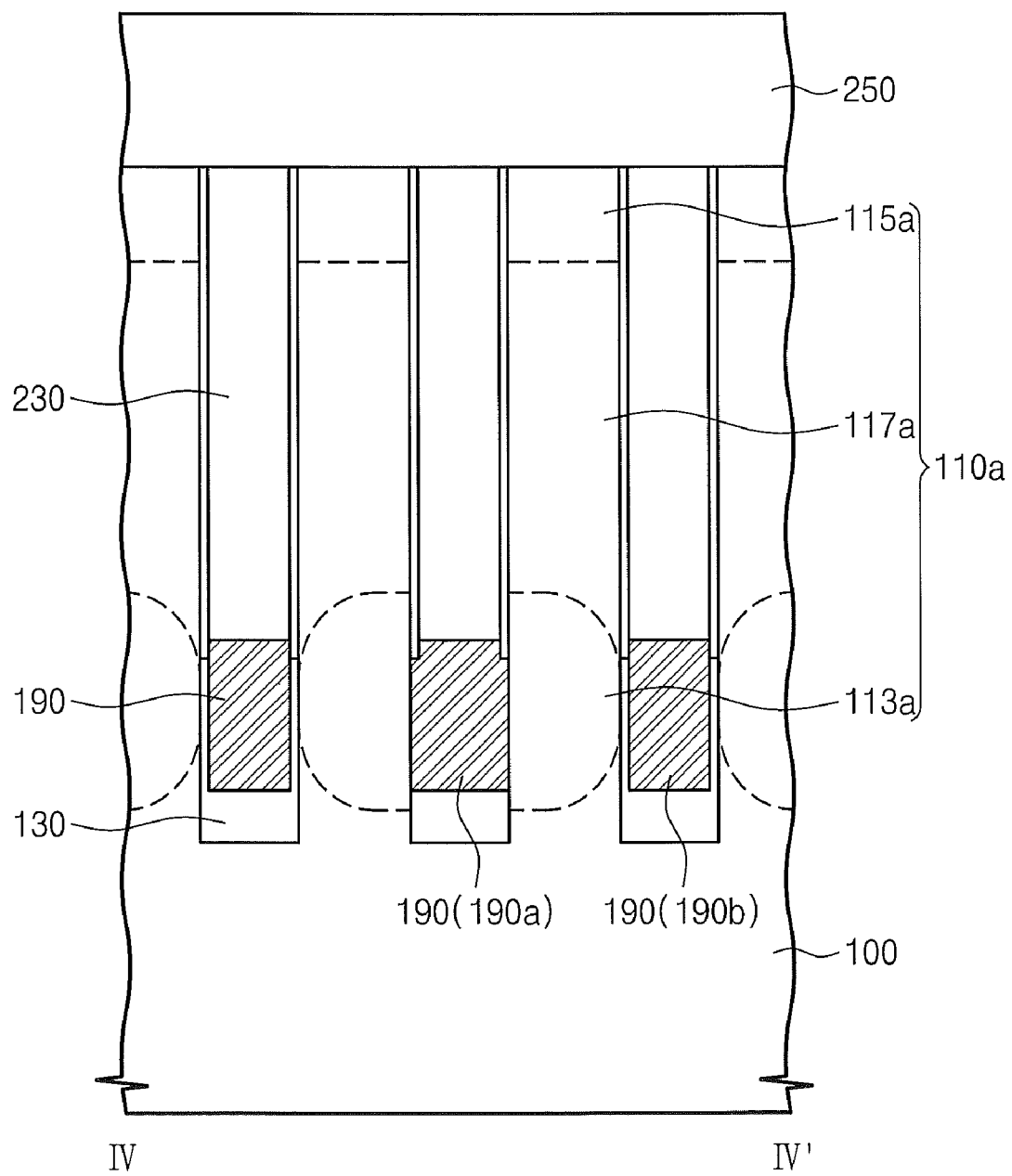
Figure 17A:
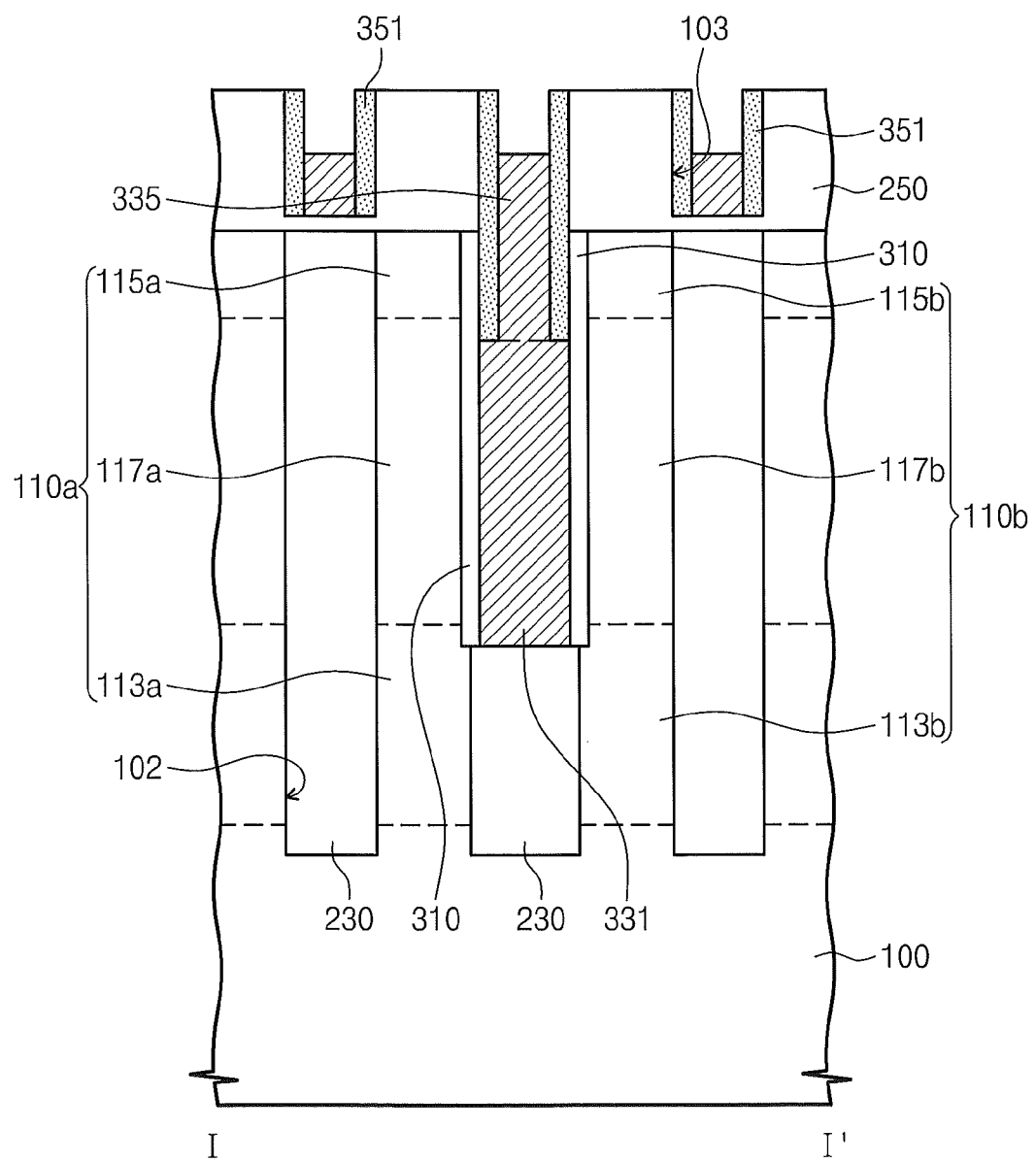
Figure 17B:
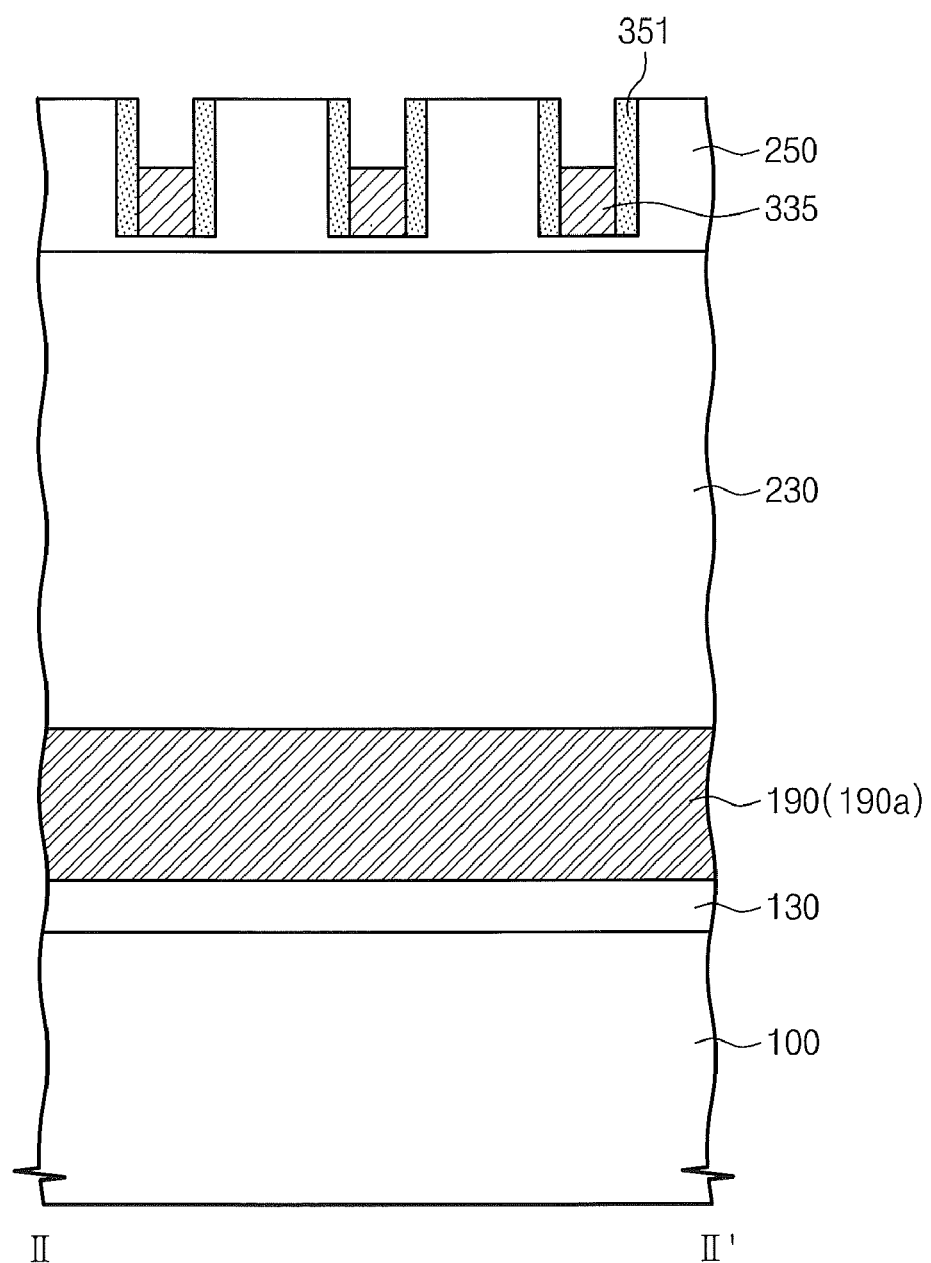
Figure 17C:
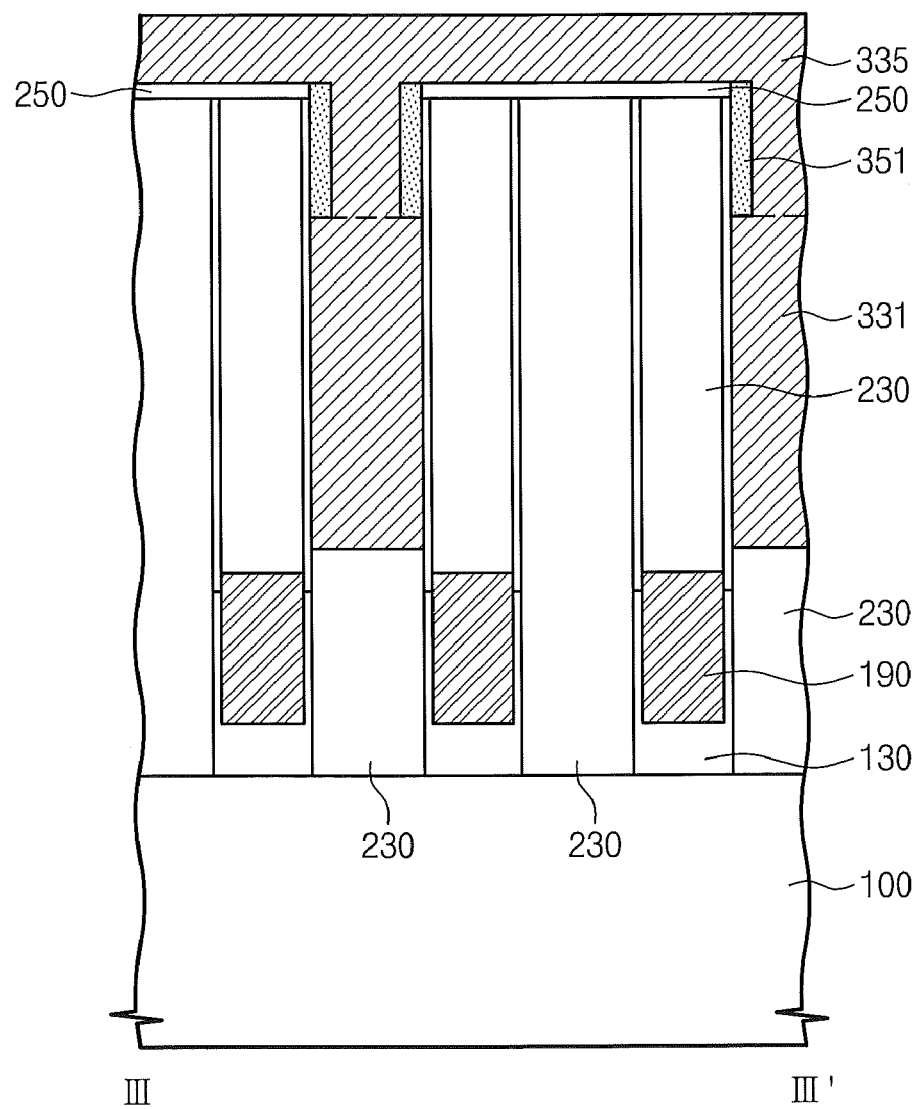
Figure 17D:
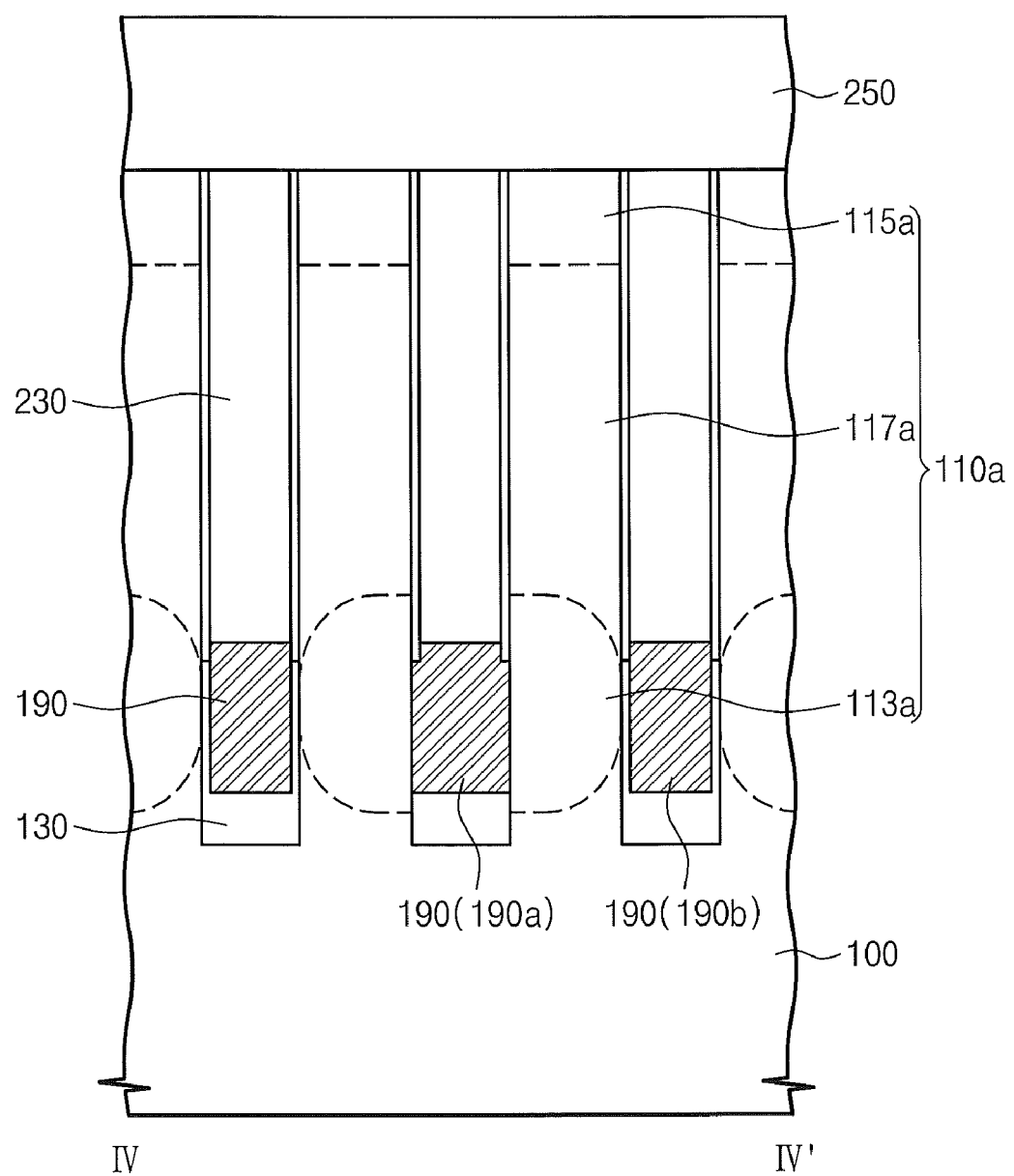
Figure 18A:
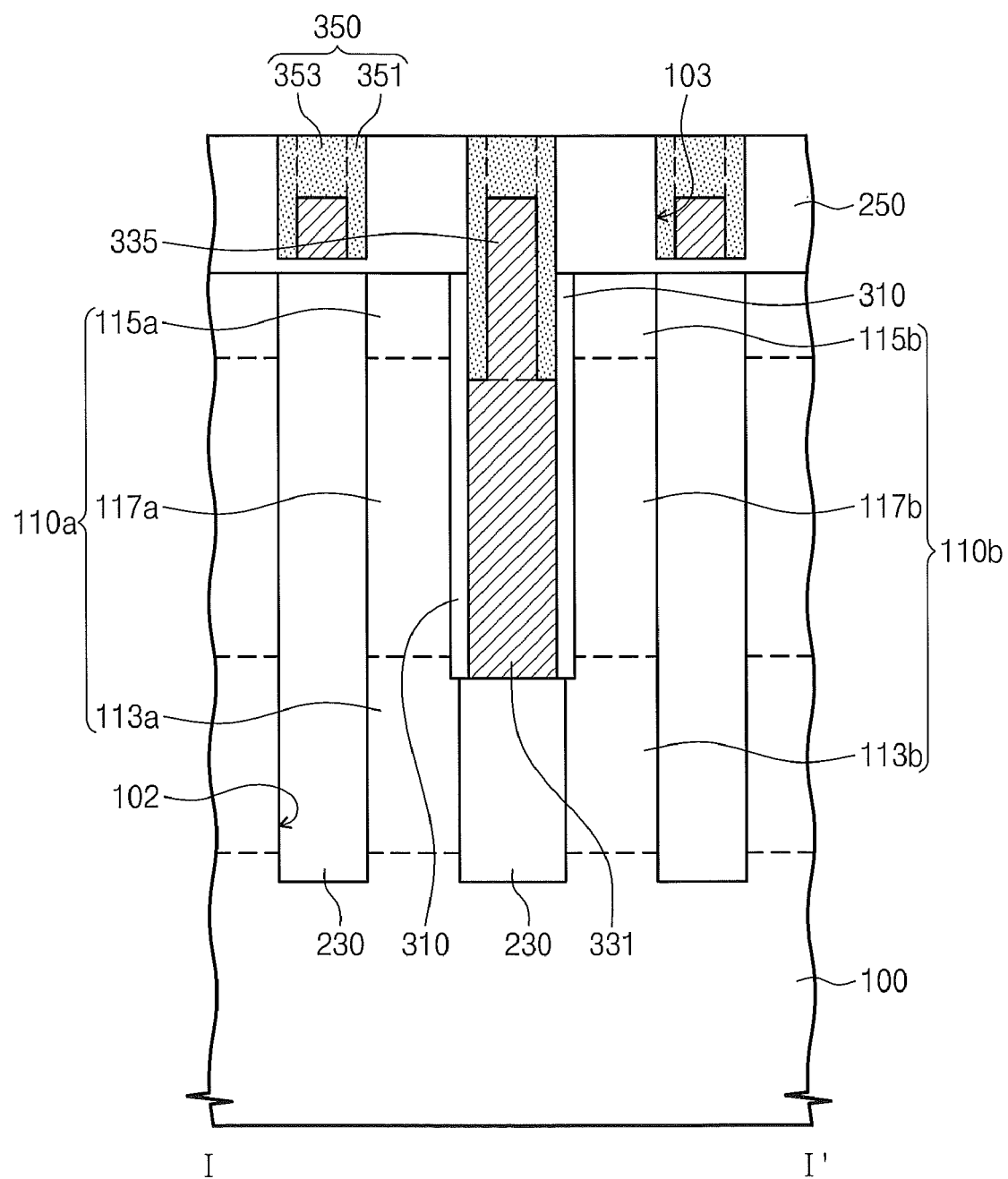
Figure 18B:
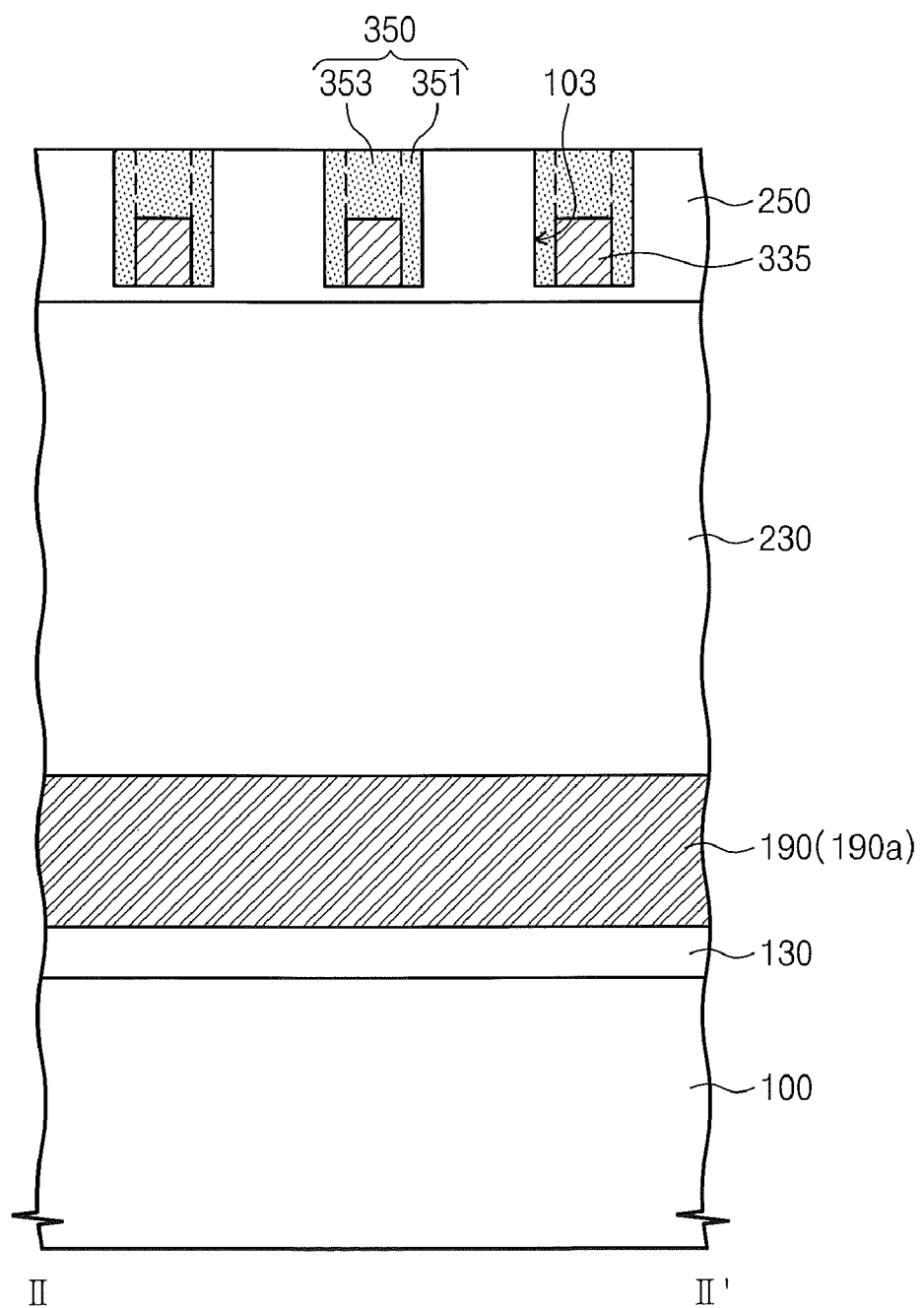
Figure 18C:
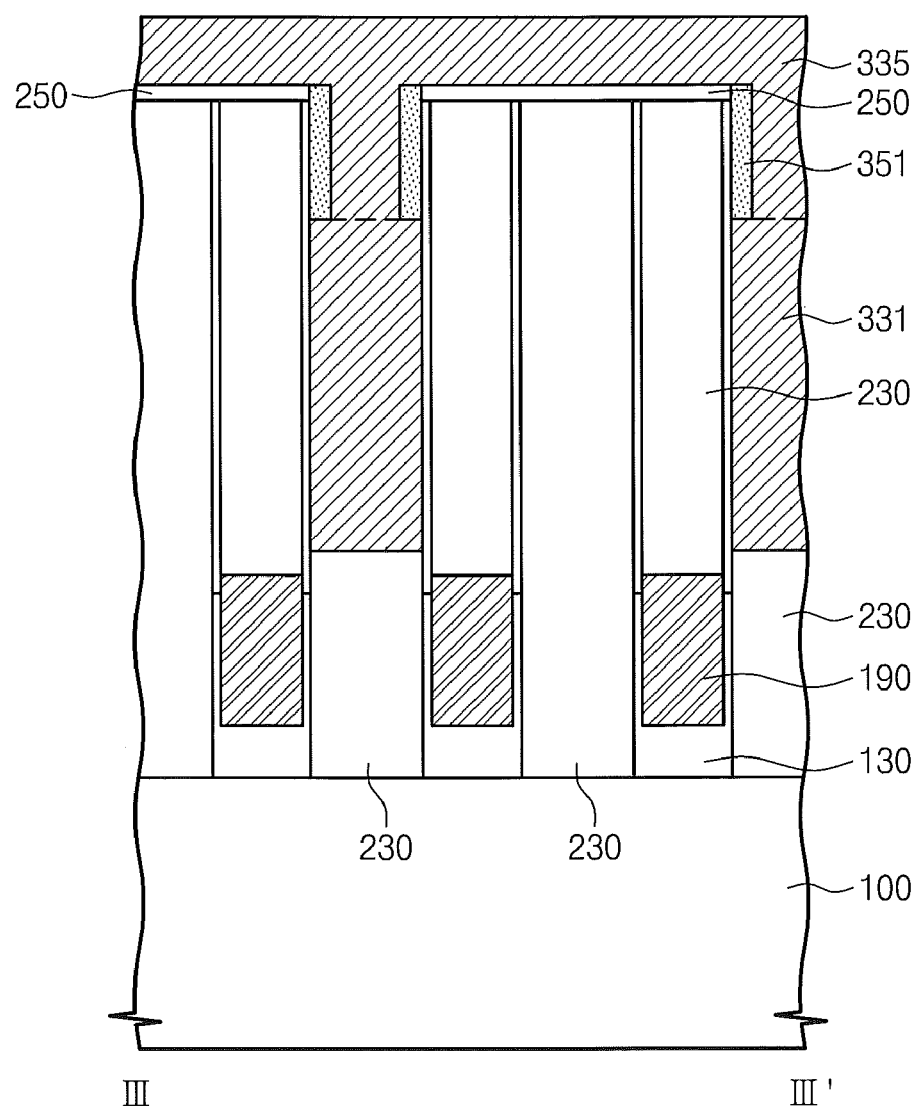
Figure 18D:
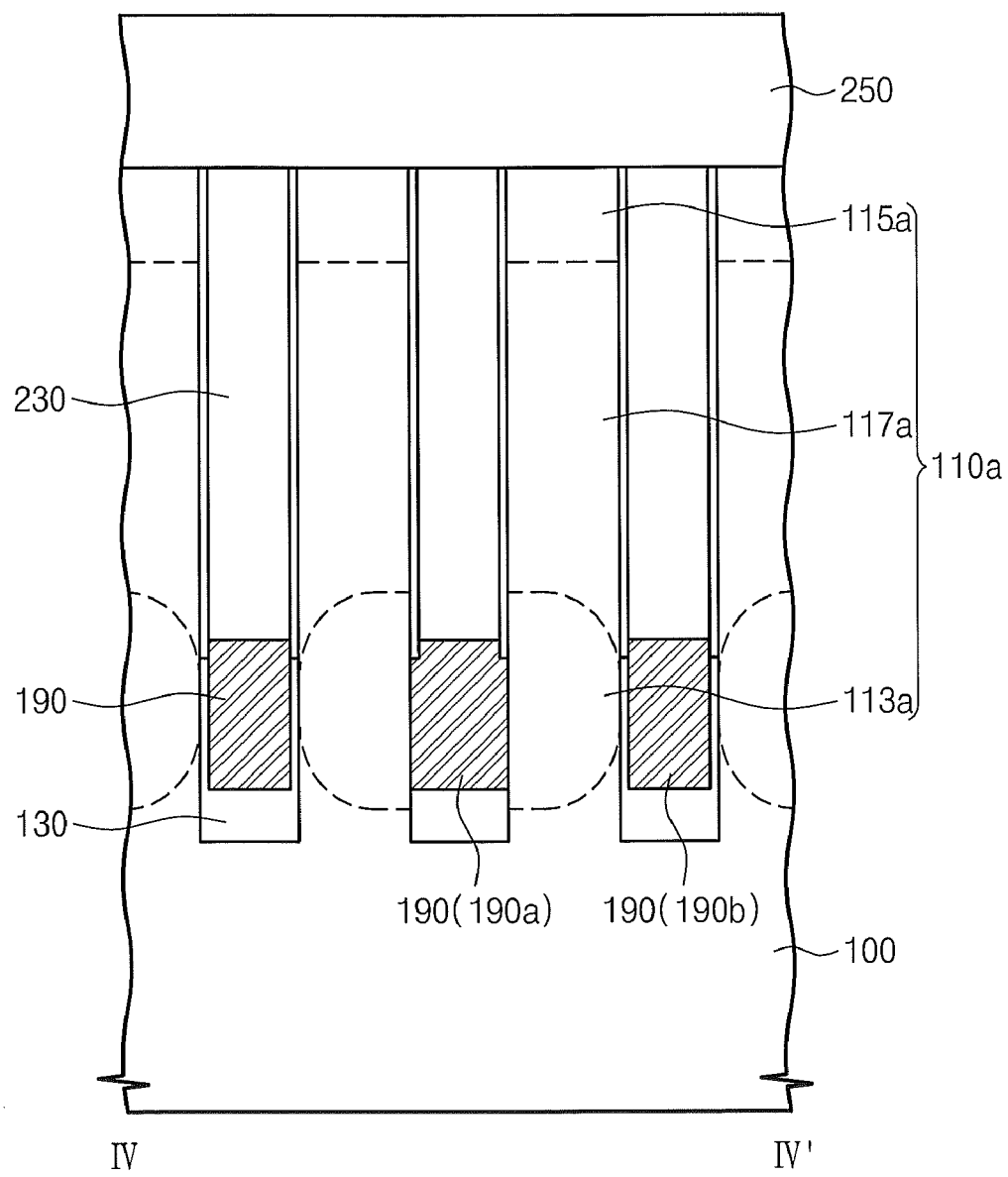
Figure 19A:
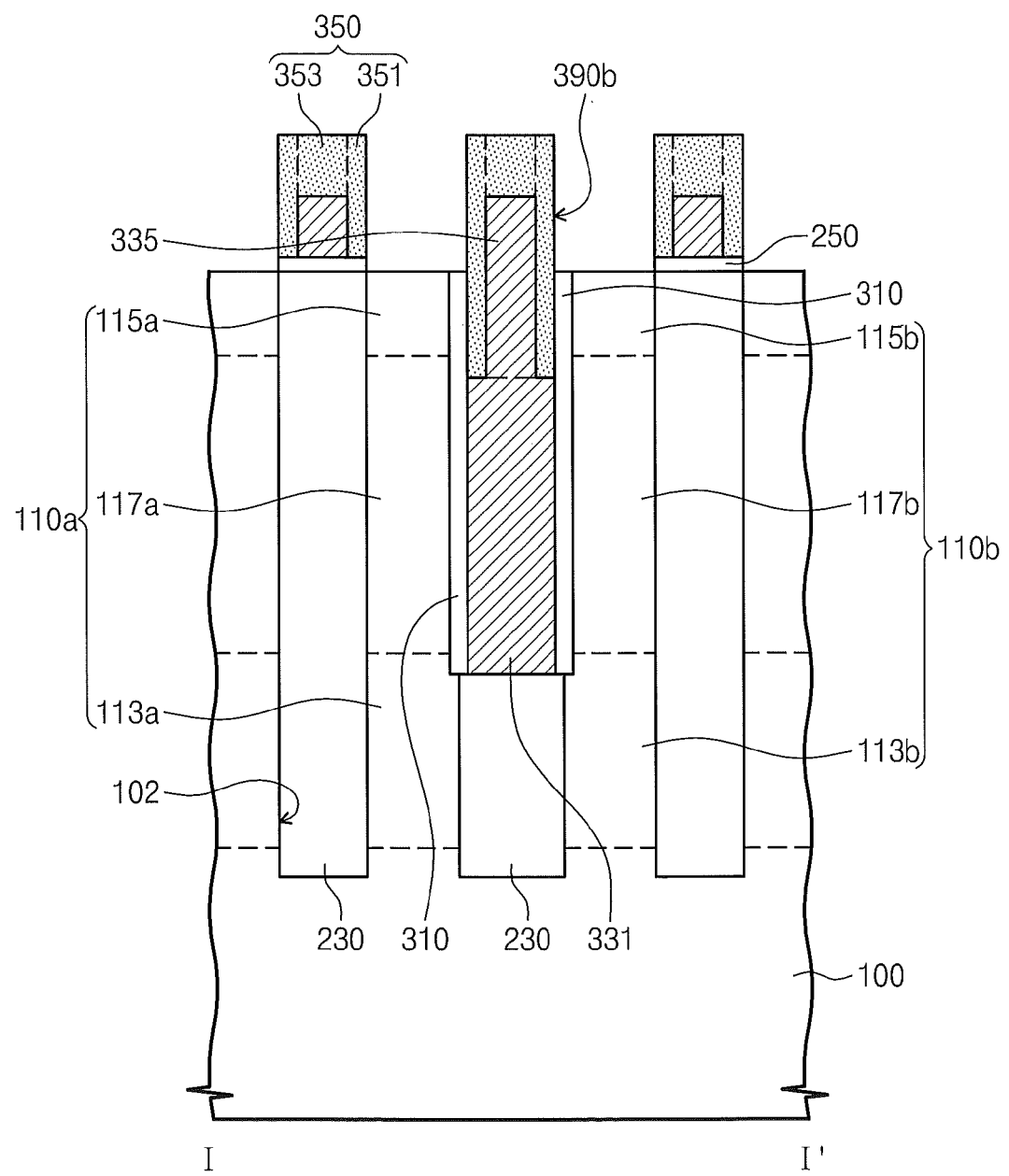
Figure 19B:
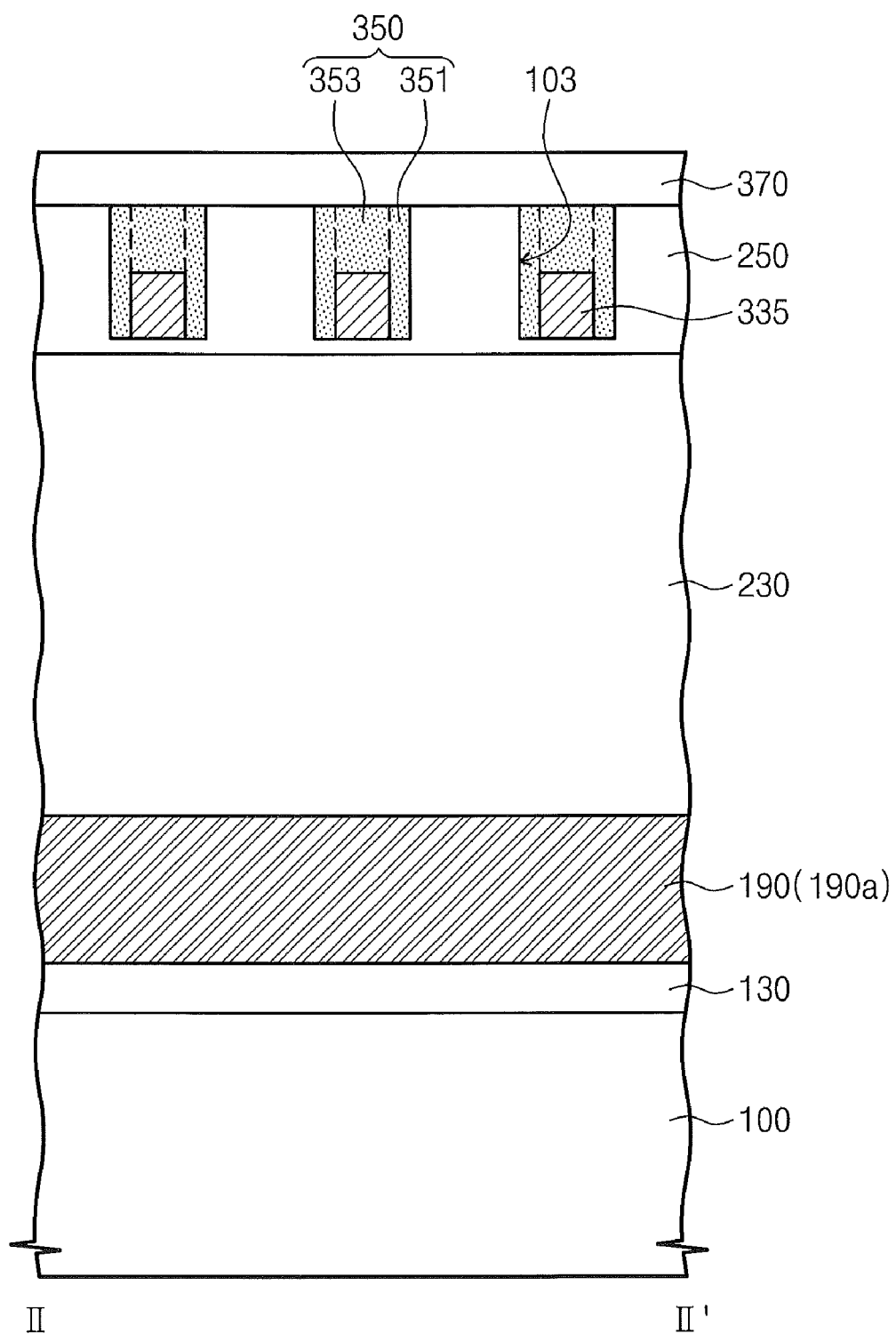
Figure 19C:
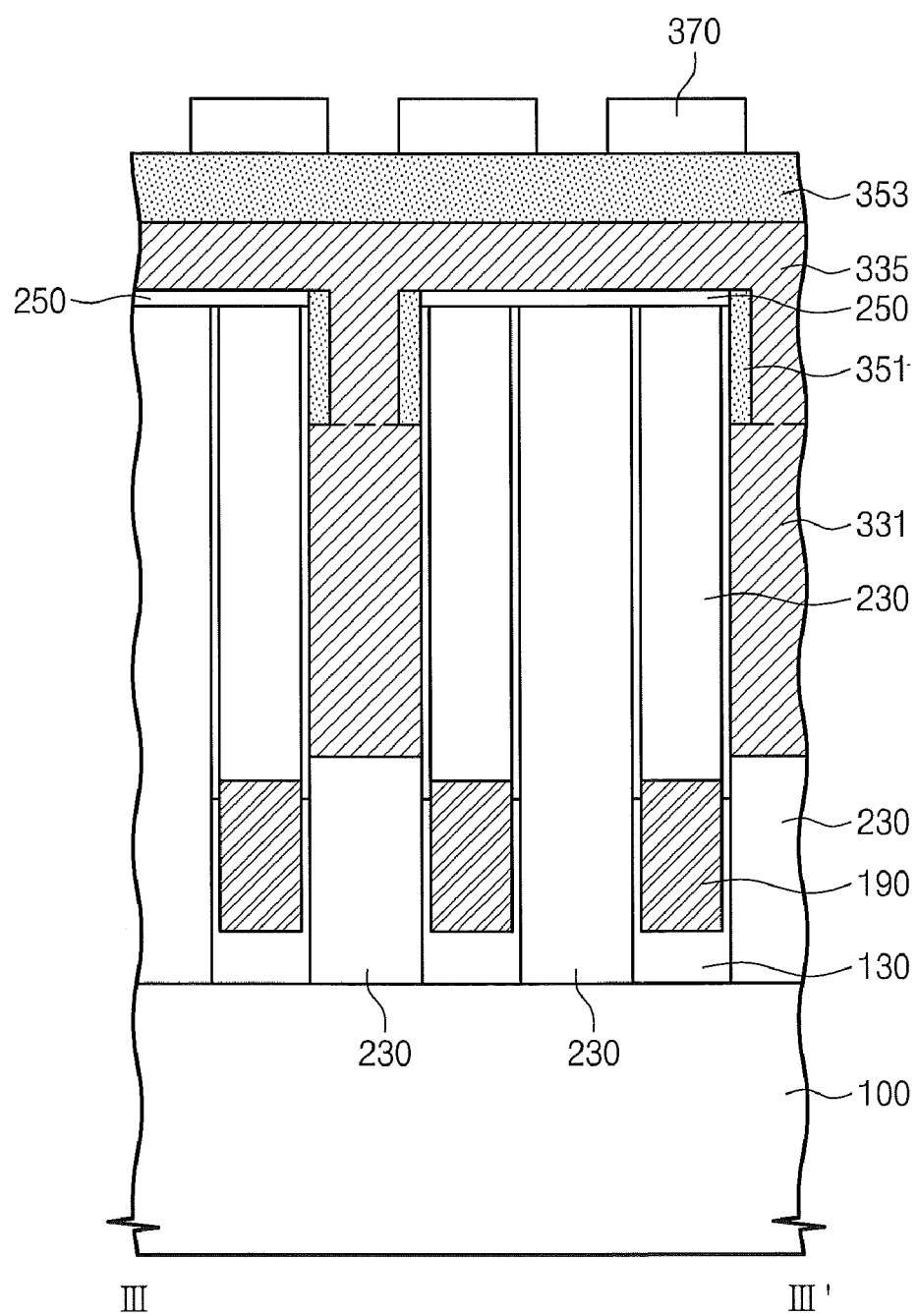
Figure 19D:
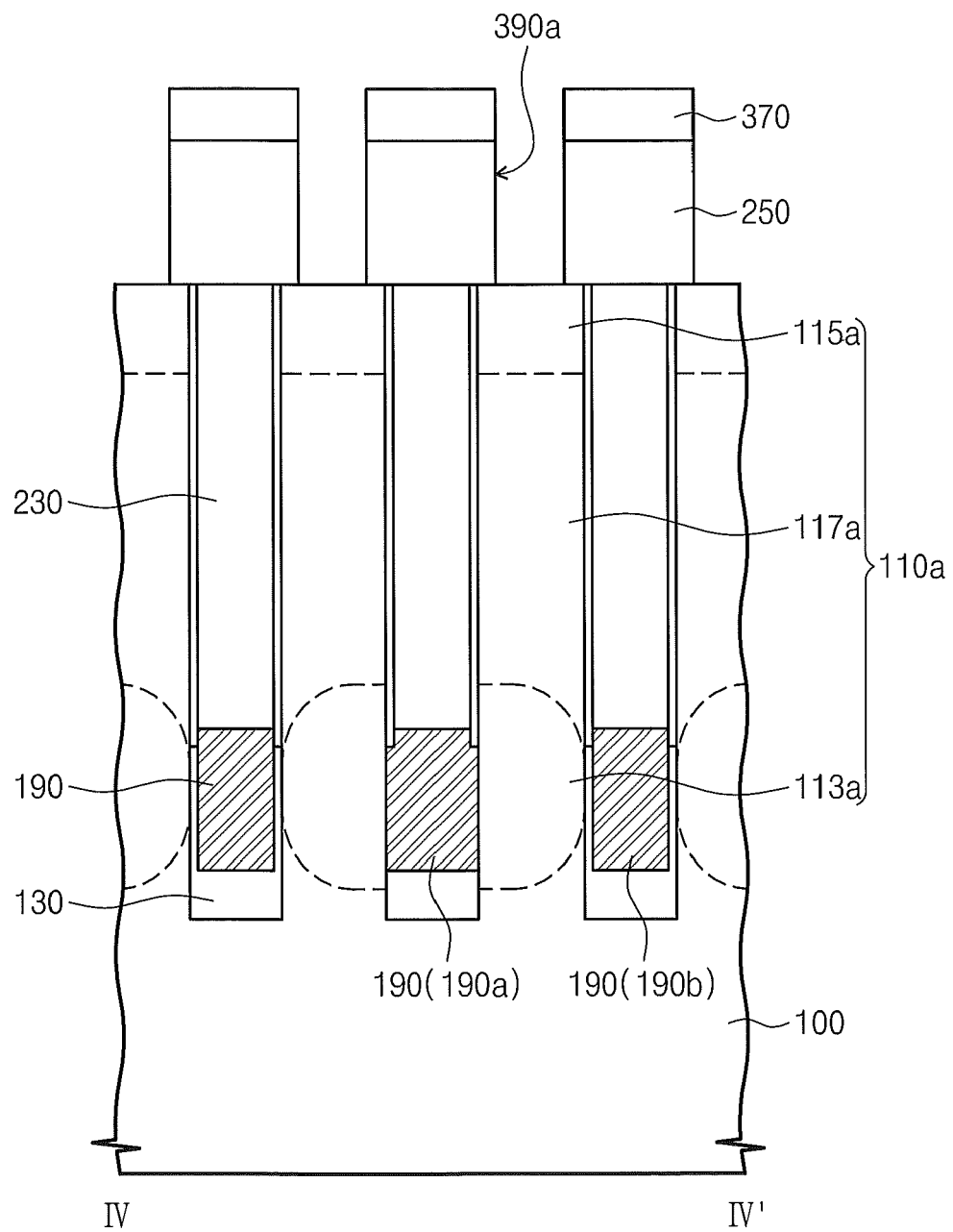
Figure 20A:
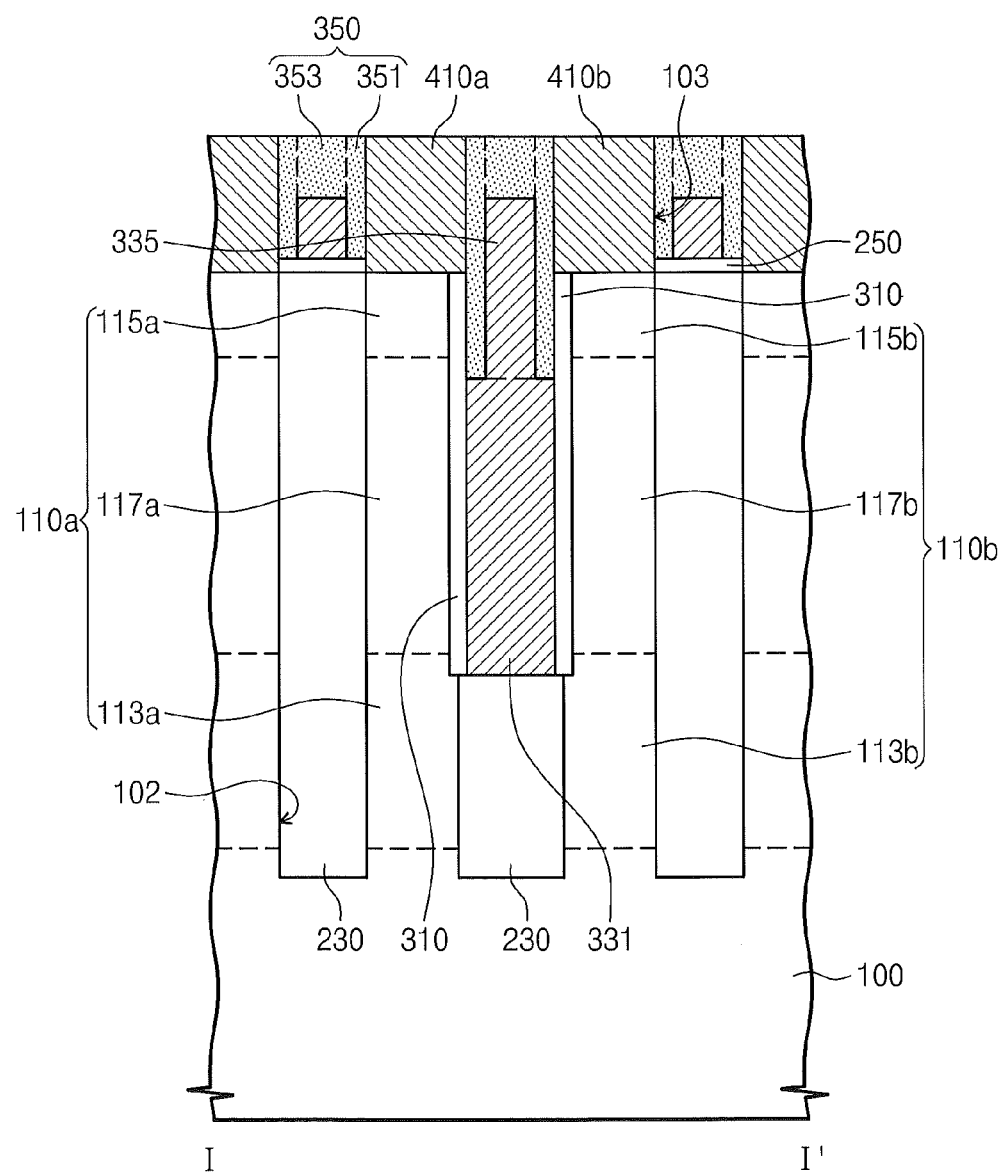
Figure 20B:
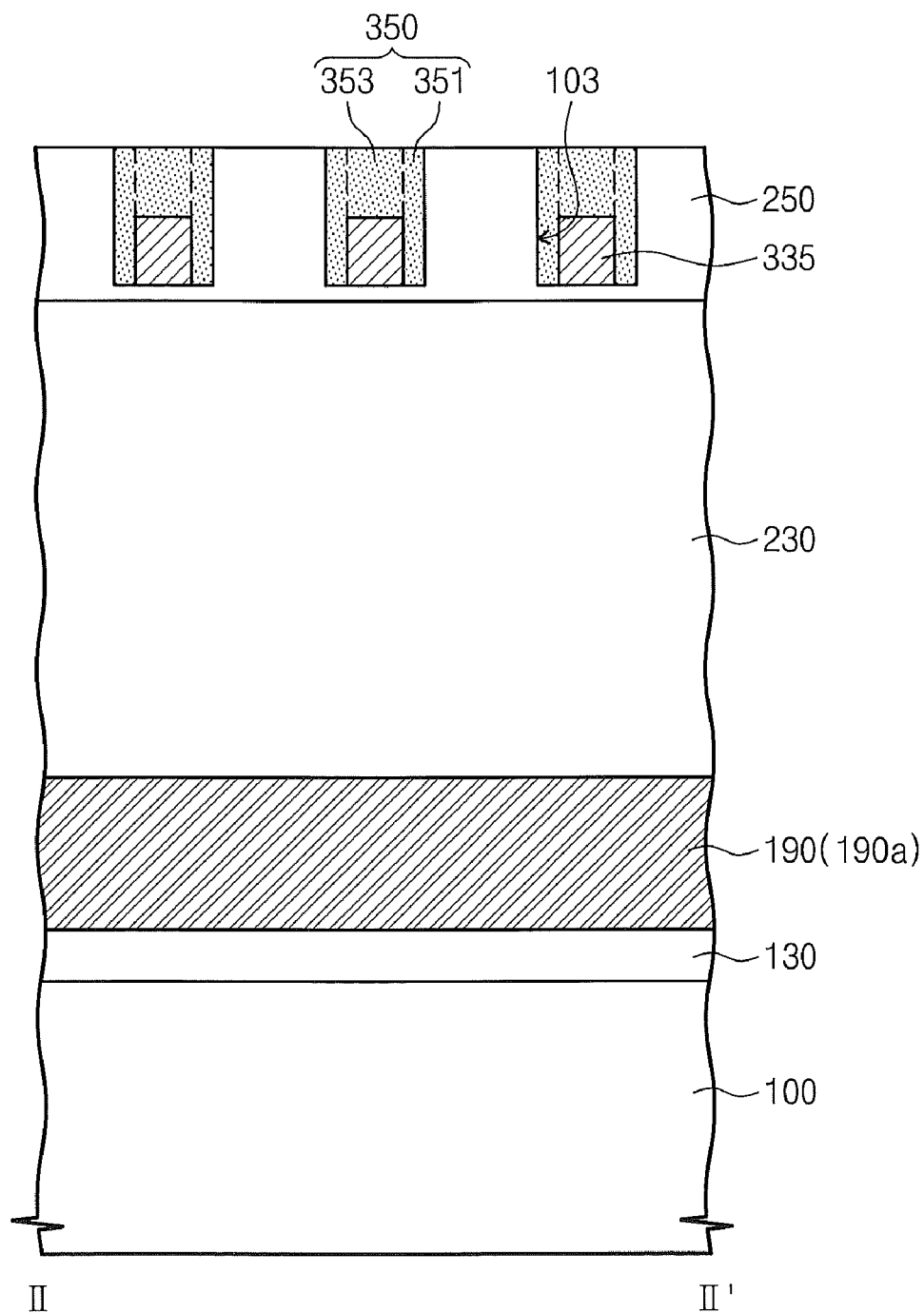
Figure 20C:
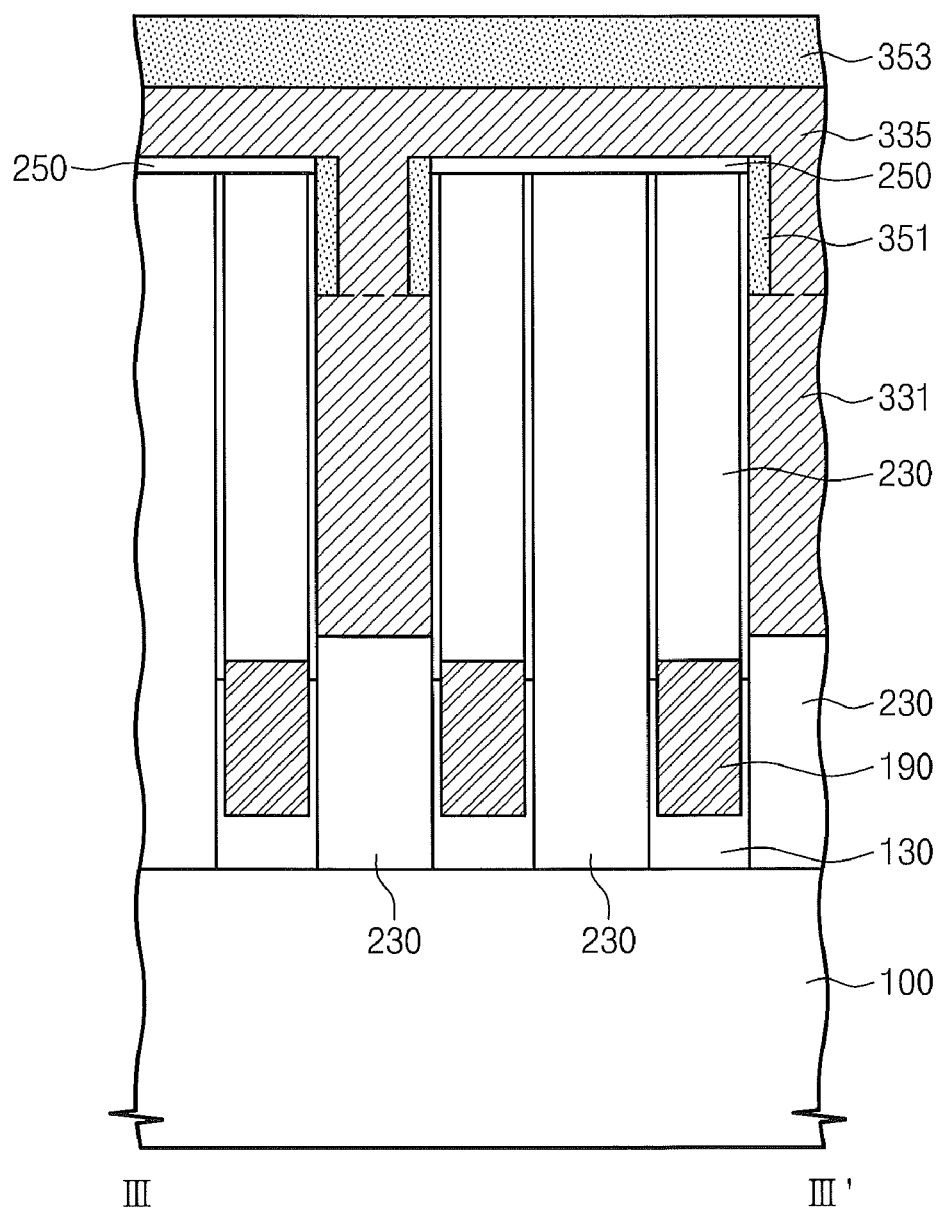
Figure 20D:
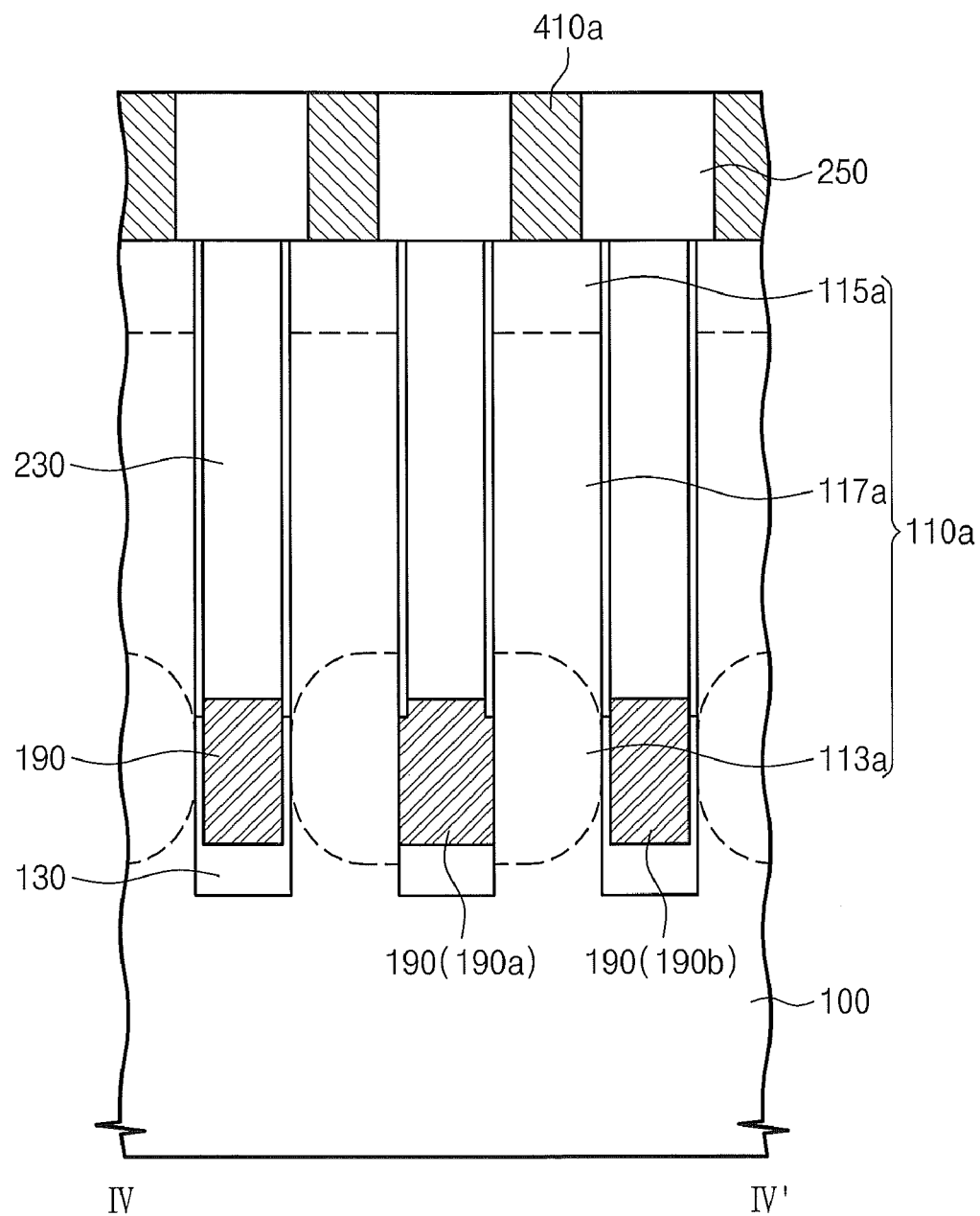

In some embodiments, the grooves 103, as illustrated in FIGS. 7A and 7B, may be formed to have a depth smaller than a thickness of the interlayer insulating film 250. In other embodiments, the grooves 103 may be formed to have a depth equal to or greater than a thickness of the interlayer insulating film 250.

Referring to FIGS. 2, 8A, 8B, 8C and 8D, after removing the first photo mask 270, a second photo mask 290 is formed on the semiconductor substrate 100 including the grooves 103. The second photo mask 290 may be formed to include a plurality of openings. Each of the openings of the second photo mask 290 may be located on an upper portion of the buried insulating film 230 between a pair of active regions 110 adjacent to each other. For example, one of the openings of the second photo mask 290 may be located on an upper portion of the buried insulating film 230 between the first and second active regions 110a and 110b.

The interlayer insulating film 250 and the buried insulating film 230 are etched using the second photo mask 290 as an etching mask to form the plurality of gate electrode holes GH. One of the gate electrode holes GH may be formed between the first and second active regions 110a and 110b. As a result, sidewalls of the first and second active regions 110a and 110b facing each other may be exposed by one of the gate electrode holes GH. The gate electrode holes GH may be formed to have a sufficient depth that can completely exposes sidewalls of the channel bodies, for example, the first and second channel bodies 117a and 117b. Bottom surfaces of the gate electrode holes GH may be formed at a level higher than bottom surfaces of the first and second impurity regions 113a and 113b. As a result, a part of the buried insulating film 230 may remain at lower portions of the gate electrode holes GH.

Referring to FIGS. 2, 9A, 9B, 9C and 9D, after removing the second photo mask 290, gate insulating films 310 are formed on sidewalls of the active regions 110 exposed by the gate electrode holes GH. The gate insulating film 310 may be formed from a thermal oxide film. A gate conductive film 333 filling the grooves 103 and the gate electrode holes GH may be formed on an entire surface of the semiconductor substrate 100 including the gate insulating film 310. The gate conductive film 333 may be formed from conductive material. For example, the gate conductive film 333 may be formed from a metal film and/or a doped polysilicon film.

Referring to FIGS. 2, 10A, 10B, 10C and 10D, the gate conductive film 333 is etched back to recess the gate conductive film 333 so that a top surface of the gate conductive film 333 is lower than a top surface of the interlayer insulating film 250. As a result, gate electrodes 331 may be formed in the gate electrode hole GH surrounded by the gate insulating film 310 and upper interconnections 335 may be formed in the grooves 103.

Referring to FIGS. 2, 11A, 11B, 11C and 11D, after forming the upper interconnections 335, the interlayer insulating film 250 may be isotropically etched. As a result, extended grooves 104 may be formed on the upper interconnections 335. The extended grooves 104 may be self aligned with the upper interconnections 335 and may be formed to have a width greater than that of the upper interconnection 335.

Referring to FIGS. 2, 12A, 12B, 12C and 12D, a protective film filling the extended grooves 104 is formed on the semiconductor substrate 100 including the extended grooves 104. The protective film is planarized down to a top surface of the interlayer insulating film 250 to form protective film patterns 350 in the extended grooves 104. The protective film may be formed from a material film having an etching selectivity with respect to the interlayer insulating film 250. For example, in the case that the interlayer insulating film 250 is formed from a silicon oxide film, the protective film may be formed from a silicon nitride film.

Accordingly, FIGS. 12A-12D illustrate various embodiments described herein that form a protective film pattern 350 on the upper interconnection 335 that is wider than the upper interconnection 335, using the gate electrode hole GH as a template for forming the protective film pattern 335. FIGS. 11A-11D illustrate that the protective film pattern 350 may be formed by widening the gate electrode hole GH in the interlayer insulating film 250, and FIGS. 12A-12D illustrate forming the protective film pattern 350 in the gate electrode hole that was widened.

Referring to FIGS. 2, 13A, 13B, 13C and 13D, a third photo mask 370 is formed on the semiconductor substrate 100 including the protective film pattern 350. The third photo mask 370 may be formed to have a plurality of openings having a line shape crossing upper portions of the upper interconnections 335. The openings of the third photo mask 370 may be formed to overlap the active regions.

The interlayer insulating films 250 may be anisotropically etched using the third photo mask 370 as an etching mask to form buried contact holes 390 exposing top surfaces of the active regions 110. During a formation of the buried contact holes 390, the protective film patterns 350 may function as an etch-stop film. This is because the protective film patterns 350 are formed from a material film having an etching selectivity with respect to the interlayer insulating film 250. As a result, the buried contact holes 390 may be self aligned to the protective film patterns 350. The buried contact holes 390 may include first and second contact holes 390a and 390b exposing the first upper impurity region 115a and the second upper impurity region 115b respectively. Accordingly, FIGS. 13A-13D illustrate etching the interlayer insulating film 250 using the protective film pattern 350 as an etch mask to define first and second buried contact holes 390a, 390b that expose the respective first and second active regions 110a, 110b.

After forming the buried contact holes 390, a part of the interlayer insulating film 250 may remain between sidewalls of the upper interconnections 335 and the buried contact holes 390. That is, an insulating spacer 251 constituted by the interlayer insulating film 250 may be formed on sidewalls of the upper interconnections 335. Accordingly, FIGS. 13A-13D also illustrate that etching the interlayer insulating film 250 comprises etching the interlayer insulating film 350 using the protective film pattern 350 as an etch mask, such that the interlayer insulating film 251 remains on the sidewall of the upper interconnection 335 between the protective film 350 and the insulating region 230.

Referring to FIGS. 2, 14A, 14B, 14C and 14D, after removing the third photo mask 370, a conductive film filling the buried contact holes 390 is formed. The conductive film is planarized down to top surfaces of the protective film patterns 350 to form buried contact electrodes 410 in the buried contact holes 390. The buried contact electrodes 410 may include first and second buried contact electrodes 410a and 410b filling the first and second buried contact holes 390a and 390b respectively. A misalignment between the buried contact electrodes 410 and the active regions 110 may be reduced, minimized or eliminated by the protective film patterns 350. For example, a misalignment between the first buried contact electrodes 410a and the first upper impurity region 115a may be reduced, minimized or eliminated by the protective film patterns 350. Similarly, a misalignment between the second buried contact electrodes 410b and the second upper impurity region 115b may be reduced, minimized or eliminated by the protective film patterns 350. Accordingly, FIGS. 14A-14D illustrate forming first and second buried contact electrodes 410a, 410b in the interlayer insulating film 250, that contact the respective first and second active regions 110a, 110b using the protective film pattern 350 as a template for forming the first and second buried contact electrodes 410a, 410b.

Although not illustrated in FIGS. 14A, 14B, 14C and 14D, a plurality of memory storage substances may be formed on the semiconductor substrate 100 including the buried contact electrodes 410. The memory storage substances may be formed to include the first and second memory storage substances 430a and 430b illustrated in FIGS. 3A through 3D. A first terminal of the first memory storage substance 430a may be formed to electrically connected to the first buried contact electrode 410a and a first terminal of the second memory storage substance 430b may be formed to be electrically connected to the second buried contact electrode 410b. Further, the plate electrode 450 illustrated in FIGS. 3A through 3D may be formed on the semiconductor substrate 100 including the first and second memory storage substances 430a and 430b. The plate electrode 450 may be formed to be electrically connected to second terminals of the first and second memory storage substances 430a and 430b.

FIGS. 15A through 20A, FIGS. 15B through 20B, FIGS. 15C through 20C and FIGS. 15D through 20D are cross sectional views taken along the line I-I', II-II', III-III' and IV-IV' of FIG. 2 to explain methods of manufacturing semiconductor devices in accordance with second embodiments described herein.

Referring to FIGS. 2, 15A, 15B, 15C and 15D, steps until the formation of gate conductive film 333 on a semiconductor substrate 100 can be the same as those described with reference to FIGS. 5A through 9D. The gate conductive film 333 is etched back to form gate electrodes 331 in the gate electrode holes GH. The gate electrodes 331 may be formed to have top surfaces lower than bottom surfaces of the upper impurity regions 115a and 115b.

Referring to FIGS. 2, 16A, 16B, 16C and 16D, a first protective film is formed on the semiconductor substrate 100 including the gate electrodes 331 and the first protective film is anisotropically etched to form sidewall protective film patterns 351 on sidewalls of the grooves 103. The sidewall protective film patterns 351 may extend to cover a sidewall of the gate electrode hole GH on the gate electrodes 331. The first protective film may be formed from an insulating film having an etching selectivity with respect to the interlayer insulating film 250. For example, in the case that the interlayer insulating film 250 is formed from a silicon oxide film, the first protective film may be formed from a silicon nitride film. Accordingly, FIGS. 16A-16D illustrate various embodiments wherein forming a protective film pattern 350 comprises forming a first protective film pattern 351 on a sidewall of the gate electrode hole GH in the interlayer insulating film 250.

Referring to FIGS. 2, 17A, 17B, 17C and 17D, a conductive film filling the grooves 103 is formed on the semiconductor substrate 100 including the sidewall protective film pattern 351. The conductive film is etched back to form upper interconnections 335 in the grooves 103. The upper interconnections 335 may be recessed to be lower than a top surface of the interlayer insulating film 250.

Referring to FIGS. 2, 18A, 18B, 18C and 18D, a second protective film is formed on the semiconductor substrate 100 including the upper interconnections 335. The second protective film may be formed to completely fill the grooves 103 on the upper interconnections 335. The second protective film may be formed from an insulating film having an etching selectivity with respect to the interlayer insulating film 250. For example, in the case that the interlayer insulating film 250 is formed from a silicon oxide film, the second protective film may be formed from a silicon nitride film. Accordingly, FIGS. 18A-18D illustrate forming a second protective film pattern 353 on the upper interconnection 335.

The second protective film may be planarized to expose a top surface of the interlayer insulating film 250. As a result, upper protective film patterns 353 may be formed in the grooves 103 on the upper interconnections 335. The sidewall protective film pattern 351 and the upper protective film pattern 353 covering a sidewall and a top surface of one of the upper interconnections 335 may constitute a protective film pattern 350. The protective film pattern 350 may be formed to have a width greater than the upper interconnections 335 and may be self aligned with the upper interconnection 335.

Referring to FIGS. 2, 19A, 19B, 19C and 19D, a third photo mask 370 may be formed on the semiconductor substrate 100 including the protective film pattern using the same methods as the methods described with reference to FIGS. 13A through 13D.

The interlayer insulating film 250 may be etched using the third photo mask 370 as an etching mask to form buried contact holes 390 exposing top surfaces of the active regions 110. During a formation of the buried contact holes 390, the protective film patterns 350 may function as an etch-stop film. This is because the protective film patterns 350 are formed from a material film having an etching selectivity with respect to the interlayer insulating film 250. As a result, the buried contact holes 390 may be formed to be self aligned with the protective film patterns 350. The buried contact holes 390 may include first and second buried contact holes 390a and 390b exposing the first upper impurity region 115a and the second upper impurity region 115b respectively. Accordingly, FIGS. 19A-19D illustrate etching the interlayer insulating film 250 using the first and second protective film patterns 351, 353 as an etch mask to define first and second buried electrode contact holes 390a, 390b that expose the respective first and second active regions 110a, 110b.

Referring to FIGS. 2, 20A, 20B, 20C and 20D, after removing the third photo mask 370, a conductive film filling the buried contact holes 390 is formed. The conductive film is planarized down to top surfaces of the protective film patterns 350 to form buried contact electrodes 410 in the buried contact holes 390. The buried contact electrodes 410 may include first and second buried contact electrodes 410a and 410b filling the first and second buried contact holes 390a and 390b respectively. A misalignment between the buried contact electrodes 410 and the active regions 110 may be reduced, minimized or prevented by the protective film patterns 350. For example, a misalignment between the first buried contact electrode 410a and the first upper impurity region 115a may be reduced, minimized or prevented by the protective film patterns 350. Similarly, a misalignment between the second buried contact electrode 410b and the second upper impurity region 115b may be reduced, minimized or prevented by the protective film pattern 350. Accordingly, FIGS. 20A-20D illustrate forming first and second buried contact electrodes 410a, 410b, in the respective first and second buried electrode contact holes 390a, 390b, to contact the respective first and second active regions 110a, 110b.

Although not illustrated in FIGS. 20A, 20B, 20C and 20D, a plurality of memory storage substances and a plate electrode may be formed on the semiconductor substrate 100 including the buried contact electrodes 410. The memory storage substances and the plate electrode may be formed using the same methods described with reference to FIGS. 14A, 14B, 14C and 14D.

According to various embodiments described herein, upper interconnections and buried contact electrodes may be self aligned with vertical type field effect transistors. Thus, integration density and/or reliability of semiconductor device including a vertical type field effect transistor may be improved.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of manufacturing a semiconductor device comprising:
    forming a buried insulating film on a semiconductor substrate and spaced apart first and second active regions vertically extending into the buried insulating film;
    forming an interlayer insulating film on the first and second active regions and on the buried insulating film;
    forming an upper interconnection in the interlayer insulating film, a gate electrode extending from the upper interconnection into a region between the spaced apart first and second active regions and a protective film pattern covering at least a top surface of the upper interconnection, the protective film pattern being formed to be self aligned with the upper interconnection and to have a width greater than that of the upper interconnection; and
    forming first and second buried contact holes exposing top surfaces of the first and second active regions by anisotropically etching the interlayer insulating film using the protective film pattern as an etch-stop film.

2. The method of claim 1:
    wherein the first active region includes a first lower impurity region, a first channel body and a first upper impurity region that are sequentially stacked,
    wherein the second active region includes a second lower impurity region, a second channel body and a second upper impurity region that are sequentially stacked, and
    wherein the gate electrode is formed to extend adjacent the first and second channel bodies.

3. The method of claim 2, further comprising forming a gate insulating film between the gate electrode and the first channel body and between the gate electrode and the second channel body.

4. The method of claim 2, further comprising forming a first lower interconnection electrically connected to the first lower impurity region and a second lower interconnection electrically connected to the second lower impurity region,
    wherein top surfaces of the first and second lower interconnections are lower than a bottom surface of the gate electrode.

5. The method of claim 1, wherein forming the buried insulating film and the active regions comprises:
    forming a trench of mesh shape defining the active regions by etching the semiconductor substrate; and
    forming the buried insulating film filling the trench of mesh shape.

6. The method of claim 1, wherein forming the upper interconnection, the gate electrode and the protective film pattern comprises:
    forming a groove and a gate electrode hole by etching the interlayer insulating film and the buried insulating film, the groove having a line shape in the interlayer insulating film and the gate electrode hole extending from the groove into the buried insulating film between the first and second active regions;
    forming a gate electrode in the gate electrode hole and an upper interconnection in a lower region of the groove;
    widening the groove on the upper interconnection by isotropically etching the interlayer insulating film; and
    forming a protective film pattern in the groove that was widened, wherein the protective film pattern has an etching selectivity with respect to the interlayer insulating film.

7. The method of claim 6, wherein the isotropically etching the interlayer insulating film produces from the interlayer insulating film an insulating film spacer that is located under edges of the protective film patterns and covers sidewalls of the upper interconnections.

8. The method of claim 1, wherein forming the upper interconnection, the gate electrode and the protective film pattern comprises:
    forming a groove and a gate electrode hole by etching the interlayer insulating film and the buried insulating film, the groove having a line shape in the interlayer insulating film and the gate electrode hole extending from the groove into the buried insulating film between the first and second active regions;
    forming a gate electrode in the gate electrode hole, where the gate electrode is recessed to be lower than top surfaces of the active regions;
    forming a sidewall protective film pattern on a sidewall of the groove, wherein the sidewall protective film pattern extends onto upper sidewalls of the first and second active regions; and
    sequentially forming an upper interconnection and an upper protective film pattern in the groove surrounded by the sidewall protective film pattern, wherein the upper protective film pattern and the sidewall protective film pattern have an etching selectivity with respect to the interlayer insulating film.

9. The method of claim 1, wherein forming the buried contact holes comprises:
- forming an etching mask including an opening of line shape crossing over the upper interconnection and overlapping the first and second active regions on the semiconductor substrate including the protective film pattern; and
- exposing top surfaces of the first and second active regions by selectively etching the interlayer insulating film exposed by the opening of the etching mask.

10. The method of claim 1, wherein forming the buried contact holes is followed by:
- forming first and second buried contact electrodes electrically connected to the first and second active regions respectively in the first and second buried contact holes; and
- forming memory storage substances connected to the first and second buried contact electrodes.

11. A method of manufacturing a semiconductor device comprising:
- providing a semiconductor substrate including first and second spaced apart vertically extending active regions and a vertically extending insulating region therebetween, an interlayer insulating film on the active regions and on the insulating region, a gate electrode hole in the interlayer insulating film that extends vertically into the insulating region adjacent the active regions, an upper interconnection in the gate electrode hole in the interlayer insulating film, and a gate electrode that extends vertically from the upper interconnection into the gate electrode hole adjacent the active regions;
- forming a protective film pattern on the upper interconnection that is wider than the upper interconnection, using the gate electrode hole as a template for forming the protective film pattern; and
- forming first and second buried contact electrodes in the interlayer insulating film that contact the respective first and second active regions, using the protective film pattern as a template for forming the first and second buried contact electrodes.

12. The method of claim 11:
- wherein forming a protective film pattern comprises widening the gate electrode hole in the interlayer insulating film and forming the protective film pattern in the gate electrode hole that was widened; and
- wherein the forming first and second buried contact electrodes comprises:
  - etching the interlayer insulating film using the protective film pattern as an etch mask to define first and second buried electrode contact holes that expose the respective first and second active regions; and
  - forming the first and second buried contact electrodes in the respective first and second buried electrode contact holes to contact the respective first and second active regions.

13. The method of claim 12 wherein widening the gate electrode hole in the interlayer insulating film comprises isotropically etching the interlayer insulating film.

14. The method of claim 12 wherein etching the interlayer insulating film comprises etching the interlayer insulating film using the protective film pattern as an etch mask such that the interlayer insulating film remains on a sidewall of the upper interconnection between the protective film and the insulating region.

15. The method of claim 11:
- wherein forming a protective film pattern comprises forming a first protective film pattern on a sidewall of the gate electrode hole in the interlayer insulating film and forming a second protective film pattern on the upper interconnection; and
- wherein the forming first and second buried contact electrodes comprises:
  - etching the interlayer insulating film using the first and second protective film patterns as an etch mask to define first and second buried electrode contact holes that expose the respective first and second active regions; and
  - forming the first and second buried contact electrodes in the respective first and second buried electrode contact holes to contact the respective first and second active regions.

\* \* \* \* \*